(12) United States Patent
Ohno

(10) Patent No.: US 6,518,130 B1
(45) Date of Patent: Feb. 11, 2003

(54) METHOD FOR FORMING A SEMICONDUCTOR DEVICE HAVING A DRAM REGION AND A LOGIC REGION ON THE SUBSTRATE

(75) Inventor: Keiichi Ohno, Kanagawa (JP)

(73) Assignee: Sony Corporation (JP)

( * ) Notice: Subject to any disclaimer, the term of this patent is extended or adjusted under 35 U.S.C. 154(b) by 75 days.

(21) Appl. No.: 09/672,876

(22) Filed: Sep. 29, 2000

(30) Foreign Application Priority Data

Oct. 1, 1999 (JP) .......................................... 11-281196

(51) Int. Cl.$^7$ .......................................... H01L 21/8234
(52) U.S. Cl. ...................... 438/275; 438/210; 438/230; 438/241; 438/279; 438/587; 438/592
(58) Field of Search ................................ 438/155, 200, 438/210, 230, 241, 253, 275, 279, 303, 296, 256, 399, 396, 571, 581, 587, 597, 592, 651, 652, 655, 656

(56) References Cited

U.S. PATENT DOCUMENTS 6,146,994 A * 11/2000 Hwang ........................ 438/633
6,207,492 B1 * 3/2001 Tzeng et al. ................. 438/241

* cited by examiner

Primary Examiner—Tuan H. Nguyen
Assistant Examiner—Jack Chen
(74) Attorney, Agent, or Firm—Rader, Fishman, & Grauer PLLC; Ronald P. Kananen, Esq.

(57) ABSTRACT

A semiconductor device comprising a plurality of first transistors formed in a first region of a semiconductor substrate and a plurality of second transistors formed in a second region of the semiconductor substrate, wherein each of the first and second transistors has a gate electrode, a channel-forming region and source/drain regions; the gate electrodes constituting the first and second transistors are formed of a polysilicon layer containing an impurity and a silicide layer formed thereon; a silicide layer is formed in the source/drain regions constituting the first transistor; and no silicide layer is formed in the source/drain regions constituting the second transistor.

7 Claims, 38 Drawing Sheets

[STEP-180] CONTINUED

REGION OF LOGIC CIRCUIT

[STEP-180] CONTINUED

REGION OF DRAM

[STEP-110]
REGION OF DRAM

REGION OF LOGIC CIRCUIT

[STEP-120]
REGION OF DRAM

REGION OF LOGIC CIRCUIT

[STEP-130]

REGION OF DRAM

REGION OF LOGIC CIRCUIT

[STEP-130] CONTINUED
REGION OF DRAM

REGION OF LOGIC CIRCUIT

[STEP-130] CONTINUED
REGION OF DRAM

REGION OF LOGIC CIRCUIT

[STEP-130] CONTINUED
REGION OF DRAM

REGION OF LOGIC CIRCUIT

[STEP-130] CONTINUED

REGION OF DRAM

REGION OF LOGIC CIRCUIT

[STEP-140]
REGION OF DRAM

REGION OF LOGIC CIRCUIT

[STEP-150]

REGION OF DRAM

REGION OF LOGIC CIRCUIT

[STEP-160]
REGION OF DRAM

REGION OF LOGIC CIRCUIT

[STEP-160] CONTINUED
REGION OF DRAM

REGION OF LOGIC CIRCUIT

[STEP-160] CONTINUED

REGION OF DRAM

REGION OF LOGIC CIRCUIT

[STEP-170]
REGION OF DRAM

REGION OF LOGIC CIRCUIT

[STEP-180]
REGION OF DRAM

REGION OF LOGIC CIRCUIT

[STEP-180] CONTINUED

REGION OF LOGIC CIRCUIT

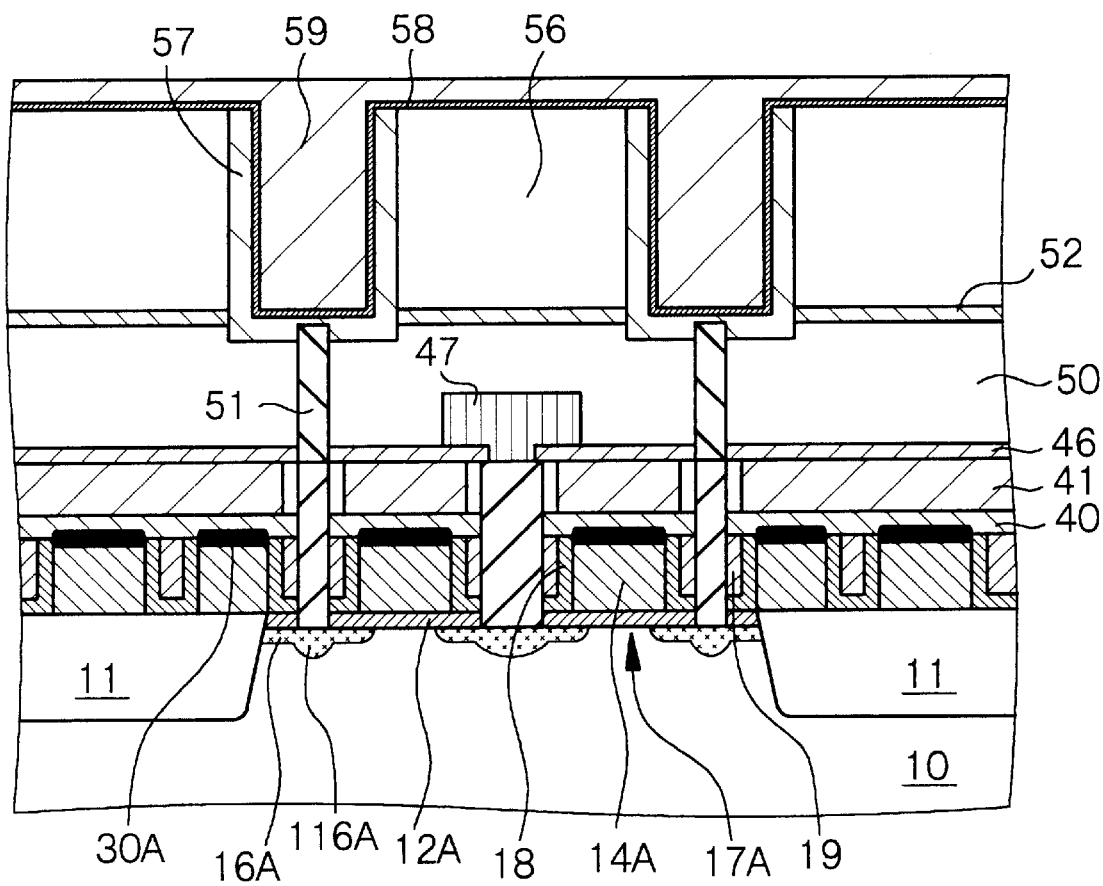

REGION OF DRAM

REGION OF LOGIC CIRCUIT

[STEP-310]

REGION OF DRAM

REGION OF LOGIC CIRCUIT

[STEP-320]

REGION OF DRAM

REGION OF LOGIC CIRCUIT

[STEP-330]
REGION OF DRAM

REGION OF LOGIC CIRCUIT

[STEP-330] CONTINUED
REGION OF DRAM

REGION OF LOGIC CIRCUIT

[STEP-340]

REGION OF DRAM

REGION OF LOGIC CIRCUIT

[STEP-350]

REGION OF DRAM

REGION OF LOGIC CIRCUIT

[STEP-360]

REGION OF DRAM

REGION OF LOGIC CIRCUIT

[STEP-360] CONTINUED
REGION OF DRAM
ION IMPLANTATION

REGION OF LOGIC CIRCUIT
ION IMPLANTATION

[STEP-360] CONTINUED

REGION OF DRAM

REGION OF LOGIC CIRCUIT

[STEP-360] CONTINUED

REGION OF DRAM

REGION OF LOGIC CIRCUIT

[STEP-360] CONTINUED

REGION OF DRAM

REGION OF LOGIC CIRCUIT

[STEP-370]
REGION OF DRAM

REGION OF LOGIC CIRCUIT

[STEP-370]

REGION OF LOGIC CIRCUIT

[STEP-370]

REGION OF DRAM

[STEP-350]

[STEP-360]

[STEP-360] CONTINUED

[STEP-360] CONTINUED

[STEP-360] CONTINUED

[STEP-360] CONTINUED

MODIFICATION OF [STEP-360]

MODIFICATION OF [STEP-360] CONTINUED

MODIFICATION OF [STEP-360] CONTINUED

REGION OF DRAM

REGION OF DRAM

REGION OF DRAM

METHOD FOR FORMING A SEMICONDUCTOR DEVICE HAVING A DRAM REGION AND A LOGIC REGION ON THE SUBSTRATE

BACKGROUND OF THE INVENTION AND RELATED ART STATEMENT

The present invention relates to a semiconductor device and a method of producing the same.

For achieving a decrease in power consumption of transistors constituting a logic circuit (also called a peripheral circuit) and an increase in the speed thereof, it has come to be standard practice to apply a salicide (self-aligned silicide) technology and a dual gate (also called dual work function gate or surface channel type CMOSFET) technology. Further, a semiconductor device having logic circuits and dynamic random access memories (DRAM) mounted together has come to be generally used.

The above salicide technology refers to the technology of forming a silicide layer, in source/drain regions and a top surface of a gate electrode, in a self-aligned manner. In this technology, specifically, the gate electrode composed of polysilicon is formed on a semiconductor substrate, then, the source/drain regions are formed in the semiconductor substrate, then, a metal layer is formed on the entire surface, and heat treatment is carried out to allow atoms constituting the metal layer and atoms (specifically Si) constituting the semiconductor substrate and the gate electrode to react, whereby a silicide layer is formed, followed by the removal of the unreacted metal layer.

The above dual gate technology refers to the technology of forming a gate electrode for an n-channel type MOSFET from a polysilicon layer containing an n-type impurity and forming a gate electrode for a p-channel type MOSFET from a polysilicon layer containing a p-type impurity to form a surface channel in each MOSFET.

The semiconductor device is becoming finer in size, and when a contact plug is formed on a source/drain region of a semiconductor device, generally, there is therefore employed technology of forming the contact plug in a self-aligned manner. Such a technology is called "self-align-contact (SAC) technology". For applying the SAC technology, the gate electrode is required to have a two-layered structure formed of a polysilicon layer and an offset layer such as a silicon nitride (SiN) layer. For securing the distance between the gate electrode and the contact plug, further, it is required to form gate sidewalls composed of silicon nitride (SiN) on the side walls of the gate electrode.

However, it is said that the compatibility of the fast logic circuit production process including the salicide technology and the dual gate technology and the general DRAM production process is not so well for the following reasons.

[① DRAM Memory Cell Characteristics]

For securing excellent characteristics of DRAM memory cells, it is preferred not to form a silicide layer on source/drain regions of a transistor constituting a memory element of the DRAM (to be sometimes referred to as "DRAM-constituting transistor" for the convenience hereinafter) for the following reason. That is, due to a leak current caused by a junction which takes place between the source/drain region on a node side and the silicide layer, the data-retention characteristic is deteriorated. Generally, 256 memory elements are connected to one bit line in DRAM of 0.25 µm generation, and 512 memory elements are connected to one bit line in DRAM of 0.18 µm generation. Due to an increase in a leak current as a total sum of leak currents caused by junctions between the source/drain regions on a bit line side and the silicide layers, a margin of a low-voltage driving lowers or decreases because of a decrease in the amplitude of a signal flowing in the bit line, and the data-retaining characteristic (for example, refresh characteristic) deteriorates. In the transistor constituting the logic circuit, it is required to improve the source/drain regions in performance by decreasing the resistance thereof, and for this purpose, it is required to form the silicide layers in the source/drain regions.

[② SAC Technology of DRAM-constituting Transistor]

When the SAC technology is applied to DRAM-constituting transistors, and if a space between the gate electrodes of the transistors is fully filled with a silicon nitride layer, it is inevitable to increase the thickness of the offset layer for making an opening portion in the above silicon nitride layer while reliably securing a process margin. However, when the thickness of the offset layer is increased, a step height difference caused by the gate electrode increases, and disadvantages are liable to occur in steps to follow. Specifically, for example, a margin in a lithography step is liable to decrease, and filling of an insulating interlayer is liable to be defective.

Moreover, when silicon nitride having a relative dielectric constant approximately twice as large as that of silicon oxide is used as a gate sidewall, a fringe capacitance which is a capacitance between the edge portion of the gate electrode and the source/drain region increases, and the fast operation characteristic of the transistor constituting the logic circuit may be affected in some cases.

[③ Space Between Gate Electrodes of DRAM-constituting Transistors]

The distance between the gate electrodes of DRAM-constituting transistors is smaller than the distance between the gate electrodes of transistors constituting the logic circuit. In some cell design, therefore, the width (thickness) of the gate sidewall is determined by optimizing the capability of the transistors constituting the logic circuit, and when such a gate sidewall is formed on the side wall of the gate electrode, a silicon nitride film constituting the gate sidewall may fill a space between the gate electrodes of the DRAM-constituting transistors. Further, if a silicon nitride film is formed as an etching stop layer when a contact plug is formed on the source/drain region of the transistor constituting the logic circuit, the possibility of the silicon nitride film fully filling the space between the gate electrodes of the DRAM-constituting transistors comes to be higher. If the silicon nitride film fully fills the space between the gate electrodes of the DRAM-constituting transistors, it is very difficult to form a contact plug on the source/drain region of the DRAM-constituting transistor according to the SAC technology.

[④ Offset Layer]

When the gate electrode is formed to have the two-layer structure of the polysilicon layer and the offset layer, no silicide layer can be formed on the top surface of the gate electrode due to the presence of the offset layer. Further, when the dual gate technology is applied to the transistor constituting the logic circuit, the conventional process requires the steps of introducing an n-type impurity and a p-type impurity into the polysilicon layer, respectively, then, forming the offset layer, and then, patterning the offset layer and the polysilicon layer. Since, however, the polysilicon layer containing an n-type impurity and the polysilicon layer containing a p-type impurity have different etching rates, it is difficult to simultaneously form the gate electrode having a desired form for an n-channel type MOSFET and the gate electrode having a desired form for a p-channel type MOSFET. Further, the gate insulating layer keeps on decreasing in thickness, so that a semiconductor substrate may be damaged when etching is carried out for forming the gate electrode.

When the offset layer is made from silicon nitride, the step of forming the contact plug on the gate electrode, an extending portion of the gate electrode or a word line inevitably differs from the step of forming the contact plug on the source/drain region, so that additional steps of exposure and etching are required.

OBJECT AND SUMMARY OF THE INVENTION

It is therefore a first object of the present invention to provide a semiconductor device which can overcome the problems described in the above [① DRAM memory cell characteristics].

It is a second object of the present invention to provide a semiconductor device and a method of producing the same, which can overcome the problems described in [② SAC technology of DRAM-constituting transistor].

Further, it is a third object of the present invention to provide a method of producing a semiconductor device, which serves to establish consistency between the fast logic circuit production process including the salicide technology and the dual gate technology and the general DRAM production process and which can overcome the problems described in the above [① DRAM memory cell characteristics] and [③ Space between gate electrodes of DRAM-constituting transistors].

It is further a fourth object of the present invention to provide a method of producing a semiconductor device, which can overcome the problems described in the above [④ Offset layer] in addition to the above third object.

It is further a fifth object of the present invention to provide a method of producing a semiconductor device, which can overcome the problems described in the above [② SAC technology of DRAM-constituting transistor] in addition to the above third object.

The first object of the present invention is achieved by a semiconductor device according to a first aspect of the present invention, comprising a plurality of first transistors formed in a first region of a semiconductor substrate and a plurality of second transistors formed in a second region of the semiconductor substrate, wherein each of the first and second transistors has a gate electrode, a channel-forming region and source/drain regions, the gate electrodes constituting the first and second transistors are formed of a polysilicon layer containing an impurity and a silicide layer formed thereon, a silicide layer is formed in the source/drain regions constituting the first transistor, and no silicide layer is formed in the source/drain regions constituting the second transistor.

In the semiconductor device according to the first aspect of the present invention, or in a method of producing a semiconductor device according to the first or second aspect of the present invention explained later, a logic circuit is constituted of the first transistors, and a dynamic random access memory (DRAM) is constituted of the second transistor.

In the semiconductor device according to the first aspect of the present invention, for achieving the second object of the present invention, preferably, each of the first and second transistors has (a) an insulating material layer which is composed of a first insulating material and covers at least part of each of side walls of each gate electrode and (b) a cap layer which is composed of a second insulating material and covers a top surface of each gate electrode and a top portion of the insulating material layer. The entire side walls of each gate electrode may be covered with the insulating material layer, or lower portions of the side walls of each gate electrode may be covered with the insulating material layer. In the latter case, more specifically, the lower portions of the side walls of the polysilicon layer may be covered, the entire side walls of the polysilicon layer may be covered, the entire side walls of the polysilicon layer and lower portions of side walls of the silicide layer may be covered, or the entire side walls of the polysilicon layer and the entire side walls of the silicide layer may be covered, with the insulating material layer. Preferably, a relative dielectric constant of the first insulating material is lower than that of the second insulating material, or an etching rate of the cap layer is lower than that of the insulating material layer. The first insulating material includes silicon oxide ($SiO_2$: relative dielectric constant 3.7–3.9), and the second insulating material includes silicon nitride (SiN: relative dielectric constant 6–7). The cap layer has an eaves-like structure extending from the gate electrode, and there is formed a structure in which the insulating material layer is present below the eaves-like portion of the cap layer which portion extends from the gate electrode, so that the cap layer can be decreased in thickness and there can be overcome the problem that a step height difference caused by the gate electrode increases which causes disadvantages in a step to follow. That is, there can be overcome the problems described in the above [② SAC technology of DRAM-constituting transistor]. Further, when the relative dielectric constant of the first insulating material is lower than that of the second insulating material, an increase in the fringe capacitance can be suppressed, and particularly, an influence on the fast operation characteristic of the transistors constituting a logic circuit can be minimized.

The above second object of the present invention is achieved by a semiconductor device, according to a second aspect of the present invention, said semiconductor device having;

(a) a gate electrode composed of an electric conductive material, (b) an insulating material layer which is composed of a first insulating material and covers at least part of each of side walls of the gate electrode, and (c) a cap layer which is composed of a second insulating material and covers a top surface of the gate electrode and a top portion of the insulating material layer.

The entire side walls of the gate electrode may be covered, or lower portions of the side walls of the gate electrode may be covered, with the insulating material layer. In the latter case, remaining upper portions of the side walls of the gate electrode are covered with the cap layer.

In the semiconductor device according to the second aspect of the present invention, preferably, a relative dielectric constant of the first insulating material is lower than that of the second insulating material, or an etching rate of the cap layer is lower than that of an insulating material layer. The first insulating material includes silicon oxide ($SiO_2$), and the second insulating material includes silicon nitride (SiN). Preferably, the gate electrode is formed of a polysilicon layer containing an impurity and a silicide layer formed thereon. In this case, lower portions of the side walls of the polysilicon layer may be covered, the entire side walls of the polysilicon layer may be covered, the entire side walls of the polysilicon layer and lower portions of the side walls of the silicide layer may be covered, or the entire side walls of the polysilicon layer and the entire side walls of the silicide layer may be covered, with the insulating material layer.

The above third and fourth objects of the present invention are achieved by a method of producing a semiconductor device according to the first aspect of the present invention, said semiconductor device comprising a plurality of first transistors formed in a first region of a semiconductor substrate and a plurality of second transistors formed in a second region of the semiconductor substrate, said method comprising the steps of;
- (A) forming a gate insulating layer on the surface of the semiconductor substrate and then forming gate electrodes composed of a polysilicon for forming the first transistors and the second transistors, and then, forming source/drain regions constituting the second transistors in the semiconductor substrate,
- (B) filling a space between the gate electrodes constituting the adjacent second transistors with an insulating material layer, and exposing a region of the semiconductor substrate in which region source/drain regions constituting the first transistors are to be formed, the top surface of the gate electrode constituting the first transistors and the top surface of the gate electrode constituting of the second transistors,
- (C) forming source/drain regions in the region of the semiconductor substrate in which region the source/drain regions constituting the first transistors are to be formed, and
- (D) forming a silicide layer in the source/drain regions constituting the first transistors, on the top surface of the gate electrode constituting the first transistors and on the top surface of the gate electrode constituting the second transistors, to obtain the gate electrodes formed of the polysilicon layer and the silicide layer formed thereon.

In the method of producing a semiconductor device according to the first aspect of the present invention, preferably, the insulating material layer is formed of a first insulating material layer and a second insulating material layer, and the above step (B) includes the steps of forming the first insulating material layer on the entire surface, then, forming the second insulating material layer on the first insulating material layer such that the space between the gate electrodes constituting the adjacent second transistors is filled with the second insulating material layer, and then removing the first insulating material layer on a region where the first transistors is to be formed and the first insulating material layer on the top surface of the gate electrode constituting the second transistors.

In this case, desirably, the above step (B) includes the steps of forming the first insulating material layer on the entire surface, then, forming the second insulating material layer on the first insulating material layer such that the space between the gate electrodes constituting the adjacent second transistors is filled with the second insulating material layer, then, forming a third insulating material layer on the entire surface, removing the third insulating material layer and the first insulating material layer on the top surface of the gate electrode constituting the second transistor, and selectively removing the third insulating material layer and the first insulating material layer on a region where the first transistors is to be formed, to retain a gate sidewall formed of the third insulating material layer and the first insulating material layer on each of the side walls of the gate electrode constituting the first transistor.

In the method of producing a semiconductor device according to the first aspect of the present invention, preferably, in the above step (C), when the source/drain regions are formed in a region of the semiconductor substrate in which region the source/drain regions constituting the first transistors are to be formed, the same impurity as that introduced into said source/drain regions is introduced into the gate electrode constituting the first transistor, and an impurity having the same conductivity type as that of an impurity introduced into the source/drain regions constituting the second transistors is introduced into the gate electrode constituting the second transistor.

In the method of producing a semiconductor device according to the first aspect of the present invention, desirably, the first insulating material layer is composed of silicon nitride (SiN), and the second insulating material layer is composed of a silicon-containing material. The term "silicon-containing material" not only refers to silicon oxide ($SiO_2$) but also refers to any one of SOG (Spin On Glass), PSG, BPSG, BSG, AsAG, PbSG, SbSG, NSG, LTO (low temperature oxide, lower temperature CVD-$SiO_2$), a low-dielectric insulating material having a relative dielectric constant of 3.5 or less (for example, polyaryl ether, cyclo-perfluorocarbon polymer or benzocyclobutene), an organic polymer material such as polyimide, or stacking of these materials.

In the method of producing a semiconductor device according to the first aspect of the present invention, preferably, the above step (D) is further followed by the step (E) of consecutively forming an etching-stop layer and an insulating interlayer on the entire surface, forming an opening portion which penetrates through the insulating interlayer, the etching-stop layer and the insulating material layer and reaches the source/drain region constituting the second transistor, and filling the opening portion with an electric conductive material to form a contact plug. When the insulating material layer is formed of the first insulating material layer and the second insulating material layer, the opening portion is formed in the first insulating material layer and the second insulating material layer. An etching rate of the etching-stop layer is required to be lower than an etching rate of the insulating material layer. For example, when the insulating material layer is composed of silicon oxide (that is, when the second insulating material layer is composed of silicon oxide), desirably, the etching-stop layer is composed of silicon nitride.

The above third object of the present invention is achieved by a method of producing a semiconductor device according to the second aspect of the present invention, said semiconductor device comprising a plurality of first transistors formed in a first region of a semiconductor substrate and a plurality of second transistors formed in a second region of the semiconductor substrate, said method comprising the steps of;
- (A) forming a gate insulating layer on the surface of the semiconductor substrate and then forming gate electrodes composed of a polysilicon for forming the first transistors and the second transistors, and then, forming source/drain regions constituting the second transistors in the semiconductor substrate,
- (B) covering the source/drain regions constituting the second transistors with a first insulating material layer, and exposing a region of the semiconductor substrate in which region source/drain regions constituting the first transistors are to be formed, (C) forming source/drain regions in a region of the semiconductor substrate in which region the source/drain regions constituting the first transistors are to be formed, and then, forming a silicide layer in said source/drain regions, (D) filling a space between the gate electrodes constituting the adjacent first transistors with a second insulating material layer, and a space between the gate electrodes constituting the adjacent second transistors with the second insulating material layer, and exposing the top surface of the gate electrode constituting the first transistors and the top surface of the gate electrode constituting the second transistor, and (E) forming a silicide layer on the top surface of the gate electrode constituting the first transistors and the top surface of the gate electrode constituting the second transistor, to obtain the gate electrodes formed of the polysilicon layer and the silicide layer formed thereon.

In the method of producing a semiconductor device according to the second aspect of the present invention, preferably, the first and second insulating material layers are composed of silicon oxide ($SiO_2$).

In the method of producing a semiconductor device according to the second aspect of the present invention, further for achieving the above fifth object, preferably, the above step (A) includes the steps of forming the gate insulating layer on the surface of the semiconductor substrate for forming the first transistors and the second transistor, then, consecutively forming a polysilicon layer containing no impurity and an offset layer on the entire surface, then, patterning the offset layer and the polysilicon layer to form the gate electrodes having a two-layered structure of the polysilicon layer and the offset layer, and then, forming the source/drain regions constituting the second transistors in the semiconductor substrate, the above step (B) includes the steps of covering the gate electrode and the source/drain regions constituting the second transistors with the first insulating material layer, simultaneously covering side walls of the gate electrode constituting the first transistors with the first insulating material layer, and exposing a region of the semiconductor substrate in which region the source/drain regions constituting the first transistors are to be formed, the above steps (D) and (E) have an intervenient step of removing the offset layer and upper portions of the first insulating material layer on the side walls of the gate electrode constituting the first transistors and upper portions of the first insulating material layer on the side walls of the gate electrode constituting the second transistor, and the above step (E) is followed by the steps of forming a first cap layer on the silicide layer formed on the gate electrode constituting the first transistors and on the top portions of the first insulating material layer on the side walls of the gate electrode constituting the first transistor, and forming a second cap layer on the silicide layer formed on the gate electrode constituting the second transistors and the top portions of the first insulating material layer on the side walls of the gate electrode constituting the second transistor.

In this case, desirably, an etching rate of the cap layer is lower than an etching rate of the first insulating material layer, or a relative dielectric constant of the material constituting the first insulating material layer is lower than a relative dielectric constant of a material constituting the cap layer. The material constituting the first and second insulating material layers includes silicon oxide (SiO2), and the material constituting the first and second cap layers includes silicon nitride (SiN). In the method of producing a semiconductor device according to the second aspect of the present invention, for achieving the above fourth object of the present invention, preferably, the above steps (D) and (E) have intervenient steps of removing the offset layer, then, introducing an impurity having the same conductivity type as that of an impurity introduced into the source/drain regions into the exposed polysilicon layer constituting the gate electrodes, and then, removing the upper portions of the first insulating material layer on the side walls of the gate electrode constituting the first transistors and the upper portions of the first insulating material layer on the side walls of the gate electrode constituting the second transistor. Otherwise, the steps (D) and (E) preferably have intervenient steps of removing the offset layer and the upper portions of the first insulating material layer on the side walls of the gate electrode constituting the first transistors and the upper portions of the first insulating material layer on the side walls of the gate electrode constituting the second transistor, and then, introducing an impurity having the same conductivity type as that of an impurity introduced into the source/drain regions into the polysilicon layer constituting the exposed gate electrodes.

In the method of producing a semiconductor device according to the second aspect of the present invention, further for achieving the above fifth object, preferably, the above step (A) includes the steps of forming the gate insulating layer on the surface of the semiconductor substrate for forming the first transistors and the second transistor, then, consecutively forming a polysilicon layer containing no impurity and an offset layer on the entire surface, patterning the offset layer and the polysilicon layer to form the gate electrodes having a two-layered structure of the polysilicon layer and the offset layer, and then, forming the source/drain regions constituting the second transistors in the semiconductor substrate, the above step (B) includes the steps of covering the gate electrode and the source/drain regions constituting the second transistors with the first insulating material layer, simultaneously covering the side walls of the gate electrode constituting the first transistors with the first insulating material layer, and exposing a region of the semiconductor substrate in which region the source/drain regions constituting the first transistors are to be formed, the above steps (D) and (E) have an intervenient step of removing the offset layer, and the above step (E) is followed by the steps of removing the upper portions of the first insulating material layer on the side walls of the gate electrode constituting the first transistors and the upper portions of the first insulating material layer on the side walls of the gate electrode constituting the second transistor, and then, forming a first cap layer on the silicide layer formed on the gate electrode constituting the first transistors and on the top portions of the first insulating material layer on the side walls of the gate electrode constituting the first transistor, and forming a second cap layer on the silicide layer formed on the gate electrode constituting the second transistors and on the top portions of the first insulating material layer on the side walls of the gate electrode constituting the second transistor.

In the above case, preferably, an etching rate of the cap layer is lower than an etching rate of the first insulating material layer, or a relative dielectric constant of a material constituting the first insulating material layer is lower than a relative dielectric constant of a material constituting the first and second cap layers. The material constituting the first and second insulating material layers includes silicon oxide ($SiO_2$), and the material constituting the first and second cap layers includes silicon nitride (SiN). Further, for achieving the above fourth object of the present invention, preferably, the above steps (D) and (E) have intervenient steps of removing the offset layer, and then, introducing an impurity having the same conductivity type as that of an impurity introduced into the source/drain regions into the polysilicon layer constituting the exposed gate electrodes.

Further, in the method of producing a semiconductor device according to the second aspect of the present invention, preferably, the above step (E) is followed by the step (F) of forming an insulating interlayer on the entire surface, forming an opening portion which penetrate through the insulating interlayer and the second and first insulating material layers and reaches the source/drain region constituting the second transistor, and filling the opening portion with an electric conductive material to form a contact plug.

The above second object of the present invention is achieved by a method of producing a semiconductor device according to a third aspect of the present invention, said method comprising the steps of;

(A) forming a gate insulating layer on the surface of a semiconductor substrate, consecutively forming a polysilicon layer and an offset layer on the entire surface, and then, patterning the offset layer and the polysilicon layer to form a gate electrode having a two-layered structure of the polysilicon layer and the offset layer, (B) covering side walls of the gate electrode with a first insulating material layer composed of a first insulating material and forming source/drain regions in the semiconductor substrate, (C) filling a space between the adjacent gate electrodes with a second insulating material layer and exposing the top surface of the offset layer, (D) removing the offset layer and simultaneously removing upper portions of the first insulating material layer covering the side walls of the gate electrode, and (E) forming a cap layer on the top surface of the gate electrode and on the top portions of the first insulating material layer covering the side walls of the gate electrode.

In the step (B), the source/drain regions may be formed in the semiconductor substrate after the side walls of the gate electrode is covered with the first insulating material layer composed of the first insulating material, or the side walls of the gate electrode may be covered with the first insulating material layer composed of the first insulating material after the source/drain regions are formed in the semiconductor substrate.

In the method of producing a semiconductor device according to the third aspect of the present invention, preferably, in the above step (D), the offset layer is removed, then, a silicide layer is formed on the top surface of the polysilicon layer constituting the exposed gate electrode, and then, the upper portions of the first insulating material layer covering the side walls of the gate electrode are removed. In this case, further for achieving the above fourth object of the present invention, preferably, in the above step (D), the offset layer is removed, then, an impurity is introduced into the polysilicon layer constituting the exposed gate electrode, then, a silicide layer is formed on the top surface of the polysilicon layer, and then, the upper portions of the first insulating material layer covering the side walls of the gate electrode are removed.

Otherwise, in the method of producing a semiconductor device according to the third aspect of the present invention, preferably, in the above step (D), the offset layer and the upper portions of the first insulating material layer covering the side walls of the gate electrode are removed, and then, a silicide layer is formed on the top surface of the polysilicon layer constituting the exposed gate electrode. In this case, further for achieving the fourth object of the present invention, preferably, in the step (D), the offset layer is removed, an impurity is introduced into the polysilicon layer constituting the exposed gate electrode, the upper portions of the first insulating material layer covering the side walls of the gate electrode are removed, and then, a silicide layer is formed on the top surface of said polysilicon layer. Otherwise, preferably, in the step (D), the offset layer and the upper portions of the first insulating material layer covering the side walls of the gate electrode are removed, an impurity is introduced into the polysilicon layer constituting the exposed gate electrode, and then, a silicide layer is formed on the top surface of the polysilicon layer.

Otherwise, in the method of producing a semiconductor device according to the third aspect of the present invention, desirably, the above step (E) is followed by the step (F) of forming an insulating interlayer on the entire surface, forming an opening portion which penetrates through the insulating interlayer and the second insulating material layer and reaches the source/drain region, and then, filling the opening portion with an electrically conductive material to form a contact plug.

In this case, when the opening portion is formed by selectively etching the insulating interlayer and the second insulating material layer, preferably, the first insulating material layer below the cap layer is protected with the cap layer and is therefore not etched. When the first insulating material layer is present between the source/drain region and the second insulating material layer, there is formed an opening portion which penetrates through the insulating interlayer, the second insulating material layer and the first insulating material layer and reaches the source/drain region.

In the method of producing a semiconductor device according to the third aspect of the present invention, desirably, an etching rate of the cap layer is lower than an etching rate of the first insulating material layer, or a relative dielectric constant of the first insulating material is lower than a relative dielectric constant of the second insulating material. The first insulating material includes silicon oxide ($SiO_2$), and the second insulating material includes silicon nitride (SiN).

In the semiconductor device or the method of producing a semiconductor device of the present invention, the semiconductor substrate includes a silicon semiconductor substrate, a substrate prepared by epitaxially growing a silicon crystal or a Si—Ge mixed crystal on a spinel, a substrate prepared by epitaxially growing a silicon crystal or a Si—Ge mixed crystal on a sapphire, and a substrate prepared by melting and recrystallizing polycrystal silicon on an insulating film. The silicon semiconductor substrate includes an n-type silicon semiconductor substrate which is doped with an n-type impurity and a p-type silicon semiconductor substrate which is doped with a p-type impurity.

Further, an SOI (Semiconductor On Insulator) substrate may be used as a semiconductor substrate. The method of producing the SOI substrate includes;

(1) a substrate-bonding method in which a semiconductor substrate and a supporting substrate are bonded to each other through an insulation layer and the semiconductor substrate is ground and polished from its back surface, to obtain a support formed of the supporting substrate, the insulating layer and a semi-conductive layer formed of the ground and polished semiconductor substrate, (2) a smart-cut method in which an insulation layer is formed on a semiconductor substrate, then, the semiconductor substrate is ion-implanted with hydrogen ion to form a peel-off layer inside the semiconductor substrate, then, the semiconductor substrate and a supporting substrate are bonded to each other through the insulation layer, the resultant stack is heat-treated to peel (cleave) the semiconductor substrate from the peel-off layer, and, the remaining semiconductor substrate is ground and polished from its back surface, to obtain a support formed of the supporting substrate, the insulation layer and a semi-conductive layer formed of the ground and polished semiconductor substrate, (3) a SIMOX (Separation by IMplanted OXygen) method in which oxygen ion is ion-implanted into a semiconductor substrate, then, the semiconductor substrate is heat-treated to form an insulation layer inside the semiconductor substrate, whereby a support formed of part of the semiconductor substrate is formed below the insulation layer and a semi-conductive layer formed of part of the semiconductor substrate is formed on the insulation layer, (4) a method in which a single crystal semi-conductive layer is formed on an insulation layer formed on a semiconductor substrate corresponding to a support, in a gaseous phase or solid phase, to obtain a support formed of the semiconductor substrate, the insulation layer and a semi-conductive layer formed of the single crystal semi-conductive layer, and (5) a method in which the surface of a semiconductor substrate is partially rendered porous by anodization, to form an insulation layer, whereby there are obtained a support formed of part of the semiconductor substrate below the insulation layer and a semi-conductive layer formed of part of the semiconductor substrate on the insulating layer. A semiconductor device is formed in the semi-conductive layer.

When the SOI substrate is used, a device-isolation region can be formed by any one of the following methods.

(a) A so-called LOCOS method in which a pad oxide film and a silicon nitride film are formed on the semi-conductive layer and the silicon nitride film and the pad oxide film are patterned, to form a mask for forming a device-isolation region, and the semi-conductive layer is thermally oxidized with using the mask to form a device-isolation region.

(b) A so-called STI (shallow trench isolation) method in which the semi-conductive layer is patterned to form a trench in the semi-conductive layer, and the trench is filled with an insulation material.

(c) A method of a combination of the substrate bonding method and the STI method, in which, when a substrate is prepared according the above method (1) or (2), a trench is first formed in a semiconductor substrate and filled with an insulation layer, then, an interlayer film (for example, an $SiO_2$ film or a film having a stacked structure formed of an $SiO_2$ film and a polysilicon film) is formed on the entire surface, the thus-prepared semiconductor substrate and a supporting substrate are bonded through the interlayer film, and the semiconductor substrate is ground and polished from its back surface, to obtain a support formed of the supporting substrate, the insulation layer and a semi-conductive layer formed of the semiconductor substrate.

(d) A method of forming a Mesa type device-isolation region, in which the semi-conductive layer on the insulation layer is removed to expose the insulating layer, whereby a device-isolation region is formed.

The silicide layer can be formed by the salicide technology in which a metal layer is formed on the entire surface, heat treatment is carried out to react atoms constituting the metal layer with atoms (specifically, Si) constituting the semiconductor substrate and/or the gate electrode, whereby a silicide layer is formed, and then unreacted metal layer is removed. The above metal layer can be composed, for example, of any one of cobalt (Co), nickel (Ni), platinum (Pt), titanium (Ti), Ta (tantalum), Mo (molybdenum), tungsten (W) and palladium (Pd).

In the semiconductor device according to the first aspect of the present invention, no silicide layer is formed in the source/drain regions constituting the second transistor, so that the problems described in the above [①  DRAM memory cell characteristics] can be overcome.

In the semiconductor device or the method of producing a semiconductor device according to the second aspect of the present invention, the cap layer has an eaves-like structure extending from the gate electrode, and the insulating material layer or the first insulating material layer is structurally present below the eaves-like portion of the cap layer which portion is extending from the gate electrode, so that the cap layer can be decreased in thickness and that there can be prevented the occurrence of the problem that a height level difference caused by the gate electrode increases and causes disadvantages in steps to follow. That is, the problems described in the above [② SAC technology of DRAM-constituting transistor] can be overcome. Further, when the relative dielectric constant of the first insulating material is lower than the relative dielectric constant of the second insulating material, an increase in the fringe capacitance can be suppressed, and particularly, an influence on the fast operation characteristic of transistors constituting a logic circuit can be minimized.

In the method of producing a semiconductor device according to the first or second aspect of the present invention, the space between the gate electrodes constituting the adjacent second transistors is filled with the insulating material layer, so that no silicide layer is formed in the source/drain regions of the second transistor. As a result, the problems described in the [① DRAM memory cell characteristics] can be overcome. Further, the space between the gate electrodes constituting the adjacent second transistors is filled with the insulating material layer, so that the problems described in the [③ Space between gate electrodes of DRAM-constituting transistors] can be overcome.

In the method of producing a semiconductor device according to the first aspect of the present invention, when the source/drain regions are formed in a region of the semiconductor substrate in which region source/drain regions constituting the first transistor are to be formed in the step (C) after the top surface of the gate electrode constituting the first transistor and the top surface of the gate electrode constituting the second transistors are exposed in the step (B), an impurity can be also introduced into these gate electrodes, so that the gate electrodes composed of a polysilicon containing no impurity can be formed in the step (A). Therefore, the problems described in the [④ Offset layer] can be overcome.

BRIEF DESCRIPTION OF THE DRAWINGS

FIGS. 1A and 1B, are schematic partial cross-sectional views of the semiconductor substrate, etc., for explaining the method of producing the semiconductor device in Example 1.

FIGS. 2A and 2B, are schematic partial cross-sectional views of the semiconductor substrate, etc., for explaining the method of producing the semiconductor device in Example 1.

FIGS. 3A and 3B, are schematic partial cross-sectional views of the semiconductor substrate, etc., for explaining the method of producing the semiconductor device in Example 1.

FIGS. 4A and 4B, are schematic partial cross-sectional views of the semiconductor substrate, etc., for explaining the method of producing the semiconductor device in Example 1.

FIGS. 5A and 5B, are schematic partial cross-sectional views of the semiconductor substrate, etc., for explaining the method of producing the semiconductor device in Example 1.

FIGS. 6A and 6B, are schematic partial cross-sectional views of the semiconductor substrate, etc., for explaining the method of producing the semiconductor device in Example 1.

FIGS. 7A and 7B, are schematic partial cross-sectional views of the semiconductor substrate, etc., for explaining the method of producing the semiconductor device in Example 1.

FIGS. 8A and 8B, are schematic partial cross-sectional views of the semiconductor substrate, etc., for explaining the method of producing the semiconductor device in Example 1.

FIGS. 9A and 9B, are schematic partial cross-sectional views of the semiconductor substrate, etc., for explaining the method of producing the semiconductor device in Example 1.

FIGS. 10A and 10B, are schematic partial cross-sectional views of the semiconductor substrate, etc., for explaining the method of producing the semiconductor device in Example 1.

FIGS. 11A and 11B, are schematic partial cross-sectional views of the semiconductor substrate, etc., for explaining the method of producing the semiconductor device in Example 1.

FIGS. 12A and 12B, are schematic partial cross-sectional views of the semiconductor substrate, etc., for explaining the method of producing the semiconductor device in Example 1.

FIGS. 13A and 13B, are schematic partial cross-sectional views of the semiconductor substrate, etc., for explaining the method of producing the semiconductor device in Example 1.

FIG. 14B, is a schematic partial cross-sectional view of the semiconductor substrate, etc., for explaining the method of producing the semiconductor device in Example 1.

FIG. 16, following FIG. 14A, is a schematic partial cross-sectional view of the semiconductor substrate, etc., for explaining the method of producing the semiconductor device in Example 1.

FIGS. 19A and 19B, are schematic partial cross-sectional views of the semiconductor substrate, etc., for explaining the method of producing the semiconductor device in Example 3.

FIGS. 20A and 20B, are schematic partial cross-sectional views of the semiconductor substrate, etc., for explaining the method of producing the semiconductor device in Example 3.

FIGS. 21A and 21B, are schematic partial cross-sectional views of the semiconductor substrate, etc., for explaining the method of producing the semiconductor device in Example 3.

FIGS. 22A and 22B, are schematic partial cross-sectional views of the semiconductor substrate, etc., for explaining the method of producing the semiconductor device in Example 3.

FIGS. 23A and 23B, are schematic partial cross-sectional views of the semiconductor substrate, etc., for explaining the method of producing the semiconductor device in Example 3.

FIGS. 24A and 24B, are schematic partial cross-sectional views of the semiconductor substrate, etc., for explaining the method of producing the semiconductor device in Example 3.

FIGS. 25A and 25B, are schematic partial cross-sectional views of the semiconductor substrate, etc., for explaining the method of producing the semiconductor device in Example 3.

FIGS. 26A and 26B, are schematic partial cross-sectional views of the semiconductor substrate, etc., for explaining the method of producing the semiconductor device in Example 3.

FIGS. 27A and 27B, are schematic partial cross-sectional views of the semiconductor substrate, etc., for explaining the method of producing the semiconductor device in Example 3.

FIGS. 28A and 28B, are schematic partial cross-sectional views of the semiconductor substrate, etc., for explaining the method of producing the semiconductor device in Example 3.

FIG. 29B, is a schematic partial cross-sectional view of the semiconductor substrate, etc., for explaining the method of producing the semiconductor device in Example 3.

FIG. 29A, is a schematic partial cross-sectional view of the semiconductor substrate, etc., for explaining the method of producing the semiconductor device in Example 3.

FIGS. 33A and 33B, are schematic partial cross-sectional views of essential elements such as the semiconductor substrate, etc., for explaining the method of producing the semiconductor device in Example 3.

FIGS. 35A and 35B, show schematic partial cross-sectional views of essential elements such as the semiconductor substrate, etc., for explaining the variant of the method of producing the semiconductor device in Example 3.

DESCRIPTION OF THE PREFERRED EMBODIMENTS

The present invention will be explained more in detail with reference to Examples referring to drawings hereinafter. In Examples, "/" is used for explaining a stacked structure, and it should be understood that a layer described before "/" is present in an upper position.

EXAMPLE 1

Example 1 is concerned with a semiconductor device according to the first aspect of the present invention and a method of producing a semiconductor device according to the first aspect of the present invention.

Figure 9A:
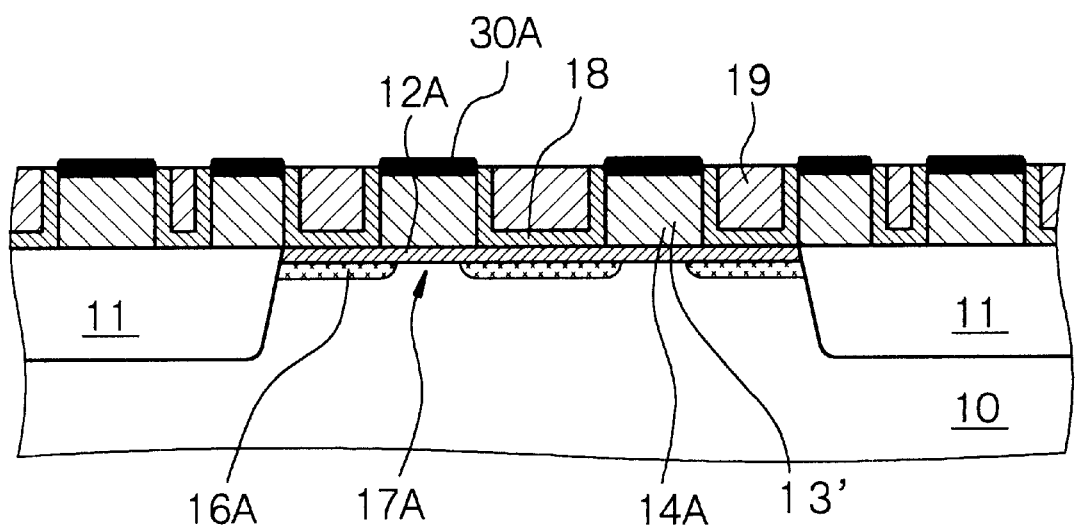
FIGS. 9A and 9B, following
Figure 9B:
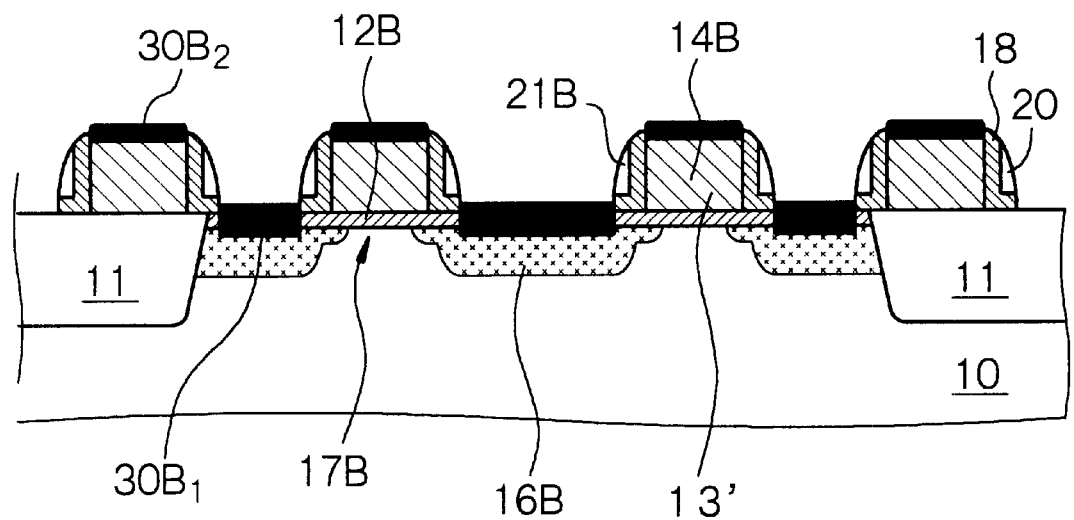
Figure 10A:
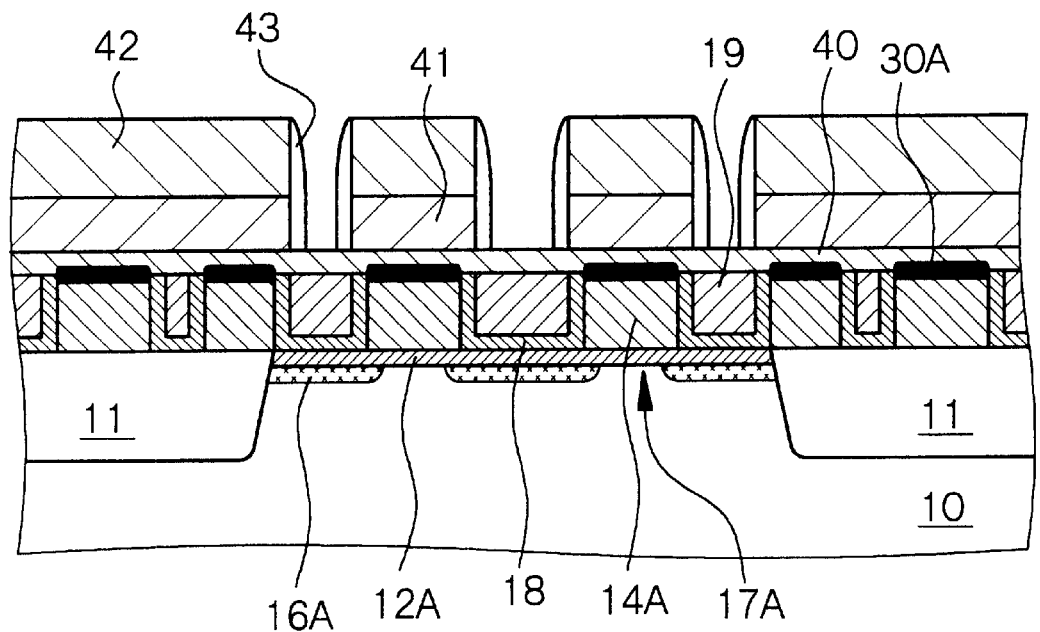
FIGS. 10A and 10B, following
Figure 10B:
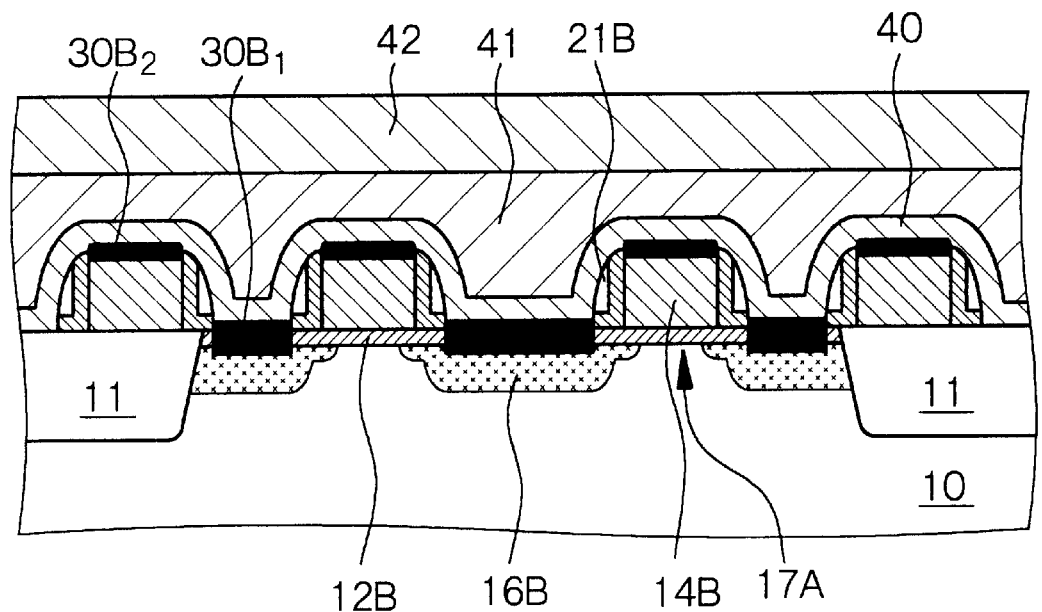
Figure 11A:
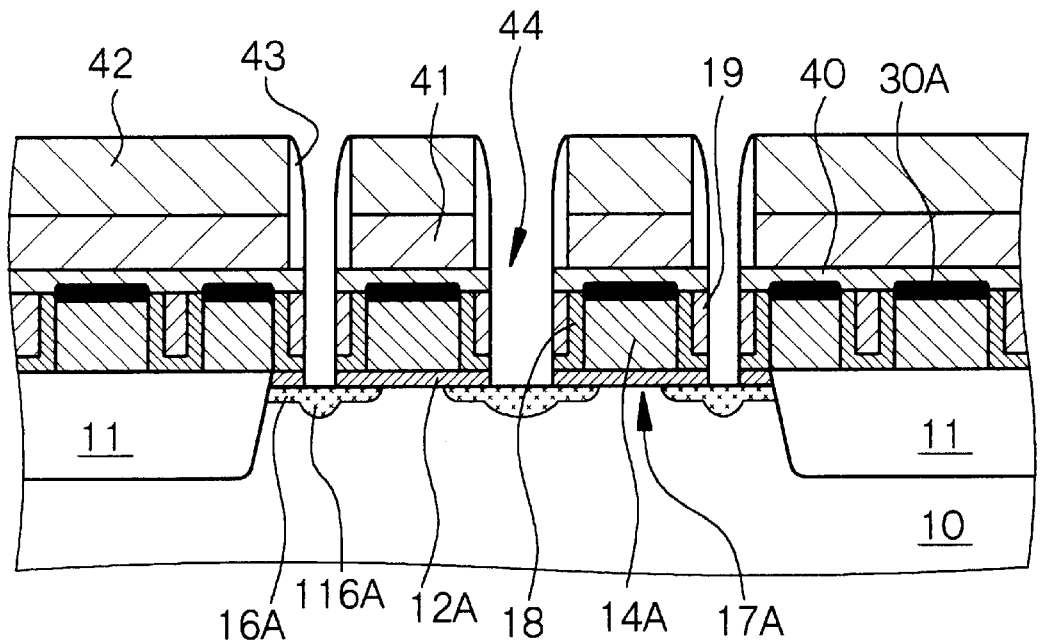
FIGS. 11A and 11B, following
Figure 11B:
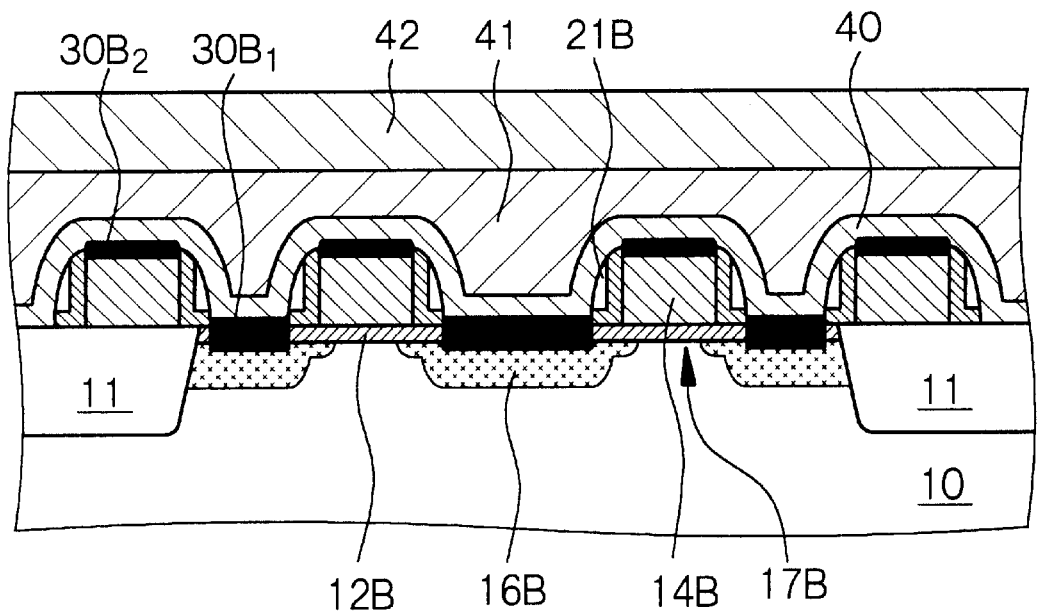

FIGS. 9A and 9B show schematic partial cross-sectional views of essential portions of the semiconductor device in Example 1. The semiconductor device comprises a plurality of first transistors formed in a first region (a region of a logic circuit) of a semiconductor substrate 10 composed of a silicon semiconductor substrate and a plurality of second transistors formed in a second region (a region of DRAM) of the semiconductor substrate 10. The logic circuit is constituted of the first transistors, and a dynamic random access memory (DRAM) is constituted of the second transistor.

As shown in FIG. 9B, the first transistor has a gate electrode 14B, a channel-forming region 17B and source/drain regions 16B. The gate electrode 14B constituting the first transistor is formed of a polysilicon layer 13' containing an impurity and a silicide layer $30B_2$ formed thereon. A silicide layer $30B_1$ is formed in surface regions of the source/drain regions 16B constituting the first transistor. As shown in FIG. 9A, the second transistor has a gate electrode 14A, a channel-forming region 17A and source/drain regions 16A. The gate electrode 14A constituting the second transistor is formed of the polysilicon layer 13' containing an impurity and a silicide layer 30A formed thereon. No silicide layer is formed in the source/drain regions 16A constituting the second transistor.

The method of producing the semiconductor device in Example 1 will be explained with reference to FIGS. 1A to 16 showing schematic partial cross-sectional views of the semiconductor substrate and the like. In FIGS. 1A to 14B, Figures indicated by Figure Numbers with "A" are concerned with the region of DRAM, and Figures indicated by Figure Numbers with "B" are concerned with the region of the logic circuit.

[Step-100]

First, a device-isolation region 11 is formed in predetermined regions of the semiconductor substrate 10 composed of a p-type silicon semiconductor substrate. The device-isolation region 11 may have a shallow-trench structure as shown in Figures, or it may have a LOCOS structure or a combination of a shallow-trench structure and a LOCOS structure. Then, a p-type well is formed in a region of the semiconductor substrate 10 in which region an n channel-type first transistor constituting the logic circuit is to be formed, and an n-type well is formed in a region of the semiconductor substrate 10 in which region a p-channel type first transistor is to be formed. Further, an n-type well is formed in a region of the semiconductor substrate 10 in which region an n-channel type second transistor constituting DRAM is to be formed, and a p-type will is formed in the n-type well (that is, a twin well structure is formed). The impurity profile in the region of the semiconductor substrate 10 in which region the first transistor constituting the logic circuit is to be formed and the impurity profile in the region of the semiconductor substrate 10 in which region the second transistor constituting DRAM is to be formed may be the same or different. The wells can be formed by ion-implanting methods. Showing of those wells is omitted.

[Step-110]

Then, gate insulating layers 12A and 12B are formed on the surface of the semiconductor substrate 10 by a thermal oxidation method. The thickness of the gate insulating layer 12B in a region of the semiconductor substrate 10 in which region the logic circuit is to be formed may the same as, or may be smaller than, the thickness of the gate insulating layer 12A in a region of the semiconductor substrate 10 in which region DRAM is to be formed. Then, an approximately 0.15 µm thick polysilicon layer 13 containing no impurity is formed on the entire surface by a CVD method (see FIGS. 1A and 1B).

[Step-120]

The polysilicon layer is patterned by a lithographic method and a dry etching method, to form the gate electrode 14B constituting the first transistor and the gate electrode 14A constituting the second transistor. After the formation of the gate electrodes 14A and 14B, the surfaces of the gate electrodes 14A and 14B may be oxidized to form a silicon oxide layer on the surfaces of the gate electrodes 14A and 14B. When the silicon oxide layer is formed on the surfaces of the gate electrodes 14A and 14B, the thickness of the gate insulating layers 12A and 12B in the vicinity of lower end of each side wall of the gate electrodes 14A and 14B increases to some extent. As a result, an electric field in the lower end portion of each side wall of the gate electrodes 14A and 14B can be moderated, so that DRAM can be improved in refresh characteristic and that the occurrence of leak current caused by a decrease in the thickness of the gate insulating layer can be prevented.

Since the polysilicon layer 13 to be etched contains no impurity, the problems caused by a difference between etching rates of a polysilicon layer containing an n-type impurity and a polysilicon layer containing a p-type impurity, explained in the [④ Offset layer], can be overcome.

Figure 1A:
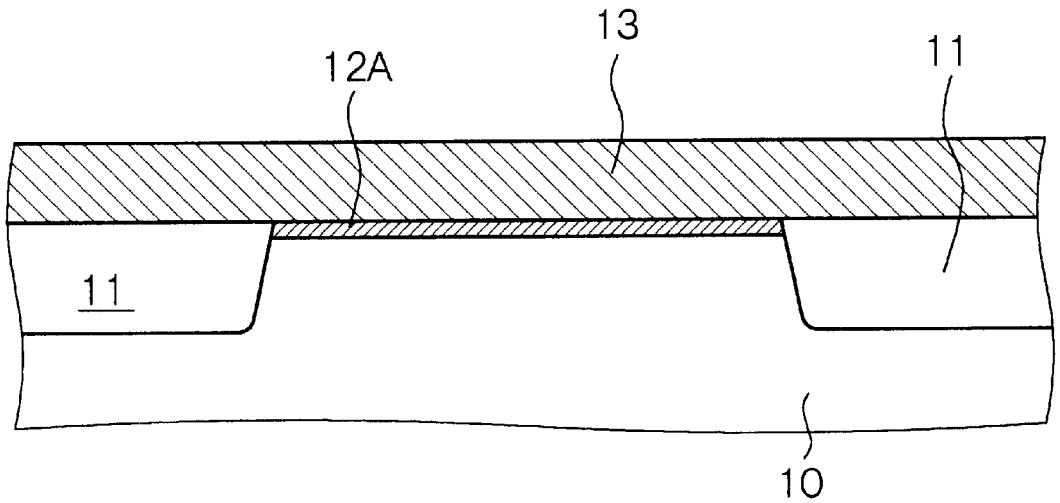
FIGS. 1A and 1B are schematic partial cross-sectional views of a semiconductor substrate, etc., for explaining the method of producing a semiconductor device in Example 1.
Figure 1B:
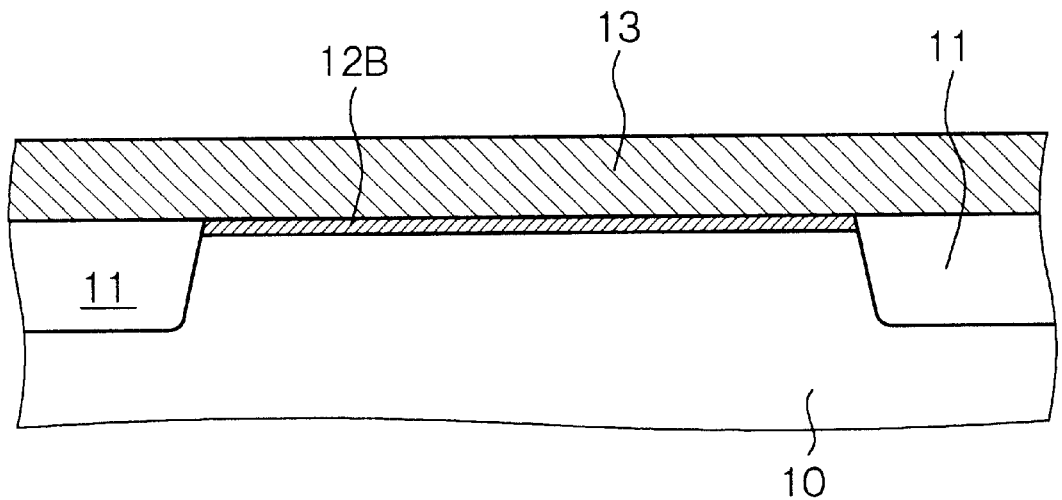
Figure 2A:
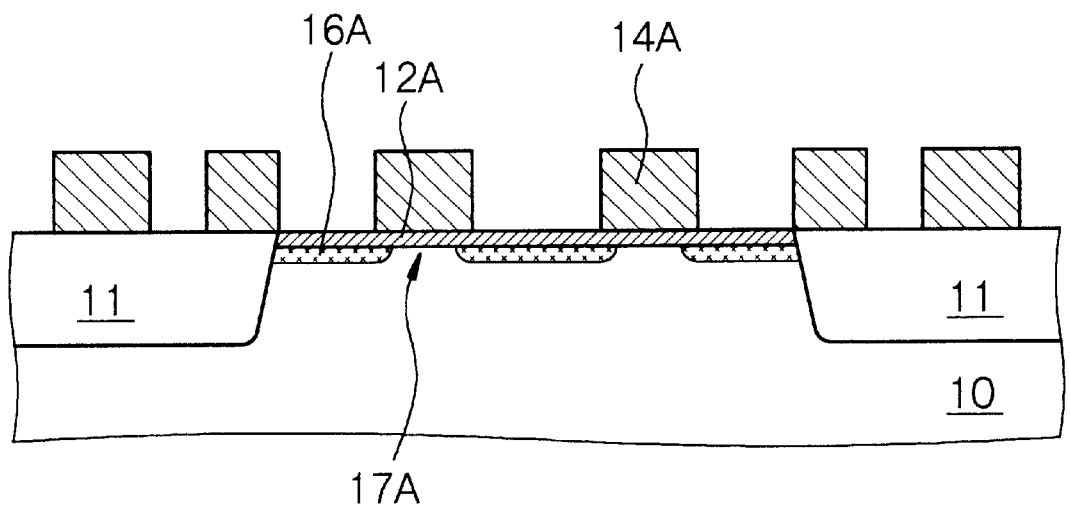
FIGS. 2A and 2B, following
Figure 2B:
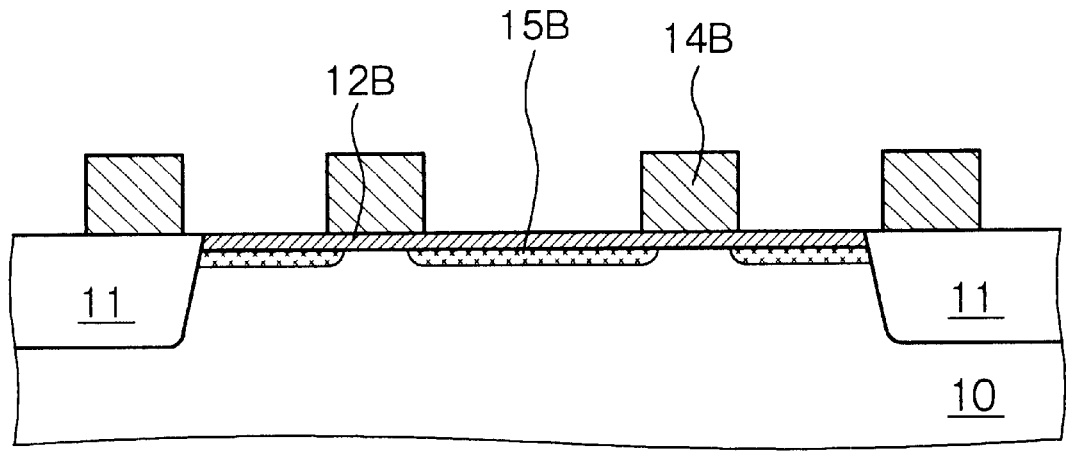

Then, a mask layer composed of a resist material is formed on the region of the semiconductor substrate 10 in which region the p-channel type first transistor constituting the logic circuit is to be formed, an exposed region of the semiconductor substrate 10 is ion-implanted with an n-type impurity, and then, the mask layer is removed, whereby the source/drain regions 16A constituting the second transistor can be formed in the semiconductor substrate 10. The channel-forming region 17A is formed between a pair of the source/drain regions 16A constituting the second transistor. A region having a low impurity content for forming an LDD structure or an extension region 15B can be also formed in the region of the semiconductor substrate 10 in which region the n-channel type first transistor constituting the logic circuit is to be formed. FIGS. 2A and 2B show structures obtained as explained above.

Then, a mask layer composed of a resist material is formed on the region of the semiconductor substrate 10 in which region the n-channel type first transistor constituting the logic circuit is to be formed and on the region of the semiconductor substrate 10 in which region the n-channel type second transistor constituting DRAM is to be formed, an exposed region of the semiconductor substrate 10 is ion-implanted with a p-type impurity, and then, the mask layer is removed, whereby a region having a low impurity content for forming an LDD structure or extension region 15B can be formed in the region of the semiconductor substrate 10 in which region the p-channel type first transistor constituting the logic circuit is to be formed.

For preventing enhanced diffusion, it is preferred to carry out heat treatment after completion of the ion implantation.

[Step-130]

Then, a space between the gate electrodes 14A constituting the adjacent second transistors is filled with an insulating material layer, and there are exposed a region of the semiconductor substrate 10 in which region the source/drain regions 16B constituting the first transistor, the top surface of the gate electrode 14B constituting the first transistor and the top surface of the gate electrode 14A constituting the second transistor. In Example 1, the insulating material layer is constituted of a first insulating material layer 18 composed of silicon nitride (SiN) and a second insulating material layer 19 composed of silicon oxide ($SiO_2$).

Figure 3A:
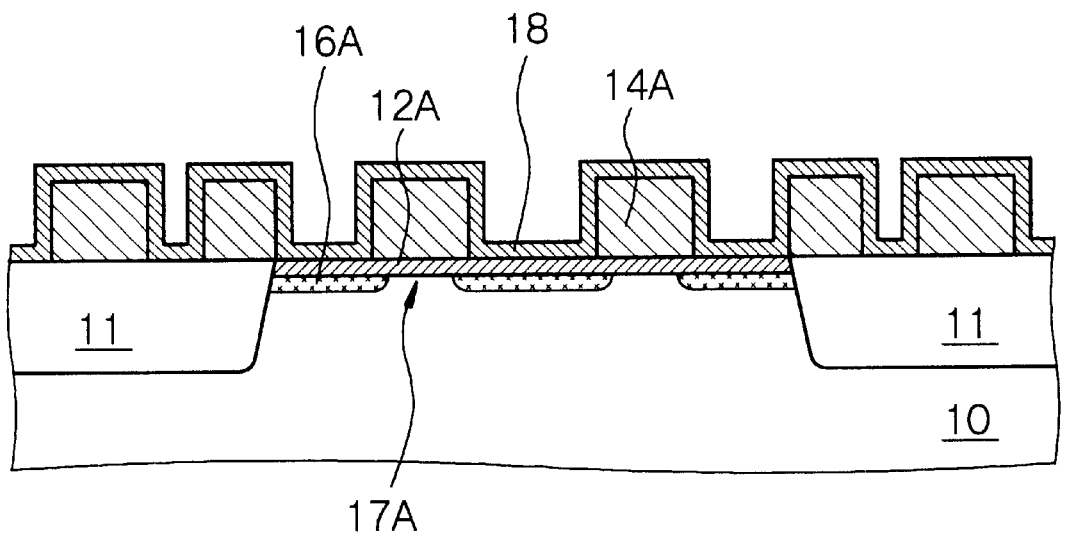
FIGS. 3A and 3B, following
Figure 3B:
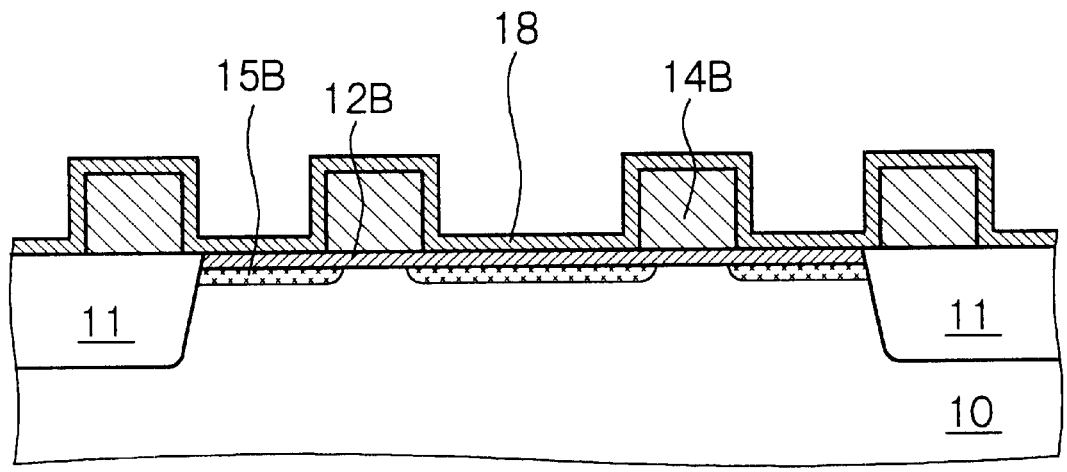
Figure 4A:
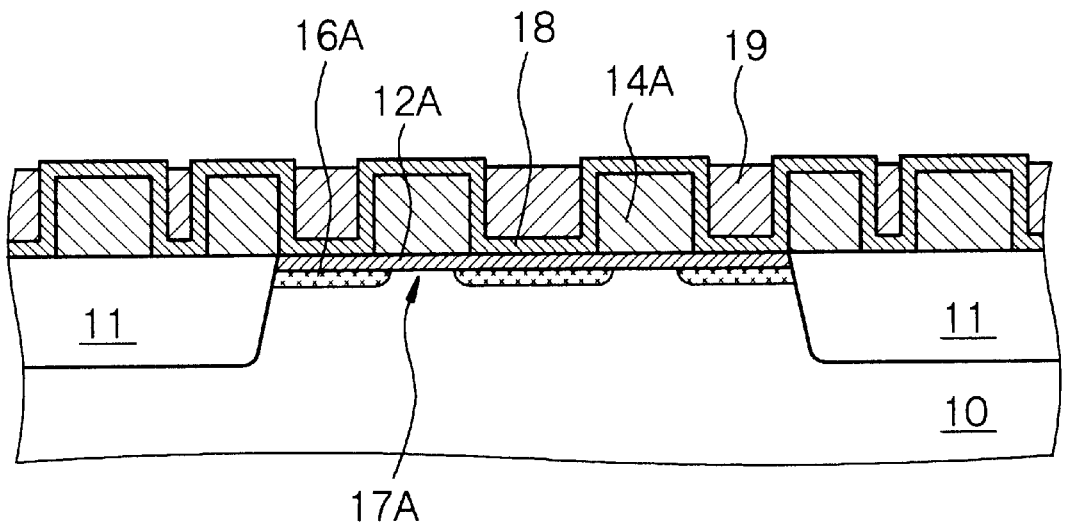
FIGS. 4A and 4B, following
Figure 4B:
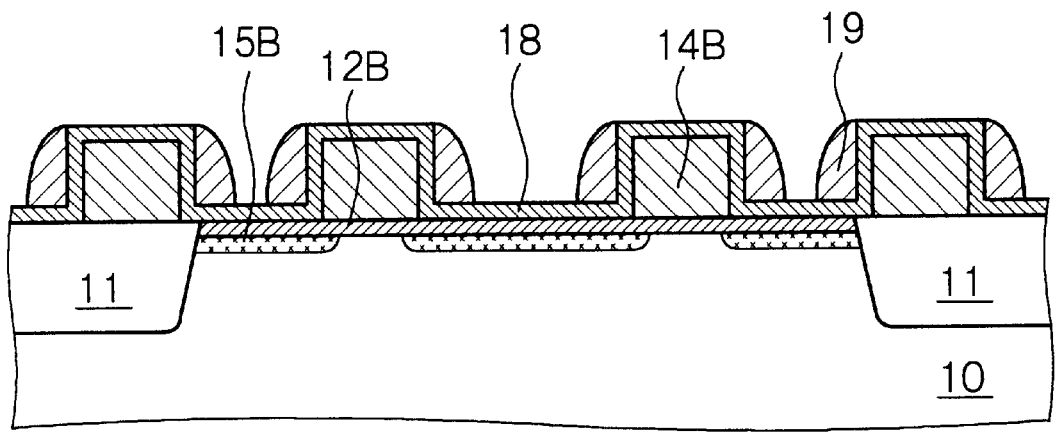
Figure 5A:
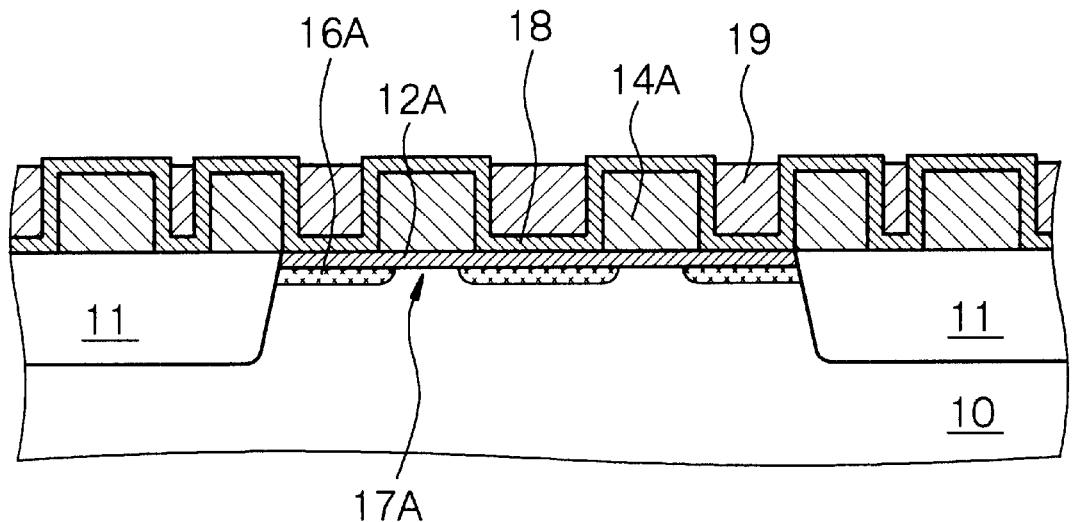
FIGS. 5A and 5B, following
Figure 5B:
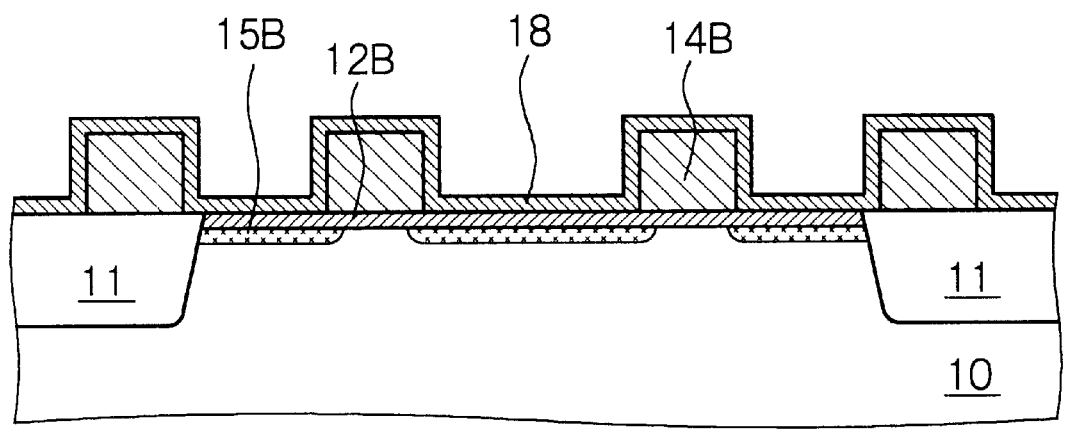

Specifically, the first insulating material layer 18 composed of silicon nitride (SiN) having a thickness of approximately 30 nm is formed on the entire surface by a CVD method (see FIGS. 3A and 3B). Then, the second insulating material layer 19 composed of silicon oxide ($SiO_2$) is formed on the first insulating material layer 18 by a CVD method. The second insulating material layer 19 is formed so as to have a thickness sufficient for reliably fill the space between the gate electrodes 14A constituting the adjacent second transistors, for example, so as to have a thickness of approximately 0.3 μm. In Example 1, the space between the gate electrodes 14B constituting the adjacent first transistors is filled with the second insulating material layer 19 in one case, or the space between the gate electrodes 14B constituting the adjacent first transistors is not filled with the second insulating material layer 19 in other case, depending upon the distance between the gate electrodes 14B constituting the adjacent first transistors. Then, the second insulating material layer 19 on a region where the first transistor is to be formed is etched back, for example, with a high-density plasma etching apparatus using $C_4F_8$/CO/Ar gas. While securing a selective etching ratio with the first insulating material layer 18, there can be simultaneously formed a state where the space between the gate electrodes 14A constituting the adjacent second transistors is filled with the second insulating material layer 19. FIGS. 4A and 4B show a state were the etching back is completed. Then, a region of the semiconductor substrate 10 in which region the second transistor is to be formed is covered with a mask layer (not shown) composed of a resist material, the second insulating material layer 19 remaining in the region of the semiconductor substrate 10 in which region the first transistor is to be formed is completely removed with hydrofluoric acid, and then the mask layer is removed (see FIGS. 5A and 5B). In this manner, the second insulating material layer 19 can be formed on the first insulating material layer 18 such that the space between the gate electrodes 14A constituting the adjacent second transistor is filled with the second insulating material layer 19.

Figure 6A:
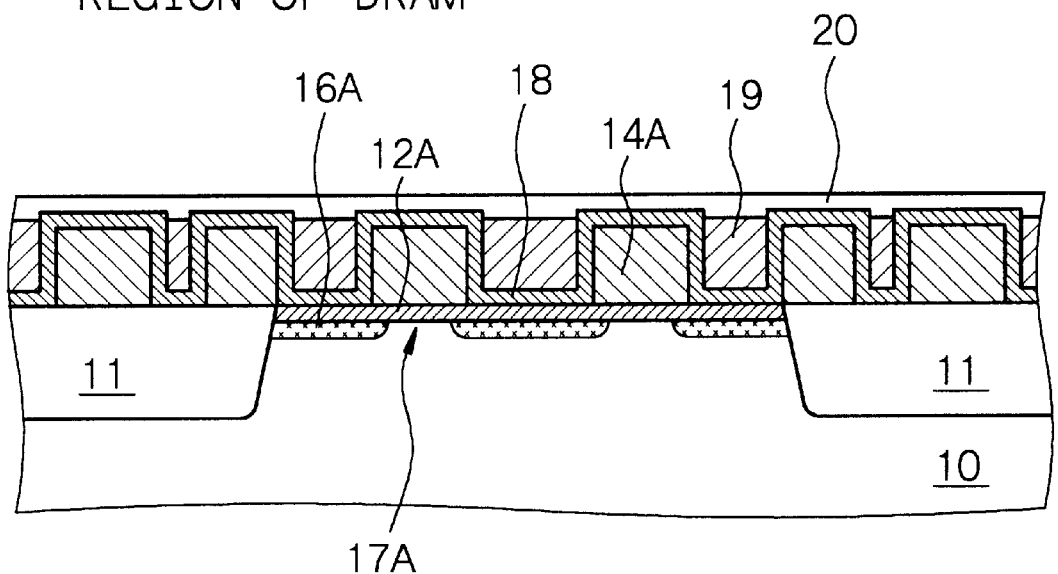
FIGS. 6A and 6B, following
Figure 6B:
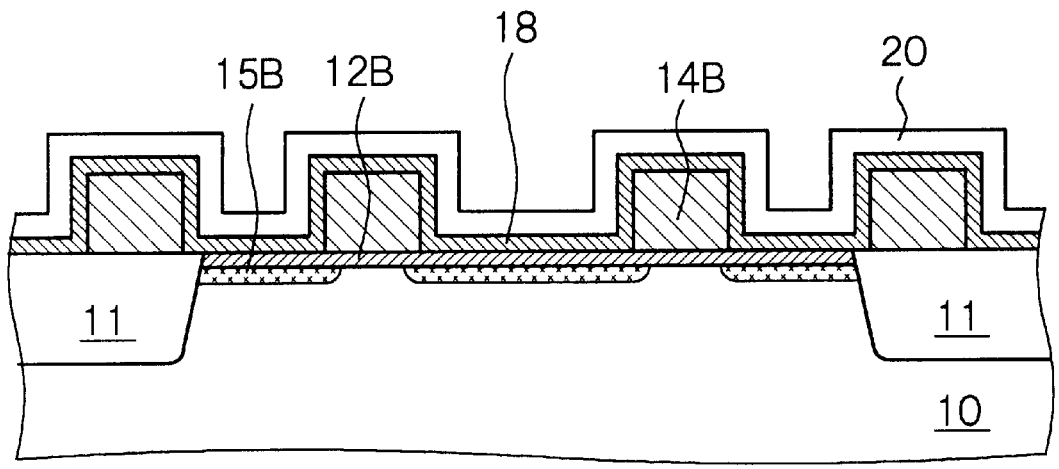

Then, a third insulating material layer 20 is formed on the entire surface by a CVD method (see FIGS. 6A and 6B). The third insulating material layer 20 can be composed of any one of silicon oxide, SOG, PSG, BPSG, BSG, AsSG, PbSG, SbSG, NSG, LTO, SiN and SiON. The thickness of the third insulating material layer 20 and the thickness of the first insulating material layer 18 determine the thickness of a gate sidewall 21B to be formed in a step to follow (thickness of the gate sidewall 21B in its boundary region to the semiconductor substrate 10).

Figure 7A:
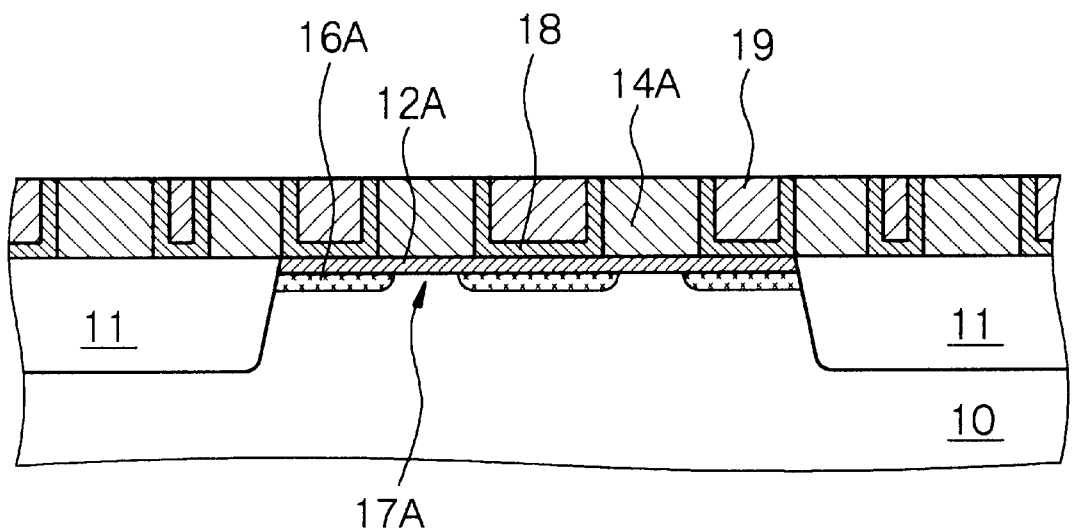
FIGS. 7A and 7B, following
Figure 7B:
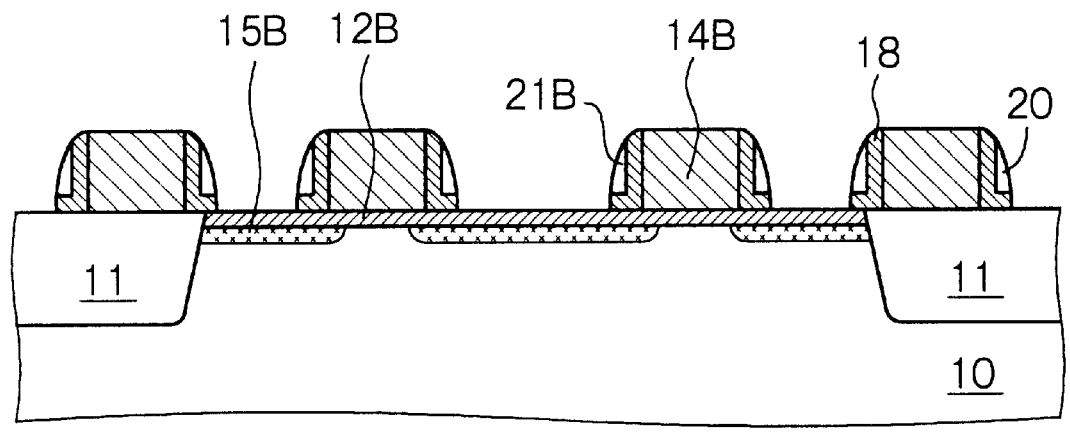

Then, the third insulating material layer 20 is etched back, and further, the first insulating material layer 18 is etched, for example, with a parallel plate type etching apparatus using an etching gas such as $CF_4$ or $CHF_3$, to form the gate sidewalls 21B on the side walls of the gate electrode 14B constituting the first transistor and to remove the third insulating material layer 20 and the first insulating material layer 18 in other region of the region of the semiconductor substrate 10 in which region the first transistor is to be formed (see FIGS. 7A and 7B). The gate sidewall 21B is formed of the third insulating material layer 20 and the first insulating material layer 18. At the same time, the whole of the third insulating material layer 20 and part of the first insulating material layer 18 on the region where the second transistor is to be formed are removed by the etching. In this manner, the first insulating material layer 18 on the region where the first transistor is to be formed and the first insulating material layer 18 on the top surface of the gate electrode 14A constituting the second transistor are removed, whereby there can be exposed the region of the semiconductor substrate 10 in which region the source/drain regions constituting the first transistor are to be formed, the top surface of the gate electrode 14A constituting the first transistor and the top surface of the gate electrode 14B constituting the second transistor.

[Step-140]

Figure 8A:
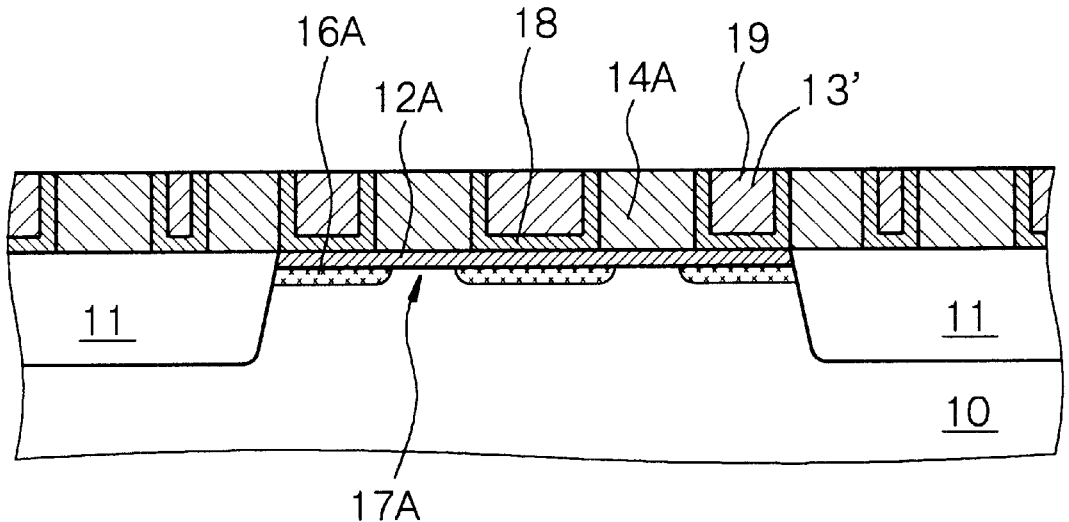
FIGS. 8A and 8B, following
Figure 8B:
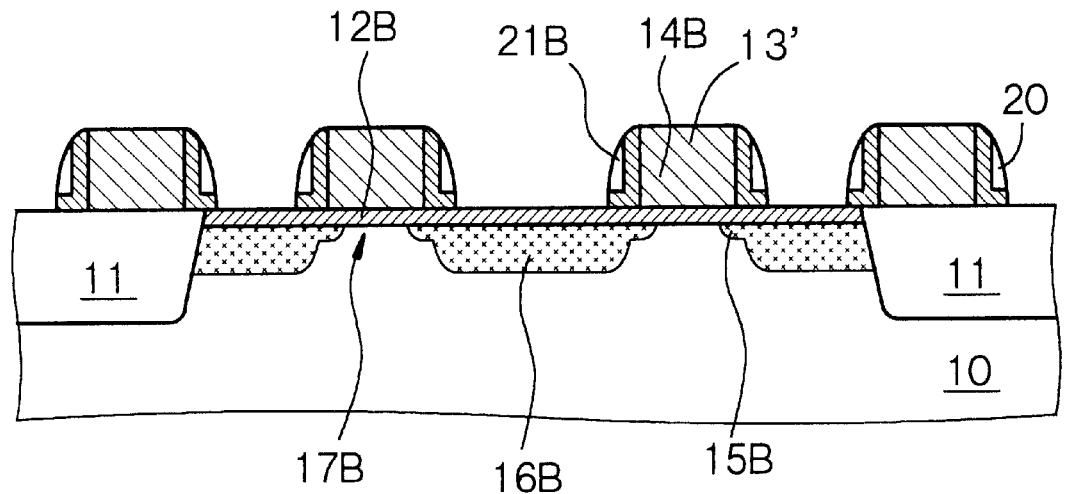

Then, the source/drain regions 16B are formed in a region of the semiconductor substrate 10 in which region the source/drain regions constituting the first transistor are to be formed. Specifically, the region of the semiconductor substrate 10 in which region the p-channel type first transistor constituting the logic circuit is to be formed is covered with a mask layer composed of a resist material, an exposed region of the semiconductor substrate 10 is ion-implanted with an n-type impurity, and the mask layer is removed, whereby the source/drain regions 16B can be formed in the region of the semiconductor substrate 10 in which region the n-channel type first transistor constituting the logic circuit is to be formed. The channel-forming region 17B is formed between a pair of the source/drain regions 16B constituting the first transistor. At the same time, an n-type impurity is introduced into the gate electrode 14A constituting the second transistor and the gate electrode 14B constituting the n-channel type first transistor of the logic circuit. In Figures, reference numeral 13' shows the polysilicon layer into which an impurity is introduced. FIGS. 8A and 8B show the thus-obtained structure.

The region of the semiconductor substrate 10 in which region the n-channel type first transistor constituting the logic circuit is to be formed and the region of the semiconductor substrate 10 in which region the n-channel type second transistor constituting DRAM is to be formed are covered with a mask layer composed of a resist material, an exposed region of the semiconductor substrate 10 is ion-implanted with a p-type impurity, and the mask layer is removed, whereby the source/drain regions 16B can be formed in the region of the semiconductor substrate 10 in which region the p-channel type first transistor constituting the logic circuit is to be formed. At the same time, the p-type impurity is introduced into the gate electrode 14B constituting the p-channel type first transistor of the logic circuit.

After the ion-implantation, heat treatment is carried out by an RTP (Rapid Thermal Processing) method for activating the introduced impurities.

[Step-150]

Then, a silicide layer $30B_1$ is formed in the surface region of each source/drain region 16B constituting the first transistor, a silicide layer $30B_2$ is also formed on the top surface of the gate electrode 14B constituting the first transistor, and a silicide layer 30A is formed on the top surface of the gate electrode 14A constituting the second transistor (see FIGS. 9A and 9B). Specifically, for example, a metal layer composed of cobalt (Co) is formed on the entire surface by a sputtering method, and heat treatment is carried out according to an RTA method in an atmosphere of 100% $N_2$ or $N_2$/Ar (atmospheric pressure) at 550° C. for 30 seconds, whereby Co atoms and Si atoms constituting the semiconductor substrate 10 and the gate electrodes 14A and 14B react to form a cobalt silicide layer. The metal layer on the gate sidewall 21B, the device-isolation region 11, the first insulating material layer 18 and the second insulating material layer 19 undergoes no reaction and remains intact. Then, the unreacted metal layer is removed with a mixture solution containing sulfuric acid, a hydrogen peroxide aqueous solution and pure water, and heat treatment is again carried out according to an RTA method in an atmosphere of 100% $N_2$ or $N_2$/Ar (atmospheric pressure) at 700° C. for 30 seconds, whereby the resistance of the cobalt silicide layer can be decreased.

The source/drain regions 16A constituting the second transistor are covered with the second insulating material layer 19, so that no silicide layer is formed in the source/drain regions 16A.

[Step-160]

Then, while the semiconductor substrate 10 is under heat at 380° C. to 650° C., an approximately 30 nm thick etching-stop layer 40 composed of silicon nitride is formed on the entire surface by a plasma CVD method or an LP-CVD method. The etching-stop layer 40 works as an etching stopper when an opening portion is formed later. Since a contact plug to be formed later can have a smaller depth than a contact plug in any conventional semiconductor device in which a logic circuit and DRAM are mounted together, the thickness of the etching-stop layer 40 can be approximately equal to the thickness of an etching-stop layer in a semiconductor device constituting the logic circuit.

Then, an insulating interlayer 41 composed, for example, of silicon oxide ($SiO_2$) is formed on the entire surface by a CVD method, and the insulating interlayer 41 is flattened by a chemical/mechanical polishing method (CMP method) or the like. The above insulating interlayer 41 will be called "first insulating interlayer 41" for convenience. Then, a hard mask layer 42 composed of polysilicon is formed on the entire surface by a CVD method. Then, an opening portion is formed in the hard mask layer 42 and the first insulating interlayer 41 by a lithographic method and a dry-etching method. Then, a polysilicon layer is formed in the opening portion and on the hard mask layer 42, and the polysilicon layer is etched back to form a mask 43 for decreasing the opening portion in diameter in the opening portion (see FIGS. 10A and 10B). For example, the diameter of the opening portion is decreased to approximately 80 nm by the mask 43 for decreasing the opening portion in diameter. That is, the opening portion has a diameter of approximately 80 nm in its bottom portion. There may be employed a procedure of forming a mask layer composed of a resist material without forming the hard mask layer 42 and then forming an opening portion in the first insulating interlayer 41, the etching-stop layer 40 and the second insulating material layer 19 using the above mask layer as an etching mask.

Then, opening portions 44 reaching the source/drain regions 16A constituting the second transistor are formed in the etching-stop layer 40, the second insulating material layer 19 and the first insulating material layer 18 by a dry etching method using, as etching masks, the hard mask layer 42 and the mask 43 for decreasing the opening portion in diameter. Since the etching-stop layer 40 is formed, the etching of the second insulating material layer 19 below the etching-stop layer 40 can be prevented, and short-circuiting between a contact plug to be formed at a step to follow and the gate electrode 14A can be reliably prevented. Then, preferably, an n-type impurity is ion-implanted into the source/drain regions 16A constituting the second transistor which source/drain regions are exposed in the bottom portions of the opening portions 44 (i.e., contact compensating ion implantation is carried out), in order to decrease a contact resistance between contact plugs to be formed in opening portions 44 and the source/drain regions 16A (see FIGS. 11A and 11B). Reference numeral 116A shows a region containing a high concentration of an impurity, formed in each source/drain region 16A constituting the second transistor.

Then, an impurity-containing silicon layer composed of polysilicon or amorphous silicon is deposited in the opening portion 44 and on the entire surface, and the silicon layer, the hard mask layer 42 and the mask 43 for decreasing the opening portion in diameter are removed by an etching back method or a CMP method. The silicon layer containing an impurity which is an electric conductive material is filled in the opening portions 44, to complete contact plugs 45 (contact plug for bit line and contact plug for a node).

Then, heat treatment is carried out at 800 to 850° C. by an RTP method for activating the impurity in the impurity-containing region 116A and the impurity in the contact plugs 45. While this heat treatment is useless for the process for producing the first transistor constituting the logic circuit, the heat treatment is carried out for such a short period of time that its influence on the characteristics of the transistors is negligible.

Figure 12A:
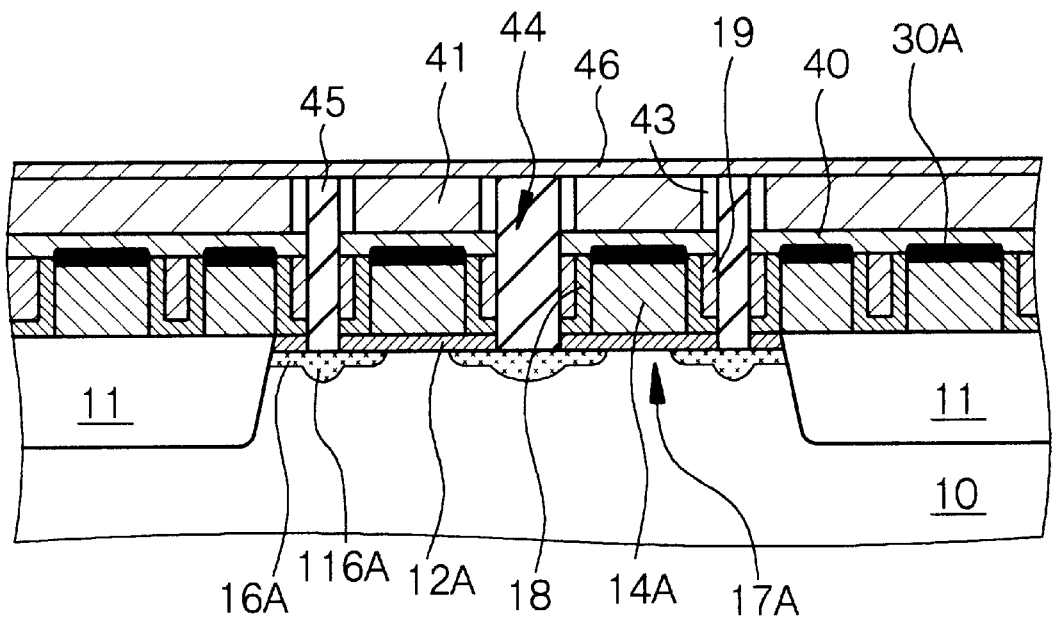
FIGS. 12A and 12B, following
Figure 12B:
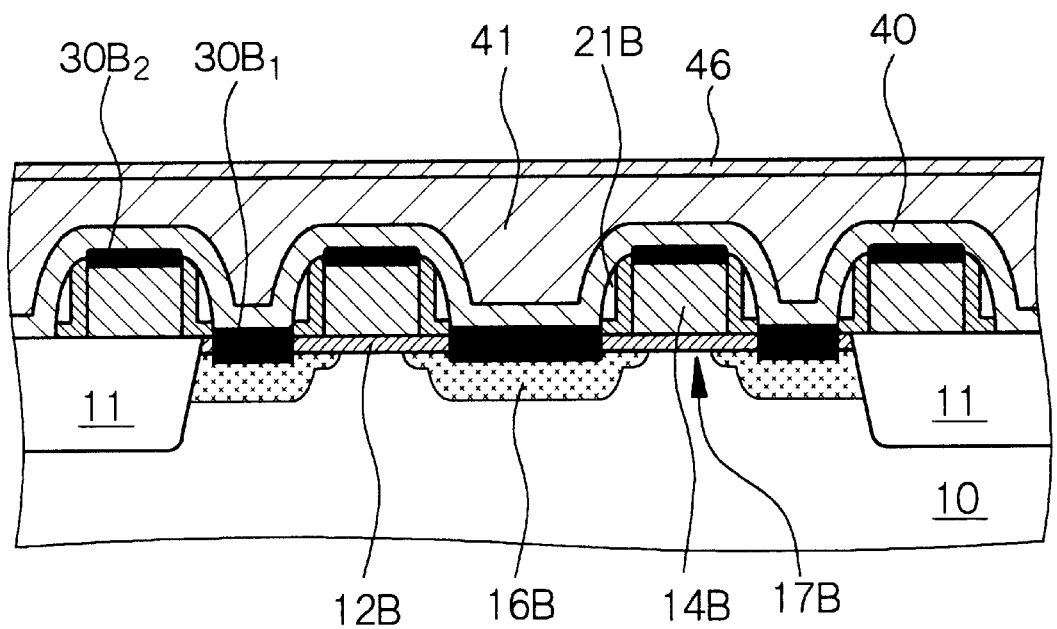

Then, an approximately 20 nm thick first insulating film 46 composed of silicon oxide is formed on the top surface of each contact plug 45 and on the first insulating interlayer 41 for electrically separating the contact plugs 45 and the bit line. FIGS. 12A and 12B show the thus-obtained state.

[Step-170]

Figure 13A:
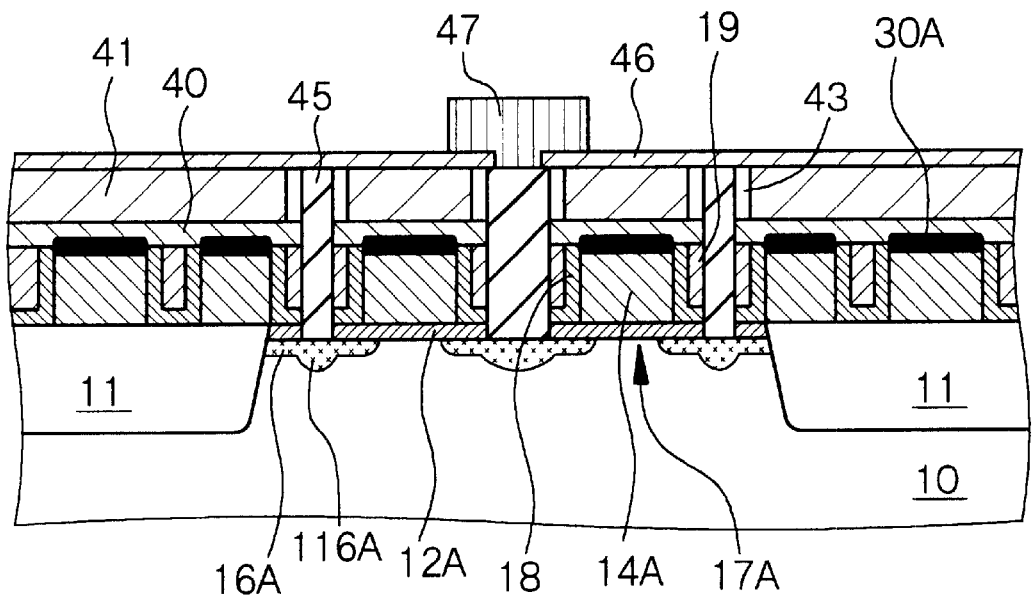
FIGS. 13A and 13B, following
Figure 13B:
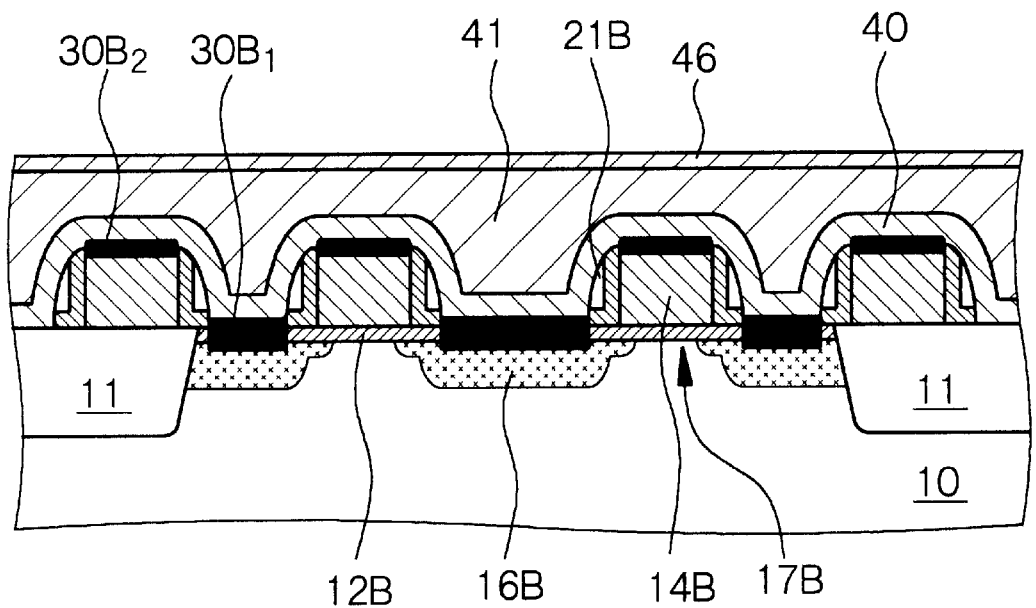

Then, a bit line 47 is formed on the contact plug 45 for a bit line and on the first insulating film 46 (see FIGS. 13A and 13B). Specifically, an opening portion is formed in the first insulating film 46 on the contact plug 45 for a bit line, then, a 10 to 20 nm thick titanium (Ti) layer, an approximately 20 nm thick TiN layer and an approximately 100 nm thick tungsten layer are consecutively formed by sputtering methods, and the tungsten layer, the TiN layer and the titanium layer are patterned. Figure shows the bit line as a single layer. In the above bit line structure, since the resistance of the bit line 47 can be decreased, the bit line can be improved in an equalizing speed and fast access can be attained. When the bit line 47 is formed, local wirings in the first transistor constituting the logic circuit can be also formed. The bit line structure also includes a stacked structure of tungsten layer/TiN layer and a stacked structure of tungsten layer/WN layer/polysilicon layer.

[Step-180]

Then, a second insulating interlayer 50 is formed on the entire surface, an opening portion is formed in the second insulating interlayer 50 above the contact plug 45 for a node, the opening portion is filled with tungsten to form a node contact plug 51. Specifically, an opening portion having a diameter of approximately 100 nm is formed in the second insulating interlayer 50 by a super resolution technology or by means of a combination of the above-explained hard mask layer and the mask for decreasing an opening portion in diameter, a titanium layer and a TiN layer are formed in the opening portion and on the second insulating interlayer 50 by sputtering methods, and a tungsten layer is formed in the opening portion and on the entire surface by a CVD method. The tungsten layer, the TiN layer and the titanium layer on the second insulating interlayer 50 are selectively removed by an etching back method or a CMP method, whereby the node contact plug 51 can be obtained. Figure shows the node contact plug 51 as a single layer.

Figure 14A:
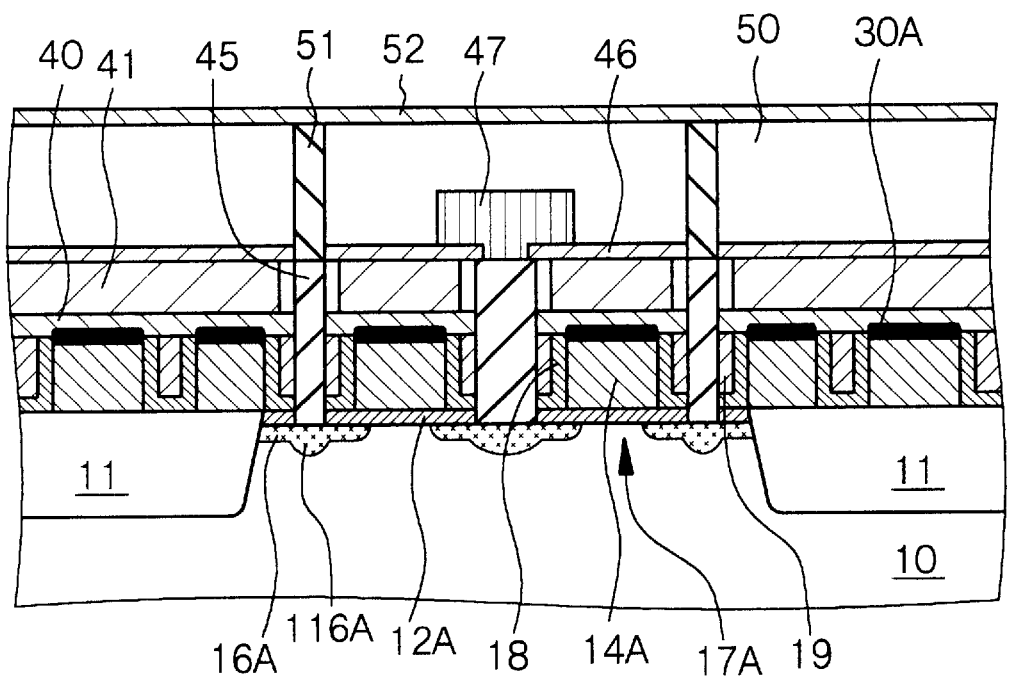
FIGS. 14A and 14B, following
Figure 14B:
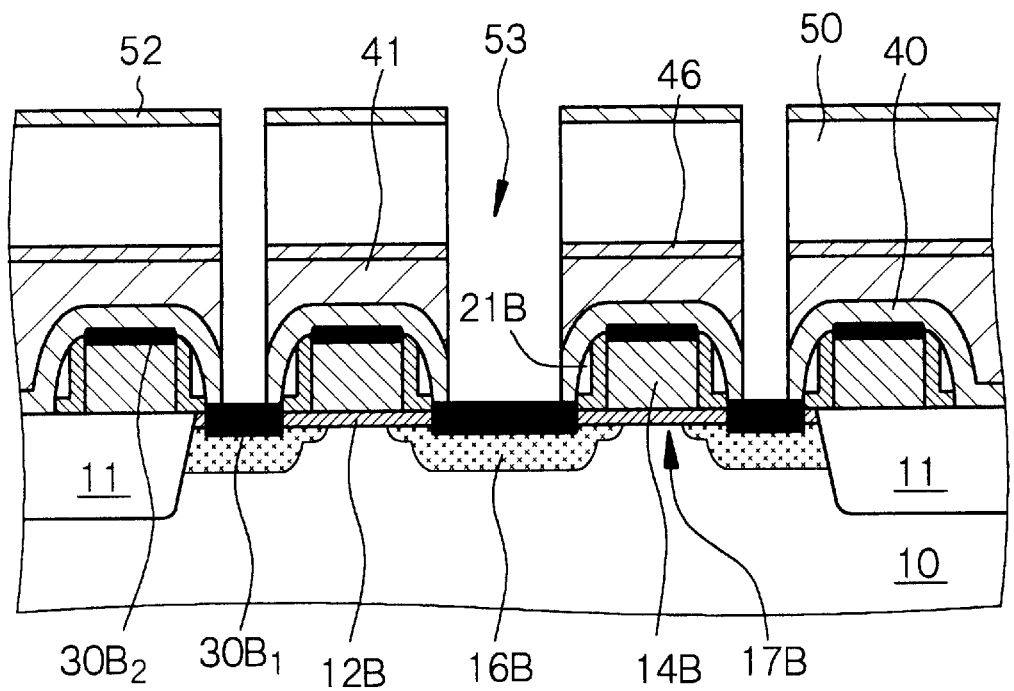
Figure 15:
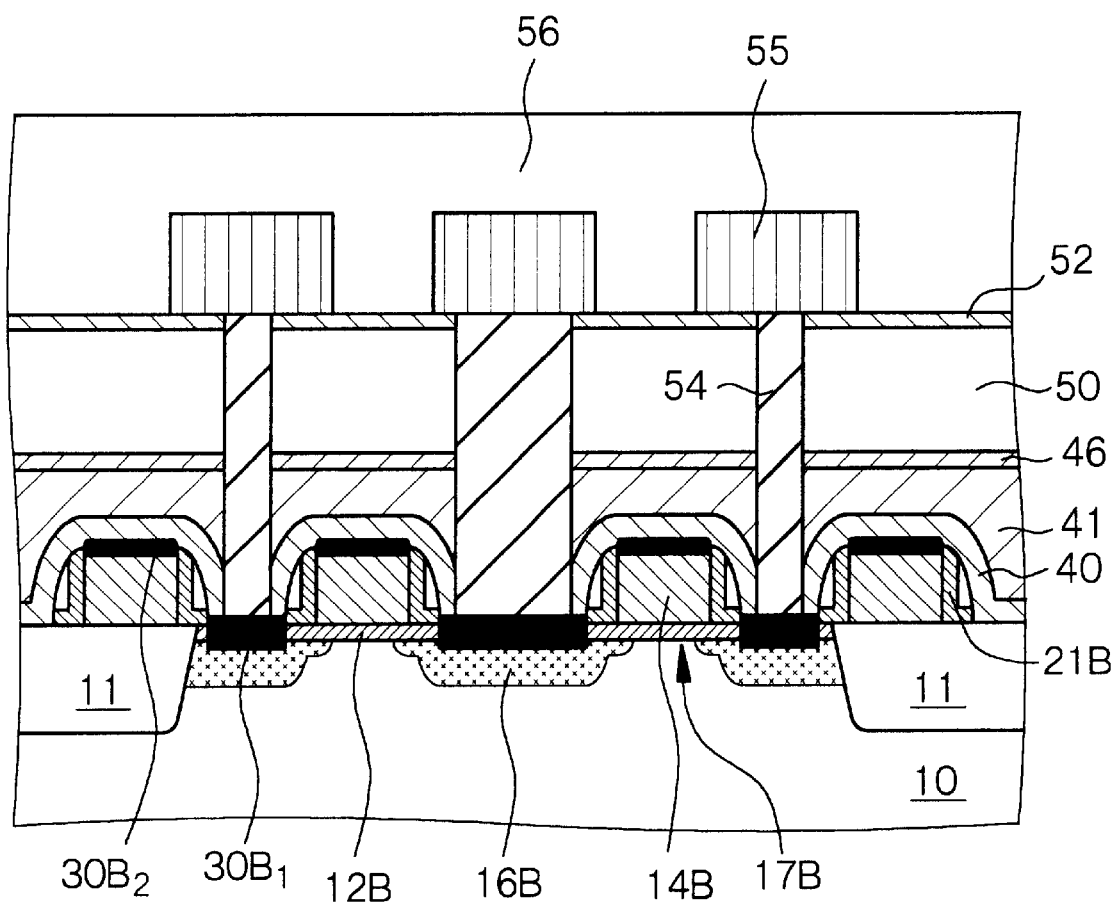
FIG. 15, following

Then, an approximately 100 nm thick second insulating film 52 is formed on the top surface of the node contact plug 51 and on the second insulating interlayer 50, and then, opening portions 53 are formed, which opening portions 53 penetrate through the second insulating film 52, the second insulating interlayer 50, the first insulating film 46 and the first insulating interlayer 41 and reach the source/drain region 16B and the gate electrode 14B constituting the first transistor of the logic circuit (see FIGS. 14A and 14B). Showing of the opening portion reaching the gate electrode 14B is omitted. Since the etching-stop layer 40 and the gate sidewalls 21B are formed, short-circuiting between a contact plug to be formed in a step to follow and the gate electrode 14B can be reliably prevented.

Then, sintering treatment is carried out for introducing hydrogen into the source/drain regions 16B constituting the first transistor. The sintering treatment can be heat treatment around 400° C. in a hydrogen gas atmosphere.

When a capacitor for DRAM is formed, it is said that a generally used dielectric material such as a nitride film requires a high-temperature process at approximately 700 to 800° C. As the capacitor, there may be employed an MIM (Metal-Insulator-Metal) structure which can be formed by a low-temperature process at 600° C. or lower. However, it is said that when the contact plug is formed on the source/drain region of the first transistor constituting the logic circuit, heat treatment around 650° C. is required for improving a barrier metal or a glue layer in characteristics. When the heat treatment around 650° C. is carried out, however, the capacitor having the MIM structure may deteriorate in characteristic. Further, the dielectric film constituting the MIM-structured capacitor is generally composed of metal oxide, and such a dielectric film causes a leak due to an oxygen defect and is therefore deteriorates in characteristic, so that it is undesirable to expose the dielectric film to a high-temperature reducing atmosphere. That is, it is desirable at any case to avoid the sintering treatment of introducing hydrogen into the source/drain regions of the first transistor constituting the logic circuit after the formation of the MIM-structured capacitor.

In Example 1, the sintering treatment and the formation of the contact plug on the source/drain region of the first transistor constituting the logic circuit are carried out before the formation of the capacitor, so that the above problem does not take place in any case.

Then, an adhesion layer (not shown) composed of TiN is formed in the opening portion 53 and on the second insulating film 52 by a sputtering method, and RTP treatment is carried out at a temperature around 650° C. for densifying the adhesion layer. In this case, formation of a silicide takes place in a connection boundary region of the node contact plug 51 composed of tungsten and the contact plug 45 for a node composed of silicon, and as a result, the connection between the node contact plug 51 and the contact plug 45 for a node can be secured. And, a tungsten layer is formed in the opening portion 53 and on the entire surface by a CVD method, and then, the tungsten layer and the TiN layer on the second insulating film 52 are selectively removed by an etching back method or a CMP method, whereby a contact plug 54 can be obtained. Figure shows the contact plug 54 as a single layer.

Then, a wiring 55 having the stacked structure of TiN/Al—Cu/TiN/Ti (=50/400/20/20 nm) is formed by sputtering methods, a lithographic method and a dry etching method. Since the wiring 55 is formed before the formation of the capacitor constituting DRAM causes a large height level difference, the wiring 55 and the contact plug 54 can be easily obtained, and they are highly reliable. Figure shows the wiring 55 as a single layer. Then, a third insulating interlayer 56 is formed on the entire surface (see FIG. 15). Since the wiring 55 is formed before the formation of the capacitor, the contact plug 54 can be formed so as not to be deep.

Then, an concave portion having a storage node form is formed in the third insulating interlayer 56 such that the node contact plug 51 is exposed in a bottom thereof. Thereafter, a thin film composed of a metal compound having excellent oxidation resistance such as WN or TiN, or a metal whose oxide has electric conductivity such as Ru or Ir or a metal oxide of such a metal is deposited in the concave portion and on the third insulating interlayer 56 so as to have a thickness of approximately 50 nm. Then, the concave portion is filled with a resist material or a material which can be selectively removed relative to the third insulating interlayer 56, such as BPSG or SOG, the thin film on the third insulating interlayer 56 is removed by an etching back method or a CMP method, and the material filled in the concave portion is removed, whereby a storage node electrode 57 can be formed in the concave portion. Then, an approximately 10 nm thick dielectric thin film 58 composed of $Ta_2O_5$ is formed on the storage node electrode 57 in the concave portion and on the third insulating interlayer 56, and the dielectric thin film 58 is exposed to ultraviolet light under heat at 400 to 450° C. and then annealed in an ozone gas atmosphere for about 10 minutes. In this manner, while the dielectric thin film 58 remains to be in an amorphous state, oxygen deficiency in the dielectric thin film is fully removed, and residual carbon is also removed, so that a capacitor dielectric film having excellent film qualities is formed. Then, an approximately 100 nm TiN layer or tungsten layer is formed on the entire surface by a sputtering method, and the TiN layer or the tungsten layer and the dielectric thin film are patterned by a lithographic method and an etching method, whereby a cell plate 59 formed of the TiN layer or the tungsten layer can be obtained (see FIG. 16). In the above capacitor formation step, no large height level difference is caused. The storage node electrode 57 is formed such that one storage node electrode corresponds to one second transistor and that another storage node electrode 57 corresponds to another second transistor. The dielectric thin film 58 and the cell plate 59 are common to a plurality of (or all of) the second transistors.

Then, a fourth insulating interlayer is formed on the entire surface, an opening portion is formed in the fourth insulating interlayer above the cell plate 59 and the wiring 55, and the opening portion is filled with an electrically conductive material, to form a connection hole. Then, a wiring material layer is formed on the connection hole and the fourth insulating interlayer, and the wiring material layer is patterned, whereby a second wiring can be formed. Since the capacitor structure is formed in a step between the formation of the wiring 55 and the formation of the second wiring, the depth of a contact plug for the second wiring can be smaller than the depth of a contact plug in a conventional semiconductor device in which a logic circuit and DRAM are mounted together.

EXAMPLE 2

Example 2 is a variant of the method of producing a semiconductor device of Example 1. In [Step-120] in Example 1, the approximately 30 nm thick first insulating material layer 18 composed of silicon nitride (SiN) is formed by a CVD method, and then, the second insulating material layer 19 composed of silicon oxide ($SiO_2$) is formed by a CVD method. In Example 2, the second insulating material layer 19 is formed by a high-density plasma CVD method (HDP-CVD method).

When the second insulating material layer 19 is formed by a CVD method by which a generally conformal, i.e., isotropic deposited state can be obtained, the space between the gate electrodes 14A constituting the adjacent second transistors may not be reliably filled with an insulating material layer in some cases. Otherwise, the second insulating material layer 19 being deposited in a narrower space between the gate electrodes tends to have a larger thickness than that being deposited in a wider space between the gate electrodes, so that it is sometimes difficult to flatten (planarize) the second insulating material layer 19.

In contrast, when the high-density plasma CVD method is employed, a sputter-etching rate of the second insulating material layer 19 in a horizontal direction is higher than a deposition rate in the horizontal direction. That is, the second insulating material layer 19 is not deposited in the horizontal direction but retrogresses, whereby the second insulating material layer 19 uniform in thickness can be reliably formed without being affected much by the narrowness or broadness in spaces between the gate electrodes. The method of generating plasma in the high-density plasma CVD method includes an ECR method, an ICP method and a helicon method. In the high-density plasma CVD method, preferably, a bias is applied to the semiconductor substrate 10.

Figure 17A:
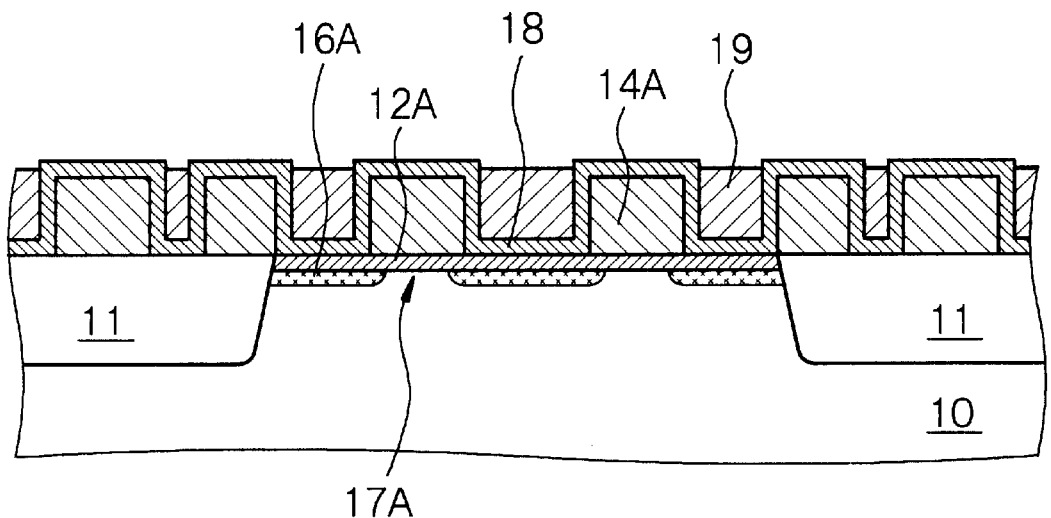
FIGS. 17A and 17B are schematic partial cross-sectional views of a semiconductor substrate, etc., for explaining the method of producing a semiconductor device in Example 3.
Figure 17B:
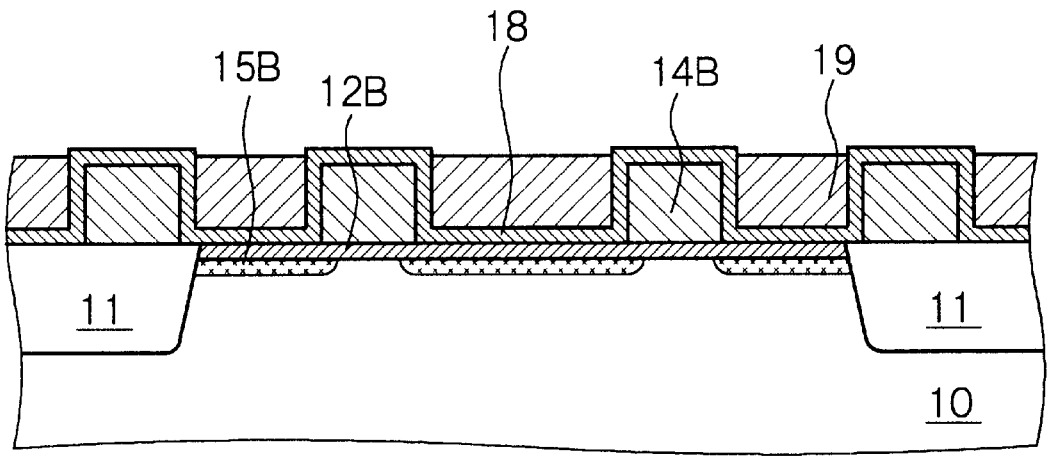

The thus-formed second insulating material layer 19 is flattened, for example, by a CMP method, and the first insulating material layer 18 on top surfaces of the gate electrodes 14A and 14B is exposed by isotropic etching using hydrofluoric acid. FIGS. 17A and 17B show the thus-obtained state. Since Example 2 can be the same as Example 1 in any other step than the above step, detailed explanations of such steps are omitted.

EXAMPLE 3

Example 3 is concerned with the semiconductor devices according to the first and second aspects of the present invention and the method of producing a semiconductor device according to the second and third aspects of the present invention.

Figure 28A:
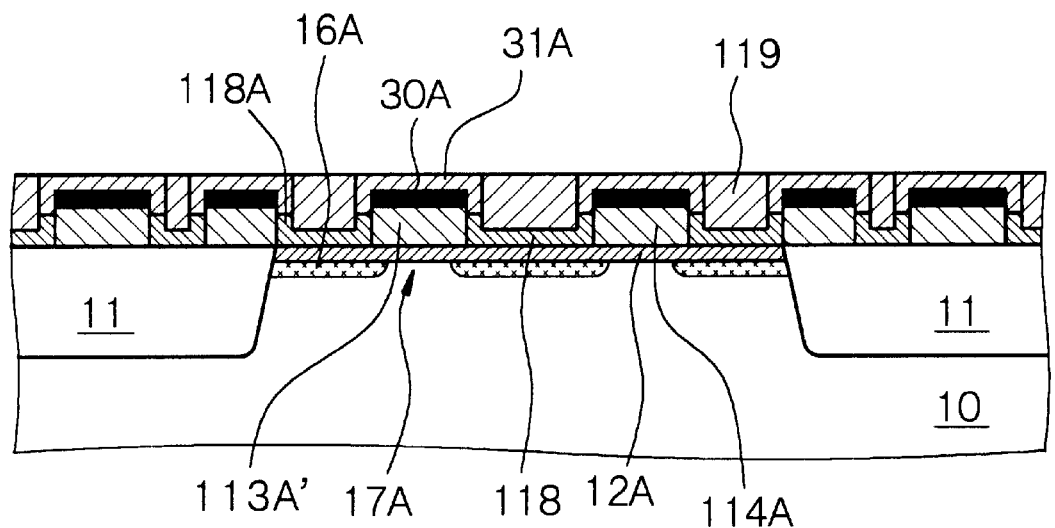
FIGS. 28A and 28B, following
Figure 28B:
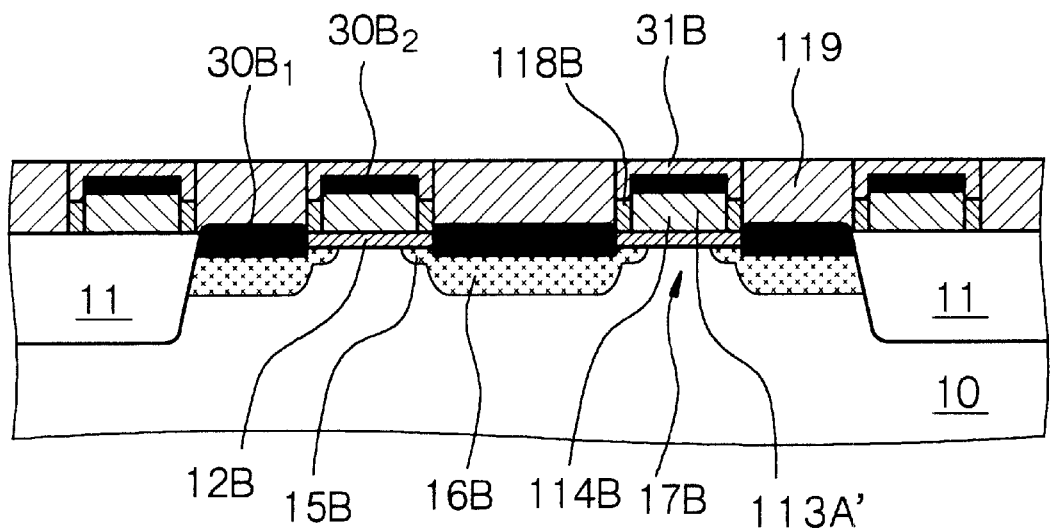

FIGS. 28A and 28B show schematic partial cross-sectional views of essential portions of the semiconductor device of Example 3. The semiconductor device comprises a plurality of first transistors formed in a first region (a region of a logic circuit) of a semiconductor substrate 10 and a plurality of second transistors formed in a second region (a region of a DRAM) of the semiconductor substrate 10. A logic circuit is constituted of the first transistors, and a dynamic random access memory is constituted of the second transistor.

As shown in FIG. 28B, the first transistor has a gate electrode 114B, a channel-forming region 17B and source/drain regions 16B. The gate electrode 114B constituting the first transistor is composed of a polysilicon layer 113A' containing an impurity and a silicide layer $30B_2$ formed thereon. A silicide layer $30B_1$ is formed in surface regions of the source/drain regions 16B constituting the first transistor. The second transistor has a gate electrode 114A, a channel-forming region 17A and source/drain regions 16A. The gate electrode 114A constituting the second transistor is composed of the polysilicon layer 113A' containing an impurity and a silicide layer 30A formed thereon. No silicide layer is formed in the source/drain regions 16A constituting the second transistor.

Otherwise, the first transistor has a gate electrode 114B composed of an electric conductive material and a first insulating material layer (corresponding to an insulating material layer) 118B which is composed of a first insulating material and covers at least part of the side walls of the gate electrode 114B (in Example 3, specifically, lower portions of the side walls of the polysilicon layer 113A' constituting the gate electrode 114B), and a (first) cap layer 31B which is composed of a second insulating material layer and covers the top surface of the gate electrode 114B and the top portions of the first insulating material layer 118B. The second transistor has a gate electrode 114A composed of an electrically conductive material, a first insulating material layer (corresponding to an insulating material layer) 118A which is composed of the first insulating material and covers at least part of the side walls of the gate electrode 114A (in Example 3, specifically, lower portions of the side walls of the polysilicon layer 113A' constituting the gate electrode 114A), and a (second) cap layer 31A which is composed of the second insulating material and covers the top surface of the gate electrode 114A and the top portions of the first insulating material layer 118A. Example 3 uses silicon oxide ($SiO_2$) as the first insulating material and silicon nitride (SiN) as the second insulating material. Each of the gate electrodes 114A and 114B is composed of the polysilicon layer 113A' containing an impurity and the silicide layer 30A or $30B_2$ formed thereon.

The method of producing a semiconductor device of Example 3 will be explained with reference to FIGS. 18A to 31 showing schematic partial cross-sectional views of a semiconductor substrate, etc., and FIGS. 32A to 34B showing essential portions, hereinafter. In FIGS. 18A to 29B, Figures indicated by Figure Numbers with "A" are concerned with the region of DRAM, and Figures indicated by Figure Numbers with "B" are concerned with the region of the logic circuit. FIGS. 32A to 34B show schematic partial cross-sectional views of the region of DRAM, part of the logic circuit and part of contact region of gate electrodes.

[Step-300]

First, a device-isolation region 11 and various wells are formed in predetermined regions of the semiconductor substrate 10 composed of a p-type silicon semiconductor substrate in the same manner as in [Step-100] of Example 1. Then, gate insulating layer 12A and 12B are formed on the surface of the semiconductor substrate 10. The thickness of the gate insulating layer 12B in a region where the logic circuit is to be formed may be the same as, or smaller than, the thickness of the gate insulating layer 12A in a region where DRAM is to be formed.

[Step-310]

Figure 18A:
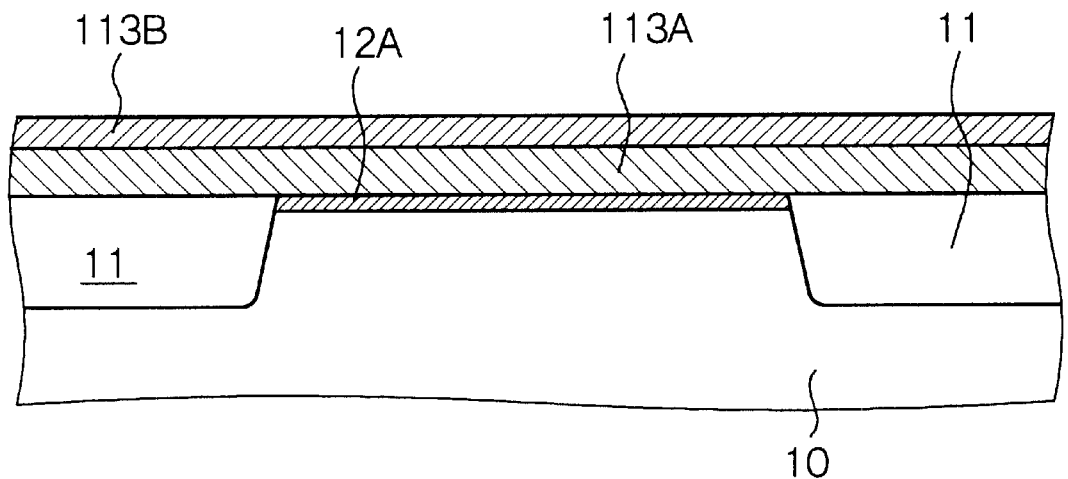
FIGS. 18A and 18B are schematic partial cross-sectional views of the semiconductor substrate, etc., for explaining the method of producing the semiconductor device in Example 3.
Figure 18B:
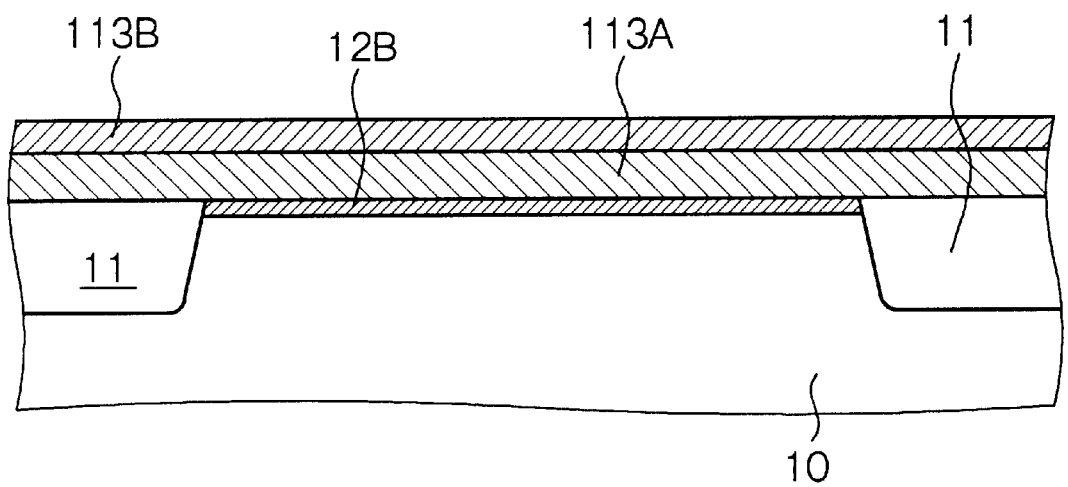

Then, an approximately 0.15 μm thick polysilicon layer 113A containing no impurity is formed on the entire surface by a CVD method, and further, an approximately 0.1 μm thick offset layer 113B composed of SiN is formed thereon (see FIGS. 18A and 18B).

Then, the offset layer 113B and the polysilicon layer 113A are patterned by a lithographic method and a dry-etching method, to form the gate electrode 114B constituting the first transistor and the gate electrode 114A constituting the second transistor, whereby the gate electrodes 114A and 114B having a two-layered structure of the polysilicon layer 113A and the offset layer 113B can be formed. After the formation of the gate electrodes 114A and 114B, the side walls of the polysilicon layer 113A constituting the gate electrodes 114A and 114B may be oxidized to form a silicon oxide film on the side walls of the gate electrodes 114A and 114B.

Since the polysilicon layer 113A to be etched contains no impurity, there can be overcome the problems caused by a difference between an etching rate of a polysilicon layer containing an n-type impurity and an etching rate of a polysilicon layer containing a p-type impurity, explained in the above [④ Offset layer].

[Step-320]

Figure 19A:
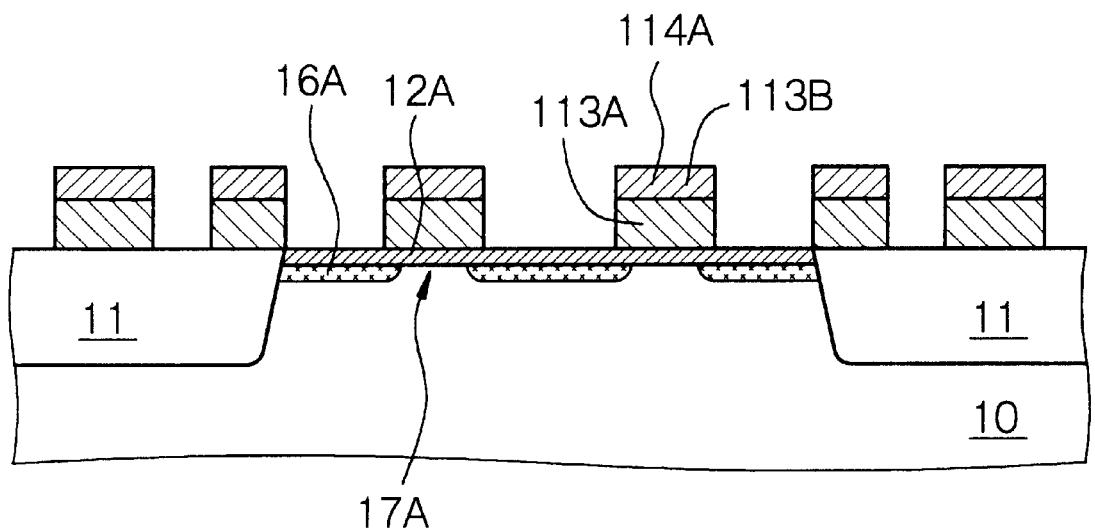
FIGS. 19A and 19B, following
Figure 19B:
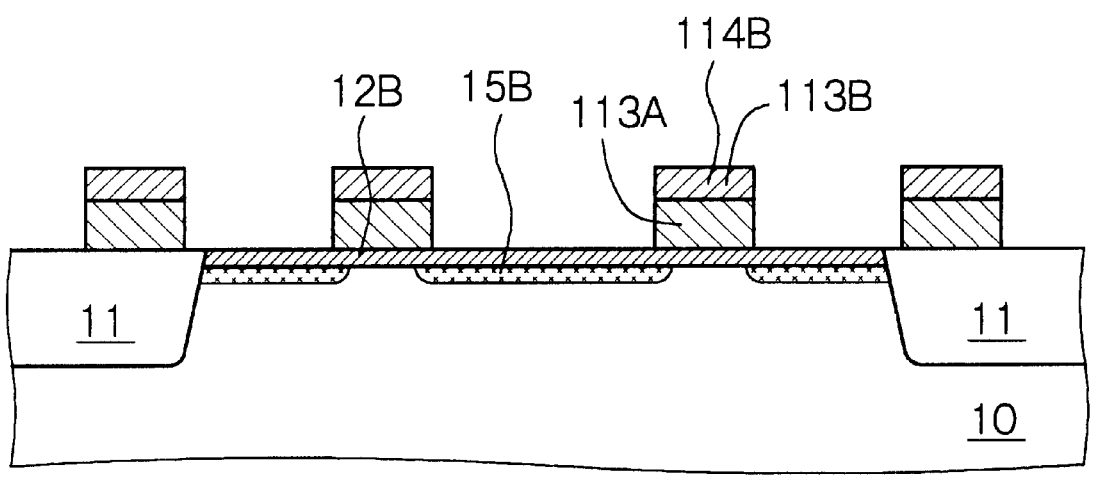
Figure 20A:
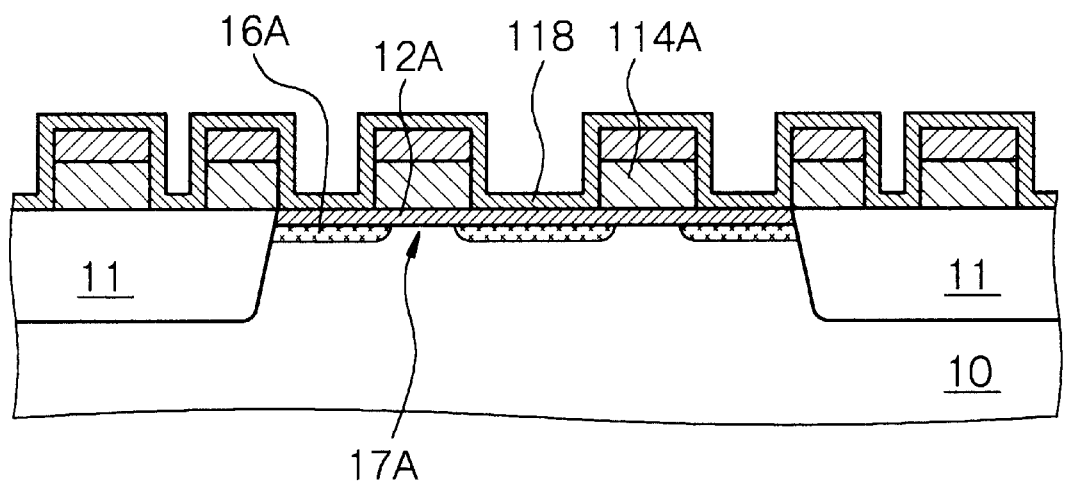
FIGS. 20A and 20B, following
Figure 20B:
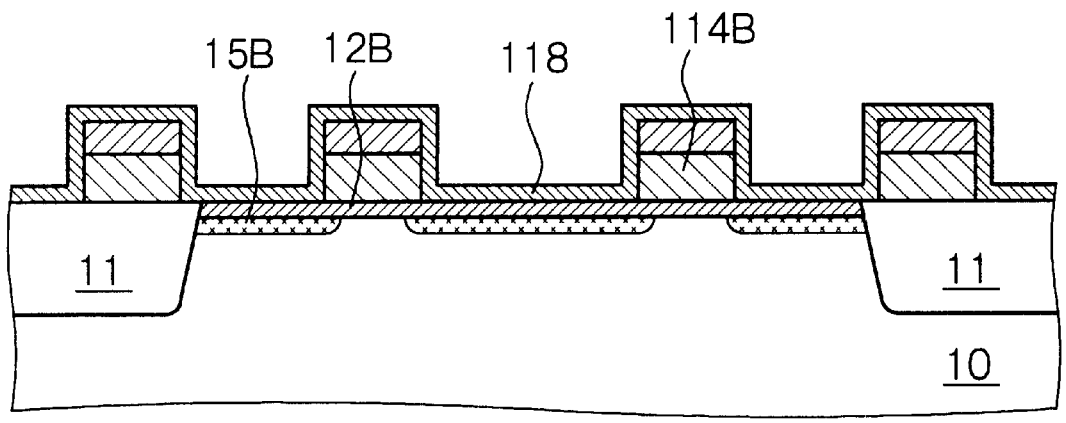
Figure 21A:
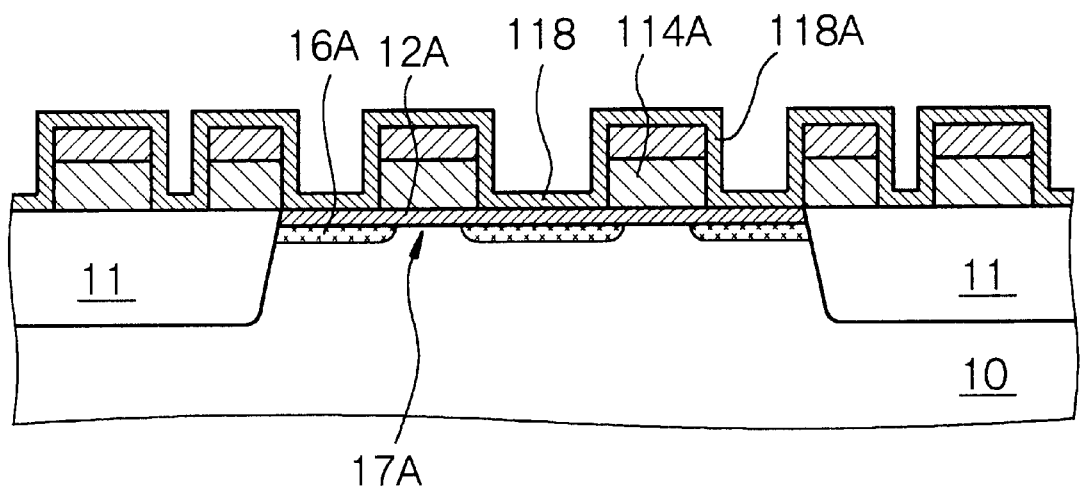
FIGS. 21A and 21B, following
Figure 21B:
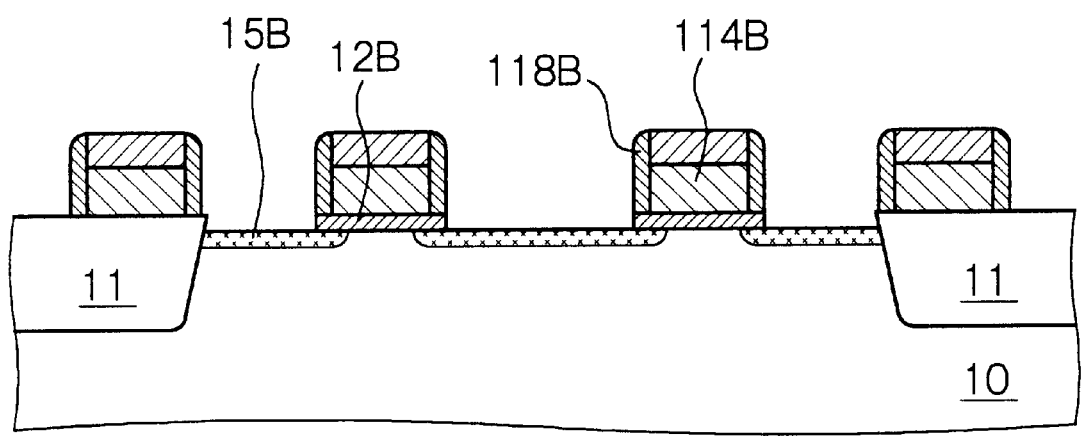
Figure 22A:
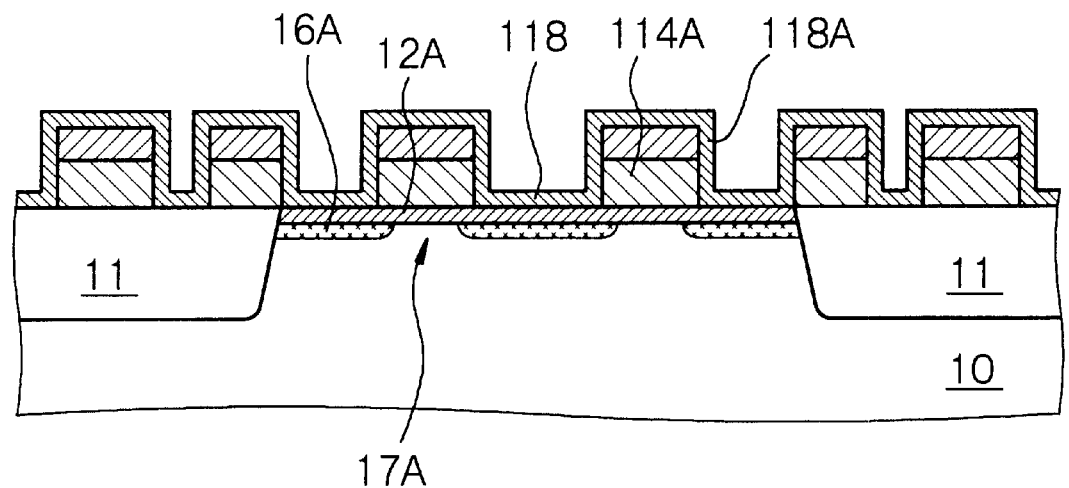
FIGS. 22A and 22B, following
Figure 22B:
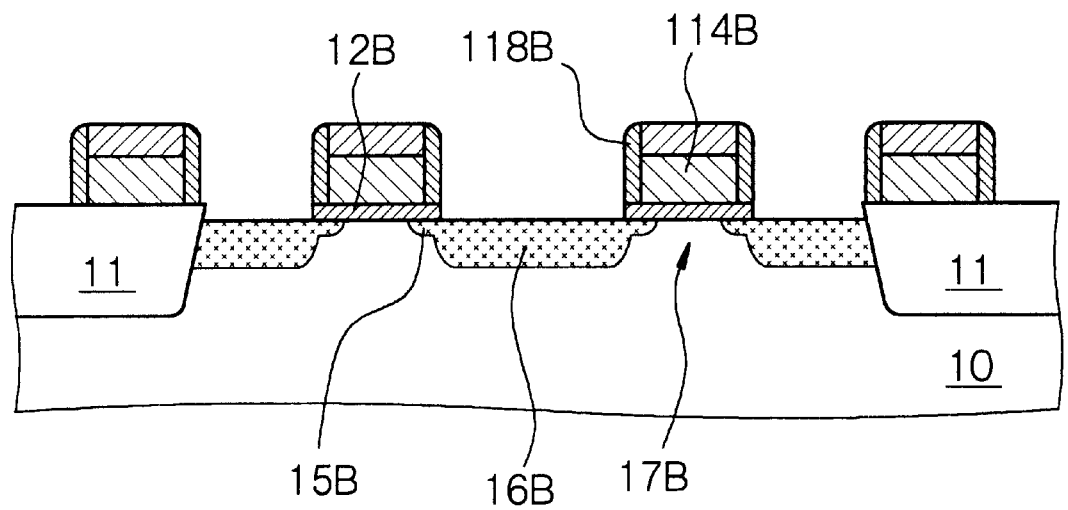

Then, source/drain regions 16A constituting the second transistor are formed in the semiconductor substrate 10 in the same manner as in [Step-120] of Example 1. A channel-forming region 17A is formed between a pair of the source/drain regions 16A constituting the second transistor. At the same time, a region having a low impurity content for forming an LDD structure or an extension region 15B is also formed in a region of the semiconductor substrate 10 in which region the n-channel type first transistor constituting the logic circuit is to be formed. FIGS. 19A and 19B show structures obtained as explained above. Then, a region having a low impurity content for forming an LDD structure or an extension region 15B is formed in a region of the semiconductor substrate 10 in which region the p-channel type first transistor constituting the logic circuit is to be formed. For preventing enhanced diffusion, it is preferred to carry out heat treatment after completion of ion implantation.

[Step-330]

Then, the source/drain regions 16A constituting the second transistor are covered with a first insulating material layer 118, and there is exposed the region of the semiconductor substrate 10 in which region the source/drain regions 16B constituting the first transistor are to be formed. Specifically, an approximately 50 nm thick first insulating material layer 118 composed of silicon oxide (SiO$_2$) is formed on the entire surface by a CVD method (see FIGS. 20A and 20B). Then, the region of the semiconductor substrate 10 in which region DRAM is to be formed is covered with a mask layer, and the first insulating material 118 on the region of the semiconductor substrate 10 in which region the logic circuit is to be formed is etched back, for example, with a parallel plate type etching apparatus using an etching gas such as CF$_4$ or CHF$_3$, and then the mask layer is removed (see FIGS. 21A and 21B). In this manner, the source/drain regions 16A constituting the second transistor are covered with the first insulating material layer 118, the side walls of the gate electrode 114B constituting the first transistor are covered with the first insulating material layer 118B, and there is exposed the region of the semiconductor substrate 10 in which region the source/drain regions 16B constituting the first transistor are to be formed (see FIGS. 21A and 21B). The side walls of the gate electrodes 114B and 114A constituting the first and second transistors are covered with the first insulating material layer 118B and 118A composed of the first insulating material. Further, the side walls of the gate electrodes in the connection region of the gate electrode are covered with the first insulating material layer 118C.

[Step-340]

Then, the source/drain regions 16B are formed in the region of the semiconductor substrate 10 in which region the source/drain regions constituting the first transistor are to be formed. Specifically, the region of the semiconductor substrate 10 in which region the p-channel type first transistor constituting the logic circuit is to be formed and the region of the semiconductor substrate 10 in which region the n-channel type second transistor constituting DRAM is to be formed are masked with a mask layer composed of a resist material, an exposed region of the semiconductor substrate 10 is ion-implanted with an n-type impurity, and then, the mask layer is removed. In this manner, the source/drain regions 16B can be formed in the region of the semiconductor substrate 10 in which region the n-channel type first transistor constituting the logic circuit is to be formed.

Then, the region of the semiconductor substrate 10 in which region the n-channel type first transistor constituting the logic circuit is to be formed and the region of the semiconductor substrate 10 in which region the n-channel type second transistor constituting DRAM is to be formed are masked with a mask layer composed of a resist material, an exposed region of the semiconductor substrate 10 is ion-implanted with a p-type impurity, and then, the mask layer is removed. In this manner, the source/drain regions 16B can be formed in the region of the semiconductor substrate 10 in which region the p-channel type first transistor constituting the logic circuit is to be formed.

After the ion-implantation, heat treatment is carried out by an RTP method for activating the introduced impurities.

[Step-350]

Figure 23A:
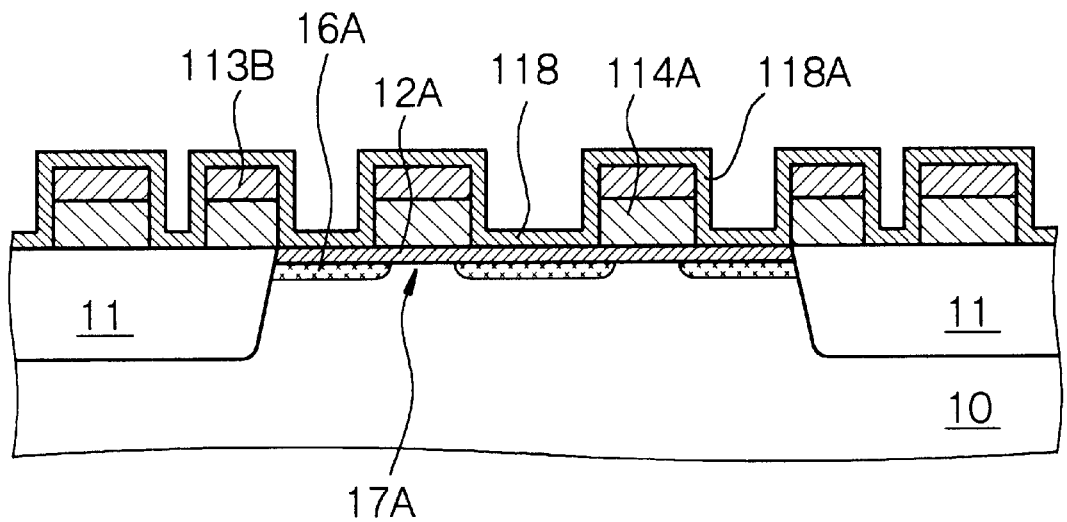
FIGS. 23A and 23B, following
Figure 23B:
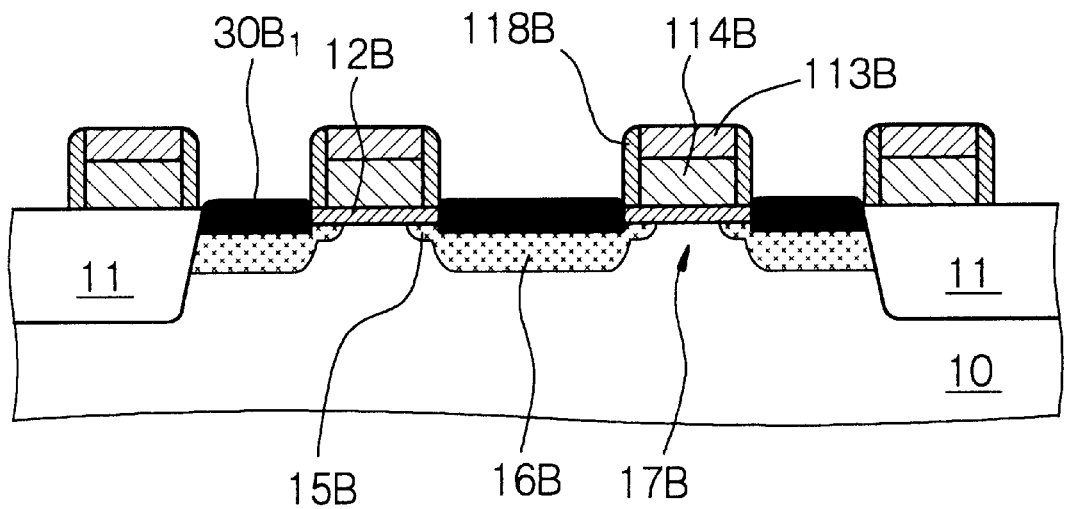
Figure 32A:
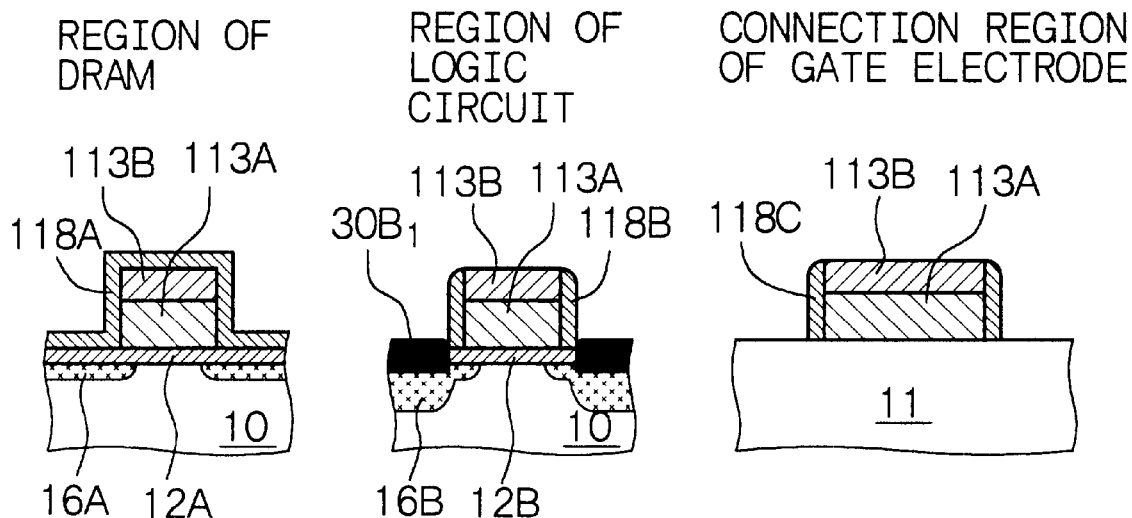
FIGS. 32A and 32B are schematic partial cross-sectional views of essential elements such as the semiconductor substrate, etc., for explaining the method of producing the semiconductor device in Example 3.

Then, a silicide layer 30B$_1$ is formed in the source/drain regions 16B constituting the first transistor (see FIG. 23A and FIG. 32A). Specifically, for example, a metal layer composed of cobalt (Co) is formed on the entire surface by a sputtering method, and heat treatment is carried out according to an RTA method in an atmosphere of 100% N$_2$ or N$_2$/Ar (atmospheric pressure) at 550° C. for 30 seconds, whereby Co atoms and Si atoms constituting the semiconductor substrate 10 react to form the cobalt silicide layer. The metal layer on the first insulating material layers 118, 118A, 118B and 118C, the device-isolation region 11 and the offset layer 113B undergoes no reaction and remains intact. Then, the unreacted metal layer is removed with a mixture solution containing sulfuric acid, a hydrogen peroxide aqueous solution and pure water, and heat treatment is again carried out according to an RTA method in an atmosphere of 100% N$_2$ or N$_2$/Ar (atmospheric pressure) at 700° C. for 30 seconds, whereby the resistance of the cobalt silicide layer can be decreased.

Since the source/drain regions 16A constituting the second transistor are covered with the first insulating material layer 118, no silicide layer is formed in these source/drain regions 16A.

[Step-360]

Figure 24A:
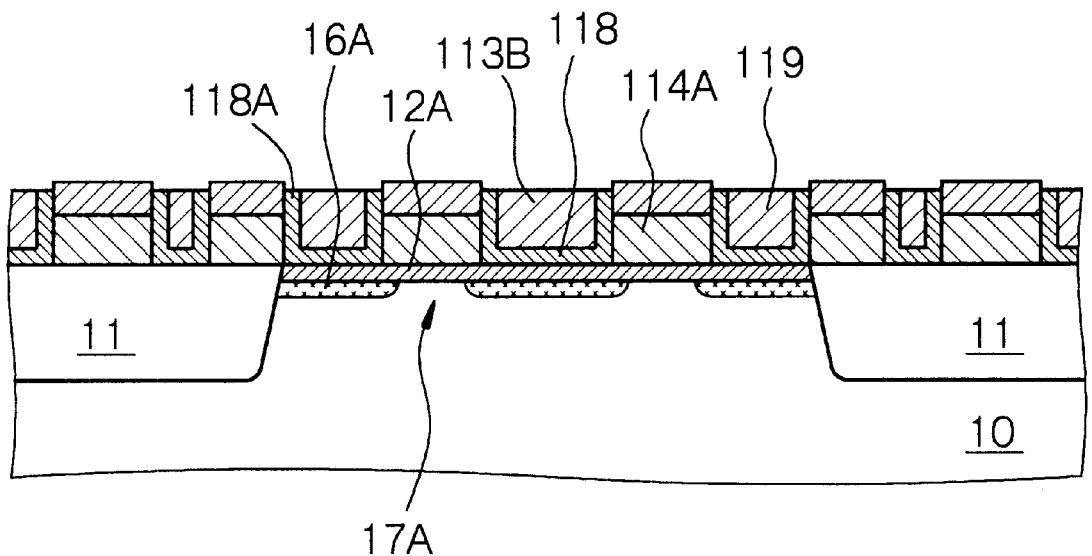
FIGS. 24A and 24B, following
Figure 24B:
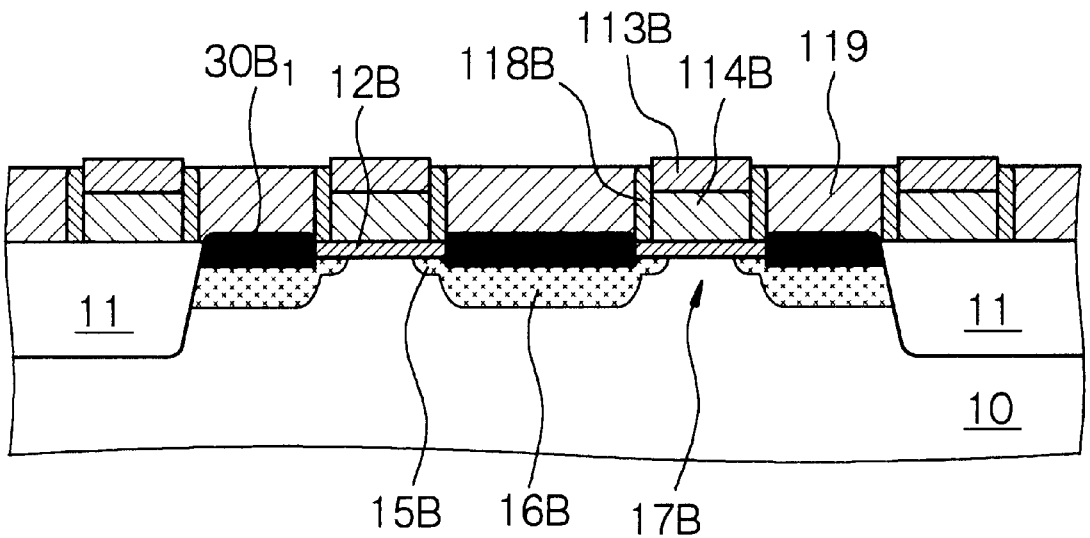
Figure 32B:
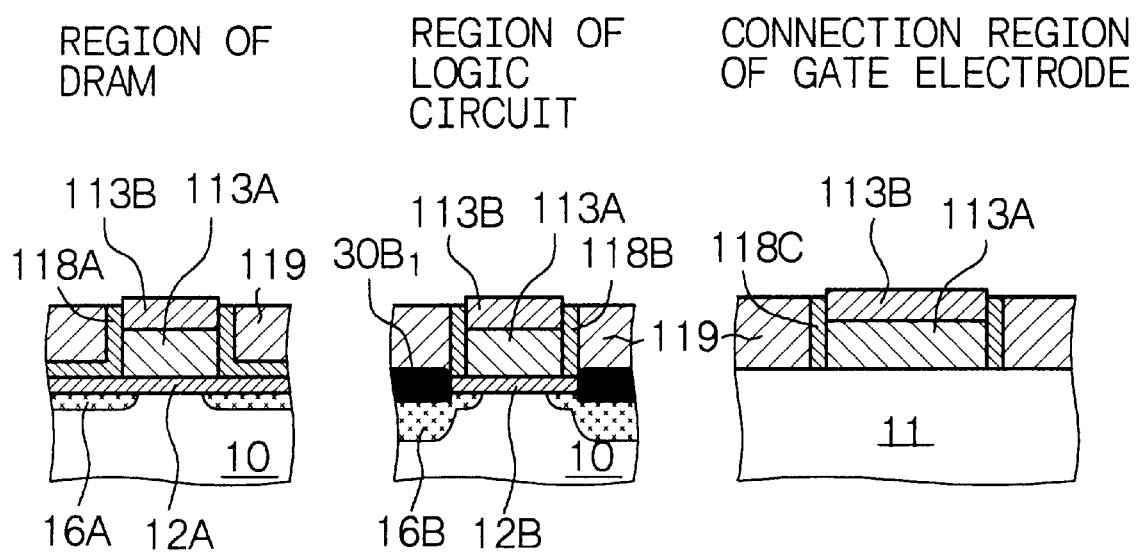

Then, the space between the gate electrodes 114B constituting the adjacent first transistors is filled with a second insulating material layer 119, the space between the gate electrodes 114A constituting the second adjacent transistors is filled with the second insulating material layer 119, and there are exposed the top surface of the gate electrode 114B constituting the first transistor and the top surface of the gate electrode 114A constituting the second transistor (see FIGS. 24A and 24B and FIG. 32B).

Specifically, the second insulating material layer 119 composed of silicon oxide ($SiO_2$) is formed on the entire surface by a high-density plasma CVD method. The second insulating material layer 119 is formed so as to have a thickness for reliably filling the spaces between the gate electrodes 114B constituting the first adjacent transistors and between the gate electrodes 114A constituting the adjacent second transistors. For example, the second insulating material layer 119 has a thickness of 0.3 µm. Then, the second insulating material layer 119 is flattened by a CMP method or the like, the spaces between the adjacent gate electrodes 114A and between the adjacent gate electrodes 114B are filled with the second insulating material layer 119, and the top surface of the offset layer 113B is exposed.

Then, the offset layer 113B is isotropically etched with hot phosphoric acid, to remove the offset layer 113B.

Figure 25A:
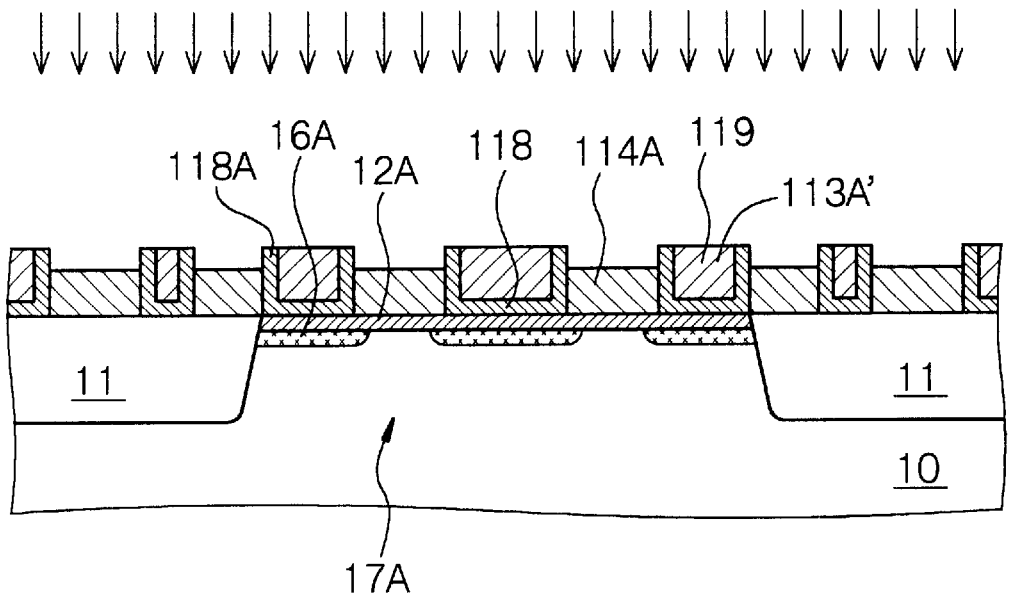
FIGS. 25A and 25B, following
Figure 25B:
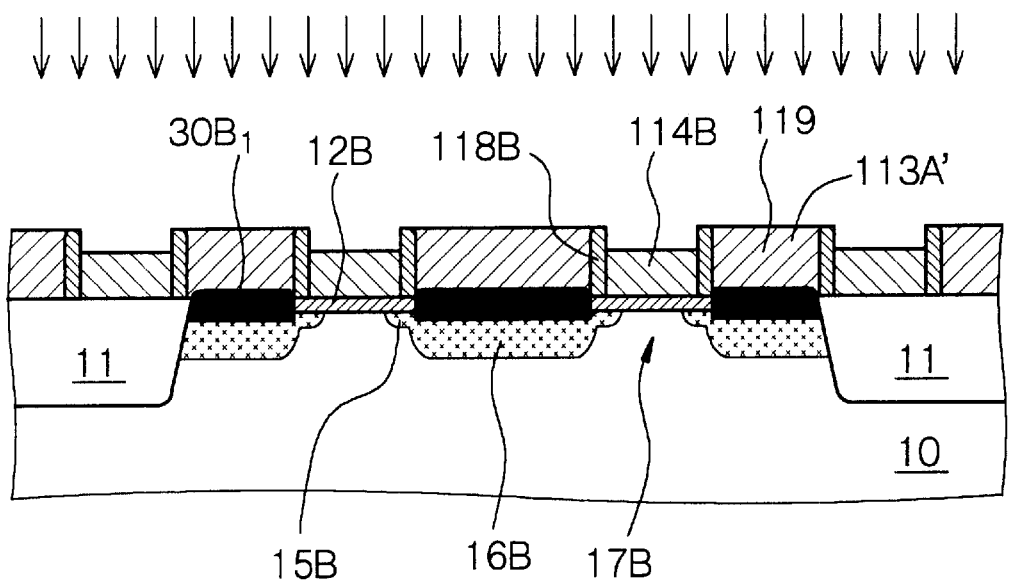
Figure 33A:
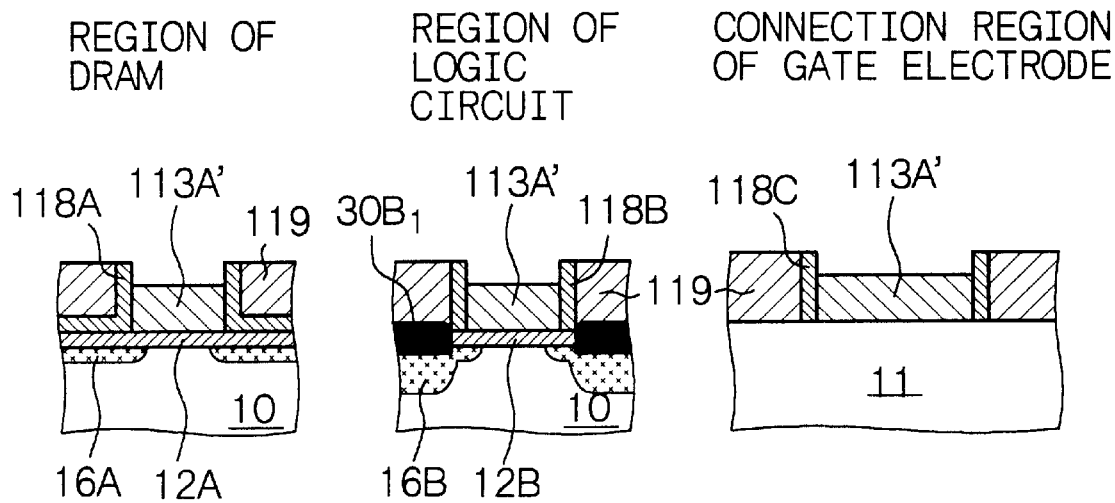
FIGS. 33A and 33B, following

Then, the region of the semiconductor substrate 10 in which region the p-channel type first transistor constituting the logic circuit is to be formed is masked with a mask layer composed of a resist material, an exposed region of the semiconductor substrate 10 is ion-implanted with an n-type impurity, and then, the mask layer is removed. In this manner, the n-type impurity is introduced into the gate electrode 114B constituting the n-channel type first transistor of the logic circuit and the gate electrode 114A constituting the n-channel type second transistor of DRAM. Reference numeral 113A' in Figure shows a polysilicon layer into which the impurity is introduced. FIGS. 25A and 25B and FIG. 33A show the thus-obtained structure.

Then, the region of the semiconductor substrate 10 in which region the n-channel type first transistor constituting the logic circuit is to be formed and the region of the semiconductor substrate 10 in which region the n-channel type second transistors constituting DRAM is to be formed are masked with a mask layer composed of a resist material, an exposed region of the semiconductor substrate 10 is ion-implanted with a p-type impurity, and then, the mask layer is removed. In this manner, the p-type impurity is introduced into the gate electrode 114B constituting the p-channel type first transistor of the logic circuit.

After the ion-implantation, heat treatment is carried out by an RTP method for activating the introduced impurities.

Figure 26A:
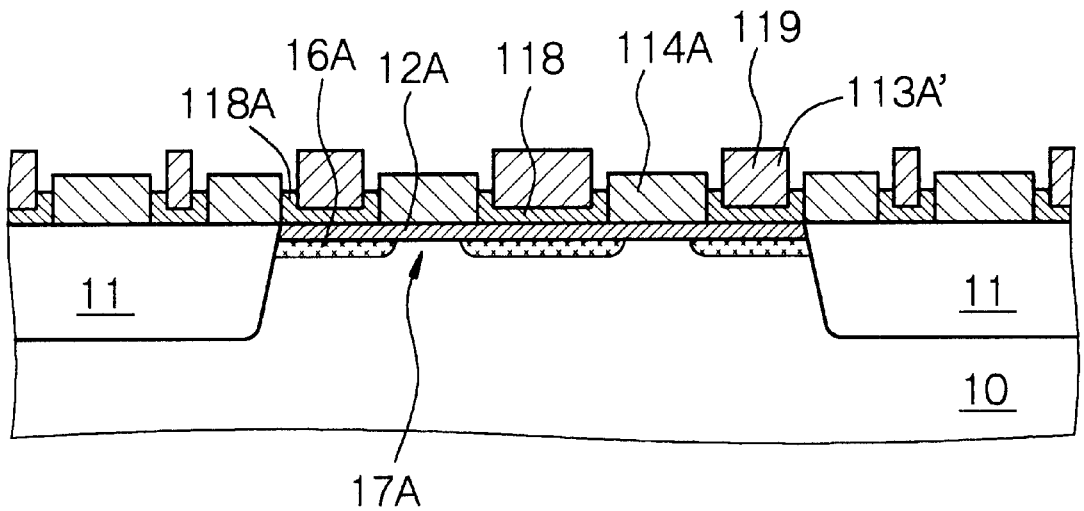
FIGS. 26A and 26B, following
Figure 26B:
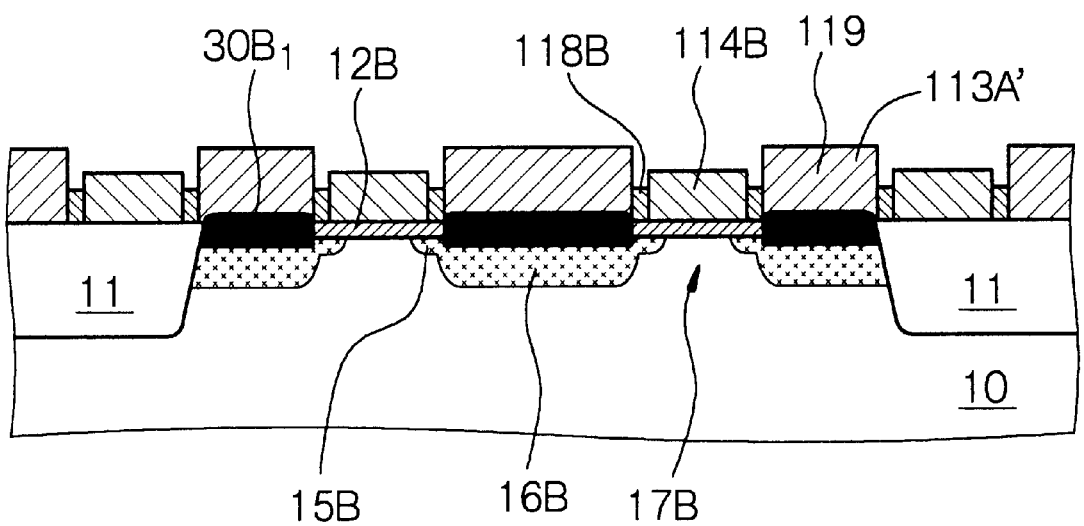
Figure 33B:
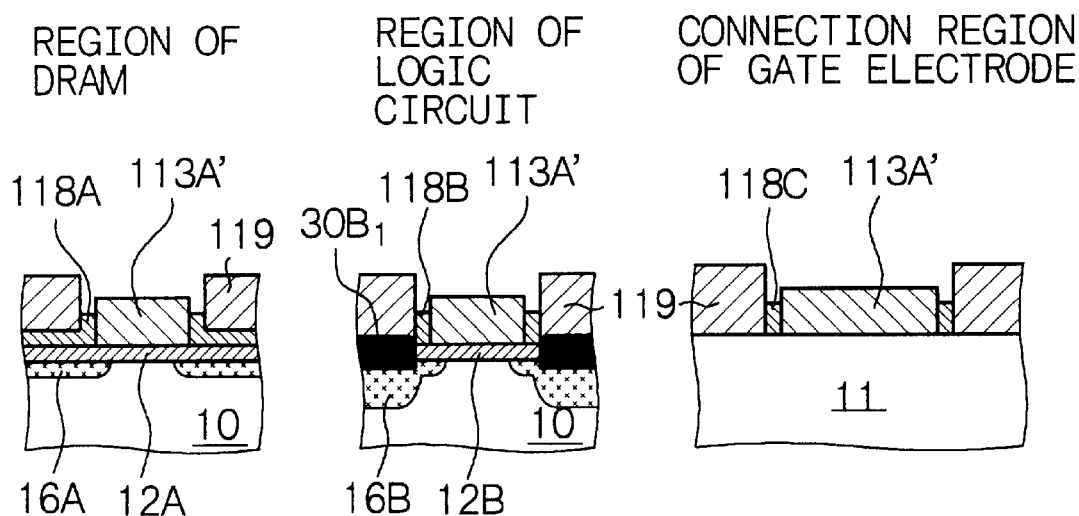

Then, the upper portions of the first insulating material layer 118 are removed by isotropic etching (see FIGS. 26A and 26B and FIG. 33B). That is, the upper portions of the first insulating material layer 118B on the side walls of the gate electrode 114B constituting the first transistor and the upper portions of the first insulating material layer 118A on the side walls of the gate electrode 114A constituting the second transistor are removed. In this case, upper portions of the first insulating material layer 118C on the side walls of the gate electrode in the connection region of the gate electrode are removed as well.

Implanting ion into the gate electrodes and removing the upper portions of the first insulating material layer 118 may be reversed in order. That is, there may be employed the procedure of removing the offset layer, then, removing the upper portions of the first insulating material layer 118B on the side walls of the gate electrode 114B constituting the first transistor and the upper portions of the first insulating material layer 118A on the side walls of the gate electrode 114A constituting the second transistor, and then, implanting ion into the exposed polysilicon layer 113A' constituting the gate electrodes 114A and 114B. Otherwise, there may be employed the procedure of removing the upper portions of the first insulating material layer 118B on the side walls of the gate electrode 114B constituting the first transistor and the upper portions of the first insulating material layer 118A on the side walls of the gate electrode 114A constituting the second transistor, then, removing the offset layer, and then, implanting ion into the exposed polysilicon layer 113A' constituting the gate electrodes 114A and 114B.

Figure 27A:
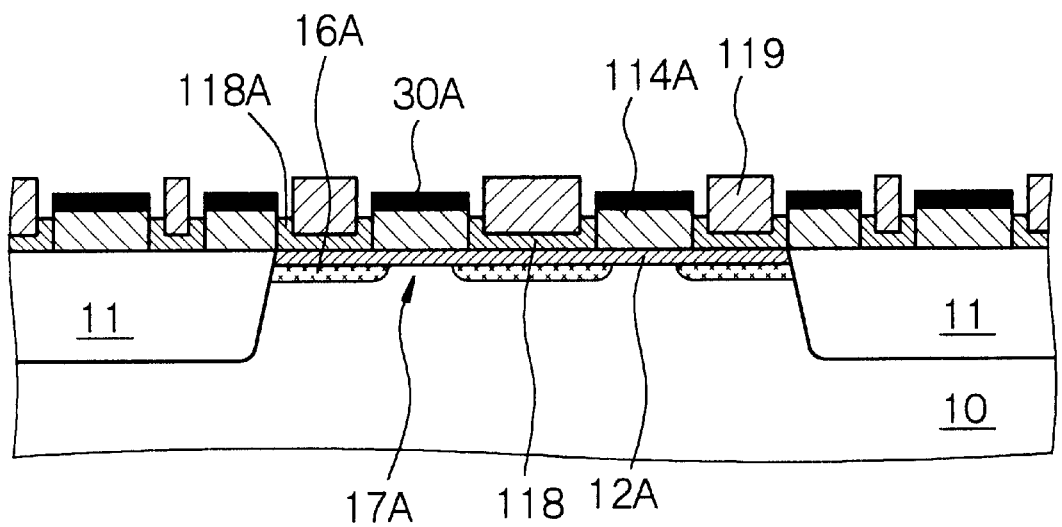
FIGS. 27A and 27B, following
Figure 27B:
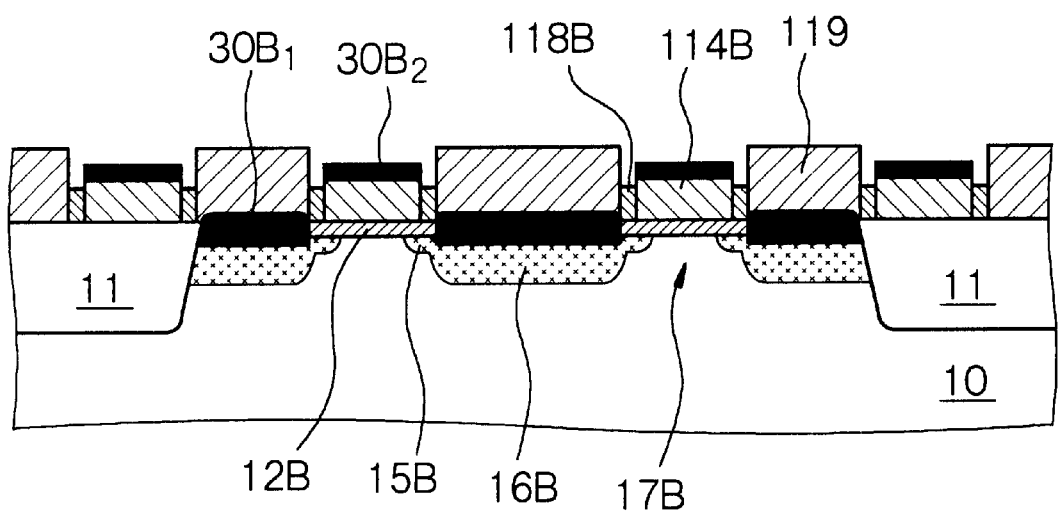
Figure 34A:
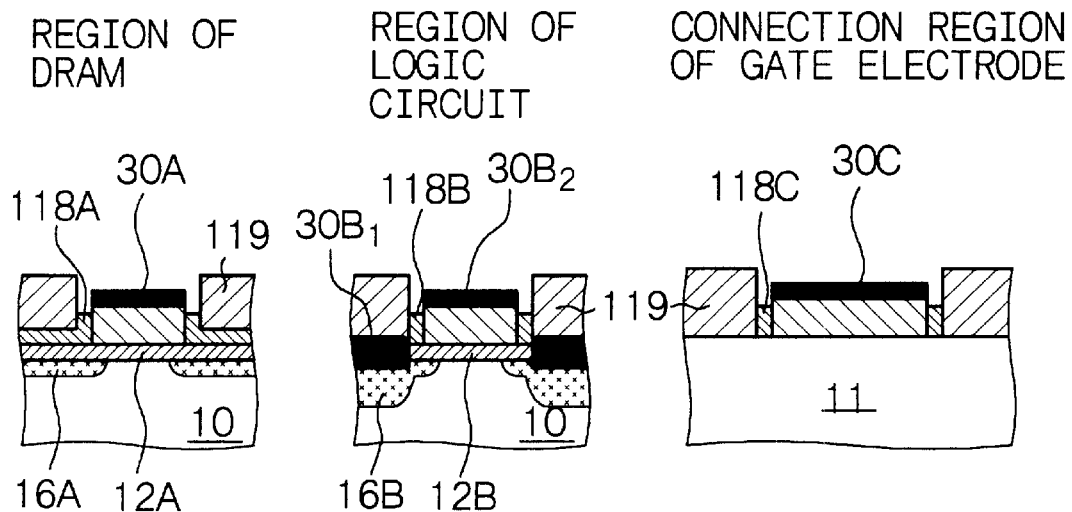
FIGS. 34A and 34B, following

Then, the silicide layers 30A and $30B_2$ are formed on the top surface of the gate electrode 114B constituting the first transistor (i.e., the top surface of the polysilicon layer 113A') and on the top surface of the gate electrode 114A constituting the second transistor (i.e., top surface of the polysilicon layer 113A') (see FIGS. 27A and 27B and FIG. 34A). Specifically, the procedures explained in [Step-150] of Example 1 can be carried out. No metal layer is deposited on the exposed side walls of the gate electrodes 114A and 114B by the sputtering method, so that no silicide layer is formed on the exposed side walls of the gate electrodes 114A and 114B. In this case, a silicide layer 30C is formed on top surface of the gate electrode in the connection region of the gate electrode (i.e., top surface of the polysilicon layer 113A').

Then, for example, a silicon nitride layer is deposited on the entire surface by a plasma CVD method or an LP-CVD method, and the silicon nitride layer is etched back to form a first cap layer 31B on the silicide layer $30B_2$ formed on the gate electrode 114B constituting the first transistor and on top portions of the first insulating material layer 118B on the side walls of the gate electrode 114B constituting the first transistor. At the same time, a second cap layer 31A is formed on the silicide layer 30A formed on the gate electrode 114A constituting the second transistor and on the top portions of the first insulating material layer 118A on the side walls of the gate electrode 114A constituting the second transistor (see FIGS. 28A and 28B and FIG. 34B).

Figure 34B:
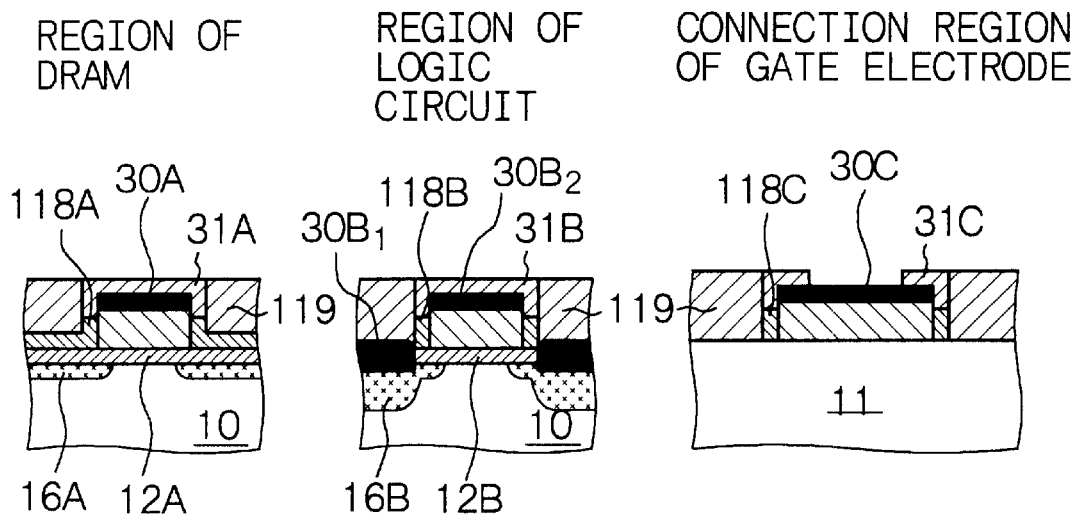
Figure 35A:
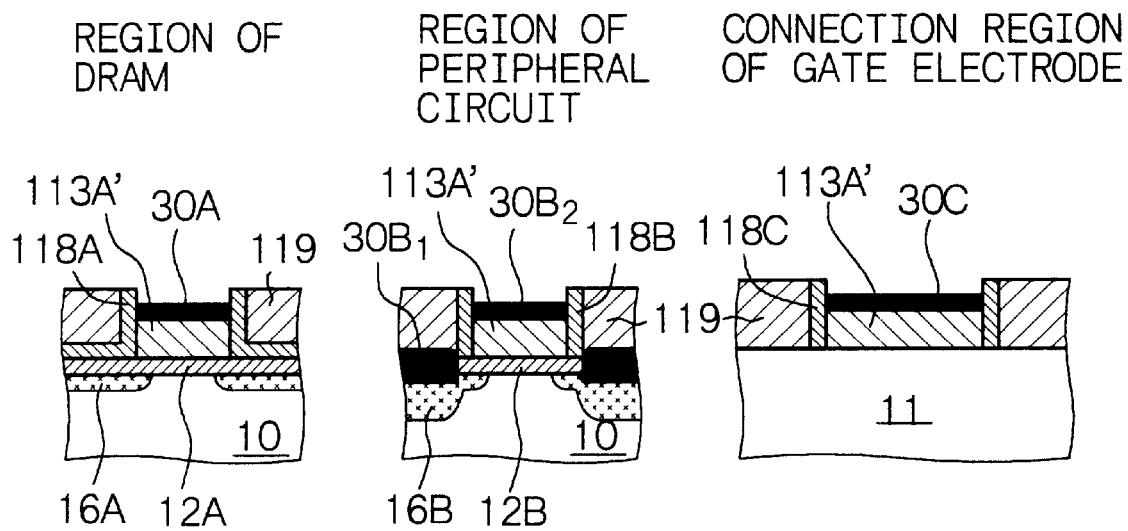
FIGS. 35A and 35B are schematic partial cross-sectional views of essential elements such as a semiconductor substrate, etc., for explaining a variant of the method of producing the semiconductor device in Example 3.
Figure 35B:
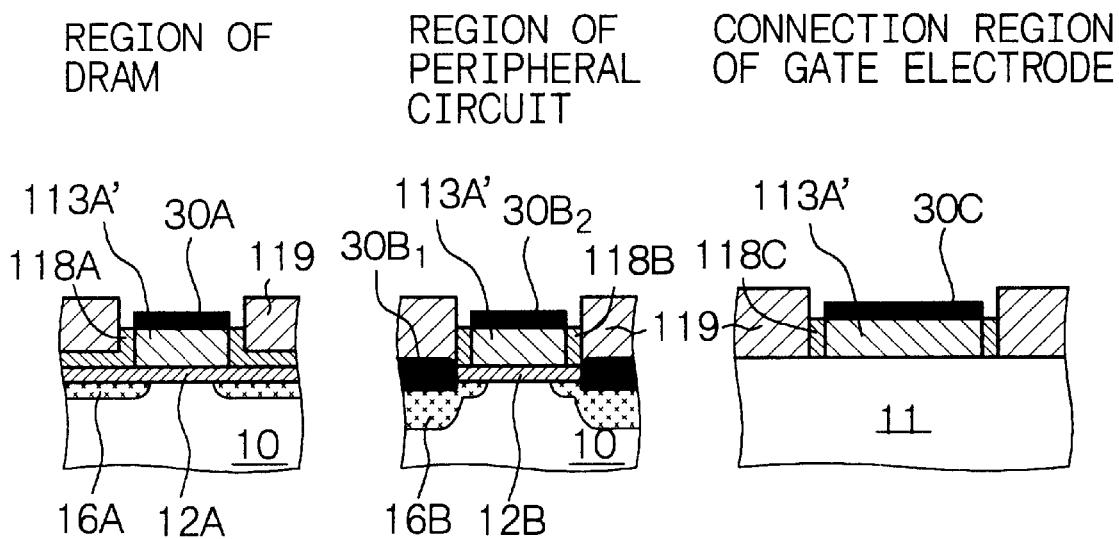
Figure 36:
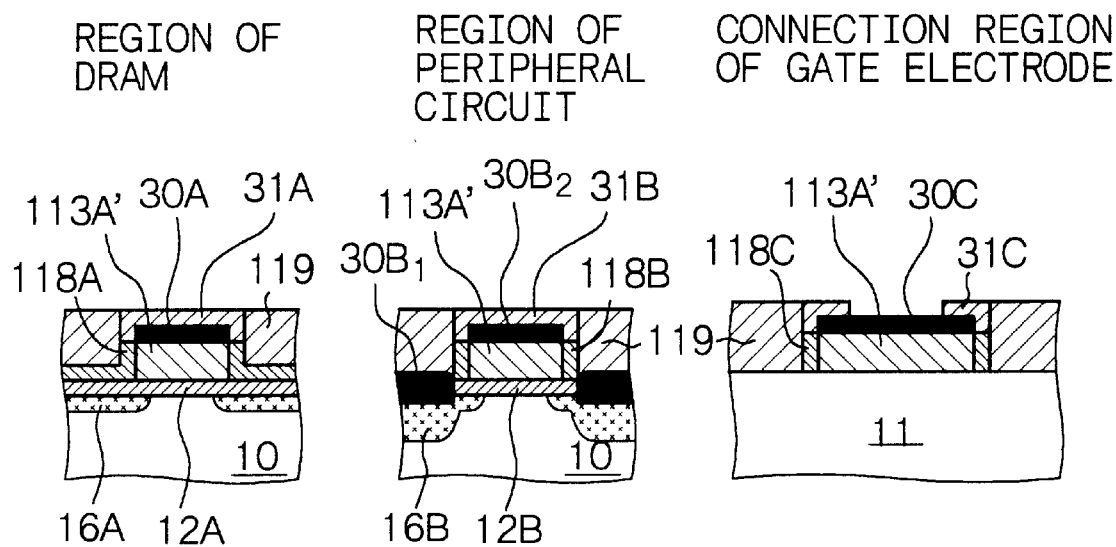
FIG. 36, following

In the gate electrode, an extending portion thereof or a word line, for example, when a cap layer 31C is formed after the procedures of removing the offset layer 113B, implanting ion, removing the upper portions of the first insulating material layer 118C and forming the silicide layer 30C on the polysilicon layer 113A', and if the gate electrode, the extending portion thereof or the word line is broad, there is formed a state where only part of the silicide layer 30C is covered with the cap layer 31C and the other part of the silicide layer 30C is exposed (see FIG. 34B). Therefore, a contact plug can be formed for the gate electrode, the extending portion thereof or the word line without using a lithographic method and an etching method.

[Step-370]

Figure 29A:
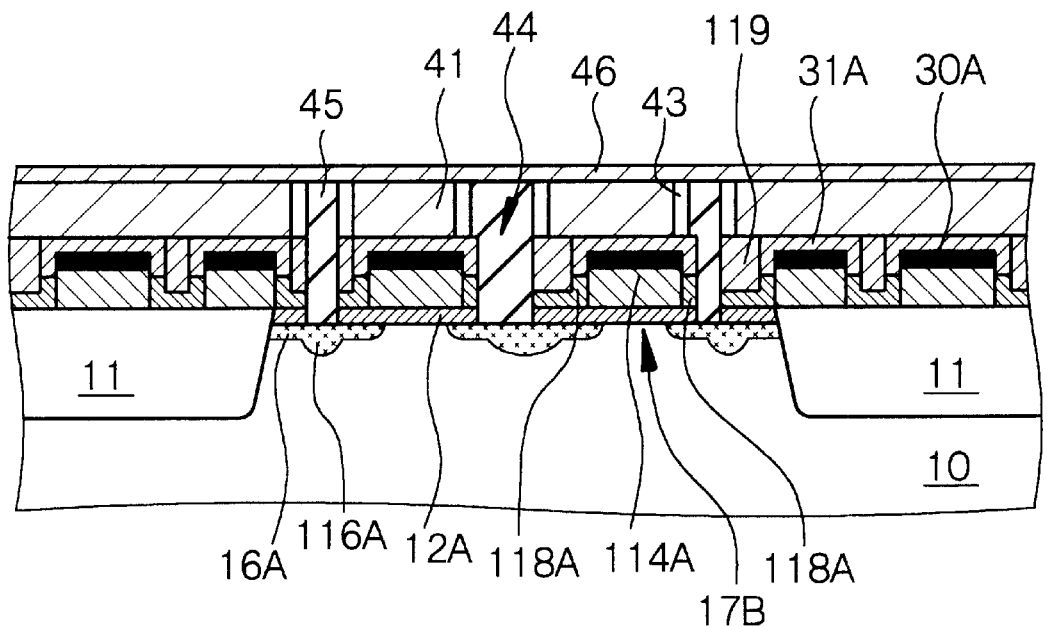
FIGS. 29A and 29B, following
Figure 29B:
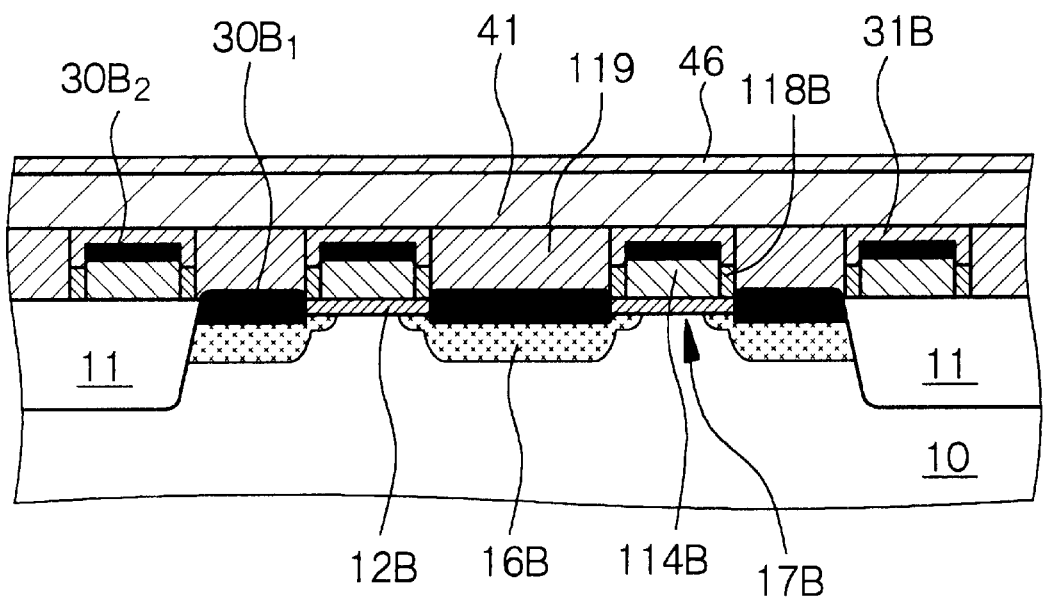
Figure 30:
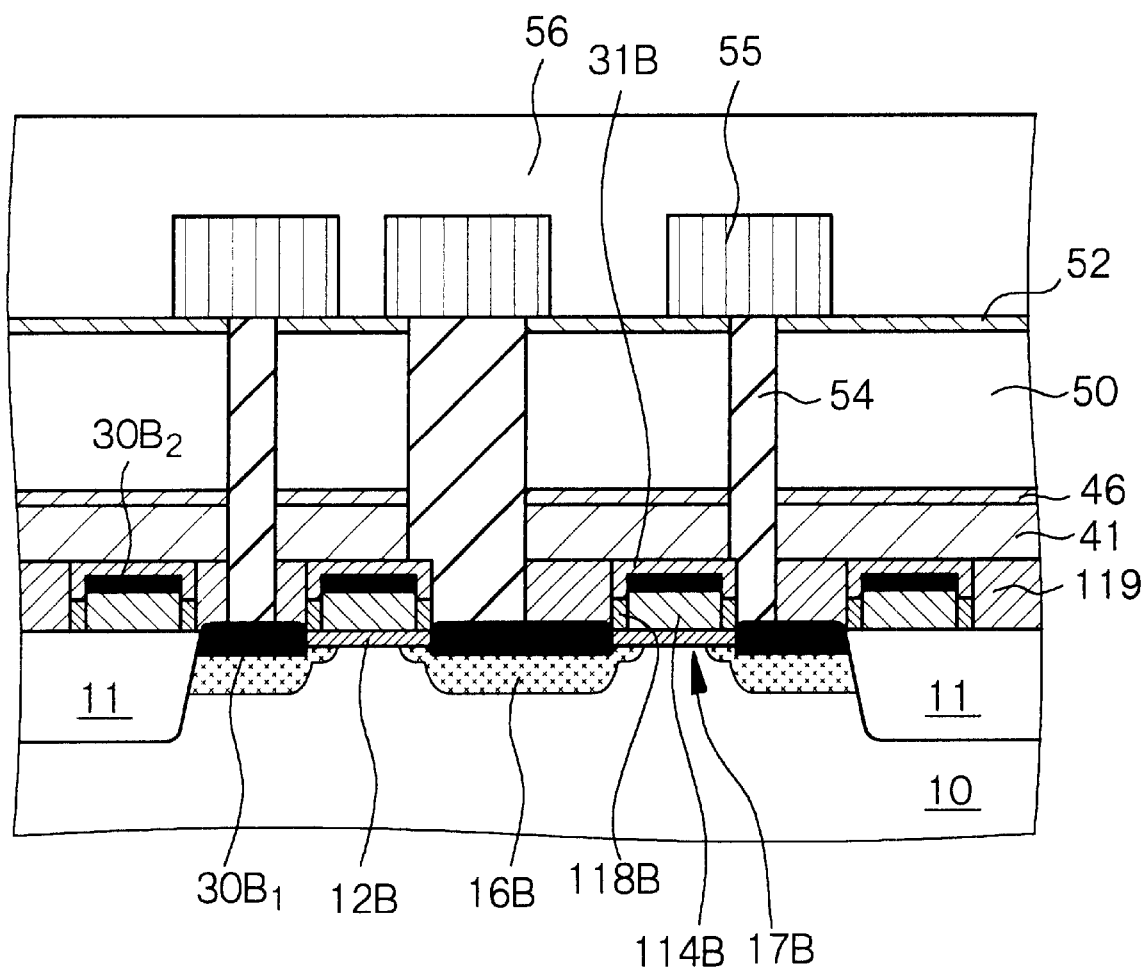
FIG. 30, following
Figure 31:
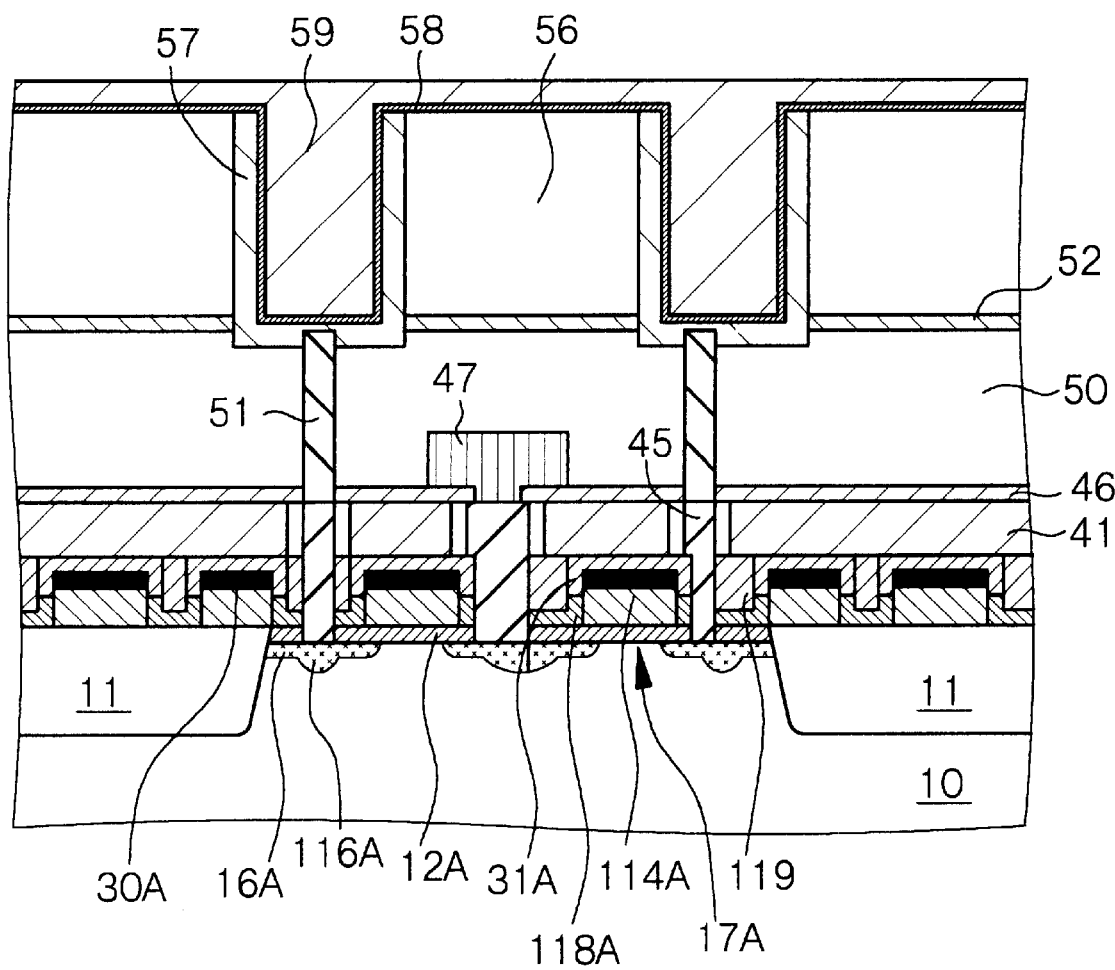
FIG. 31, following

Then, the contact plugs 45 (the contact plug for a bit line and the contact plug for a node) are completed by repeating procedures described after the formation of the insulating interlayer 41 composed of silicon oxide ($SiO_2$) in [Step-160] of Example 1 (see FIGS. 29A and 29B). Further, [Step-170] and [Step-180] of Example 1 are repeated, whereby the structures shown in FIGS. 30 and 31 can be obtained. Incidentally, the first insulating interlayer 41 is formed on the entire surface, the opening portions 44 are formed, which opening portions 44 penetrate through the first insulating interlayer 41, the second insulating material layer 119 and the first insulating material layer 118 and reach the source/drain region 16B, and then, the opening portions are filled with an electrically conductive material, thereby to form the contact plugs 45. In this case, when the opening portions 44 are formed by selectively etching the first insulating interlayer 41, the second insulating material layer 119 and the first insulating material layer 118, the first insulating material layer 118A below the cap layer 31A is protected with the cap layer 31A and is therefore not etched in any case. Further, the opening portion which reaches the source/drain region 16A is formed, and then, the opening portion is filled with an electrically conductive material, thereby to form the contact plug 54. In this case, when the opening portion is formed by selectively etching the first insulating interlayer 41, the second insulating material layer 119 and the first insulating material layer 118, the first insulating material layer 118B below the cap layer 31B is protected with the cap layer 31B and is therefore not etched in any case.

As shown in FIGS. 35A, 35B, 36A and 36B showing part of the region of DRAM, part of the logic circuit and part of the connection region of the gate electrode, [Step-360] can be modified as below. That is, the offset layer 113B is removed, and then, an impurity having the same conductivity type as that of the impurity introduced into the source/drain regions is introduced into exposed portions of the polysilicon layer 113A constituting the gate electrodes 114A and 114B. Then, the silicide layer 30A and 30B2 are formed on the top surfaces of the exposed polysilicon layer 113A' constituting the gate electrodes 114A and 114B (see FIG. 35A), and then, the upper portions of the first insulating material layer 118B on the side walls of the gate electrode 114B constituting the first transistor and the upper portions of the first insulating material layer 118A on the side walls of the gate electrode 114A constituting the second transistor are removed (see FIG. 35B). And, the first cap layer 31B is formed on the silicide layer 30B2 formed on the gate electrode 114B constituting the first transistor and on top portions of the first insulating material layer 118B on the side walls of the gate electrode 114B constituting the first transistor. At the same time, the second cap layer 31A is formed on the silicide layer 30A formed on the gate electrode 114A constituting the second transistor and on top portions of the first insulating material layer 118A on the side walls of the gate electrode 114A constituting the second transistor (see FIG. 36).

Figure 37A:
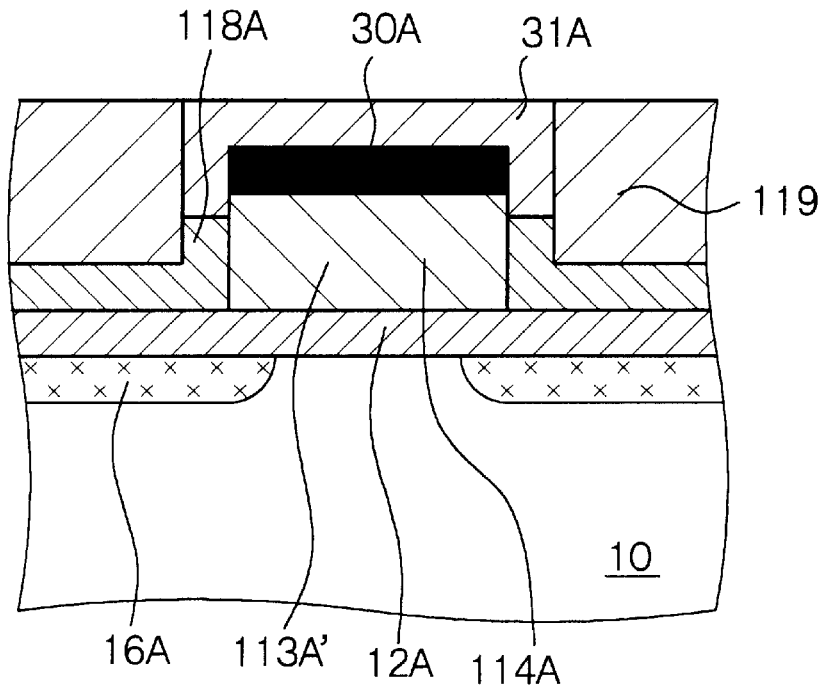
FIGS. 37A and 37B are enlarged schematic partial cross-sectional views of essential elements such as a semiconductor substrate, etc., for explaining a variant of the method of producing the semiconductor device in Example 3.
Figure 37B:
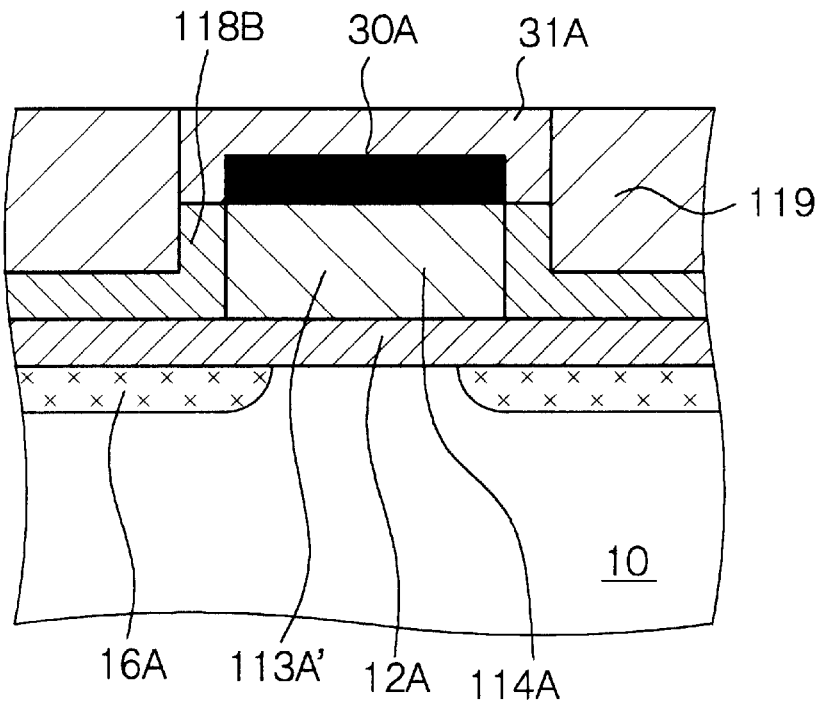
Figure 38:
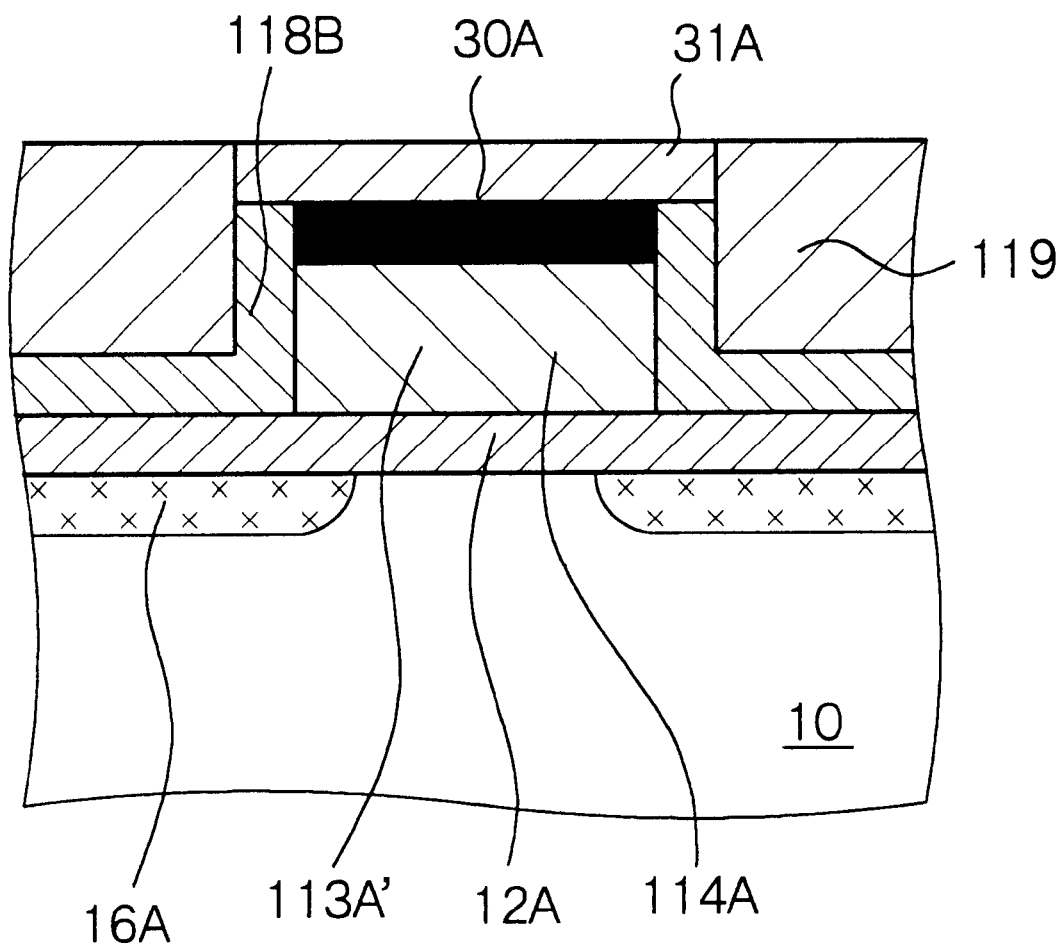
FIG. 38 is an enlarged schematic partial cross-sectional view of essential elements such as a semiconductor substrate, etc., for explaining a variant of the method of producing the semiconductor device in Example 3.

Further, Example 3 employs a structure in which the cap layers 31A and 31B form eaves extending from the gate electrodes 114A and 114B, the end portions of the cap layers 31A and 31B cover the entirety of the side walls of the silicide layers 30A and 30B$_2$ constituting the gate electrodes 114A and 114B and further cover the top portions of the side walls of the polysilicon layer 113A', and the first insulating material layers 118A and 118B cover the lower portions of the side walls of the gate electrodes 114A and 114B (see an enlarged view of FIG. 37A). There may be employed another structure in which lower. surfaces of end portions of the cap layers 31A and 31B are nearly in agreement with the top surface of the polysilicon layer 113A' (see the enlarged view of FIG. 37B), or there may be employed another structure in which lower surfaces of the end portions of the cap layers 31A and 31B are nearly in agreement with top surfaces of the silicide layer 30A and 30B2 (see an enlarged view of FIG. 38). Such structures can be obtained by controlling amounts of removal of the upper portions of the first insulating material layer 118B on the side walls of the gate electrode 114B constituting the first transistor and the upper portions of the insulating material layer 118A on the side walls of the gate electrode 114A constituting the second transistor.

The present invention is explained with reference to Examples hereinabove, while the present invention shall not be limited thereto. The structures of the semiconductor devices explained in Examples, and the materials and process conditions used in the production of the semiconductor devices are examples given for illustrative purposes and may be altered as required.

Further, an MIM structure may be also applied to the capacitor constituting DRAM. In the method of producing a semiconductor device of the present invention, a contact plug is formed on the source/drain region of the first transistor and the sintering treatment is carried out before the formation of the capacitor having the MIM structure, so that the characteristics of the capacitor having the MIM structure are not at all deteriorated in any case.

In the semiconductor device according to the first aspect of the present invention, no silicide layer is formed in the source/drain regions constituting the second transistor, so that there can be overcome the problem that DRAM memory cell characteristics are deteriorated.

In the semiconductor device according to the second aspect of the present invention or the method of producing a semiconductor device according to the third aspect of the present invention, the cap layer can be decreased in thickness, so that there can be overcome the problem that the height level difference caused by gate electrode increases and causes disadvantages in a step to follow. Further, if a relative dielectric constant of the first insulating material layer is lower than a relative dielectric constant of the second insulating material layer, an increase in the fringe capacitance can be suppressed, and particularly, the influence on the fast operation characteristic of the transistors constituting the logic circuit can be minimized.

In the method of producing a semiconductor device according to the first or second aspect of the present invention, since the space between the gate electrodes constituting the adjacent second transistors is filled with the insulating material layer, no silicide layer is formed in the source/drain regions of the second transistor, so that the problem of deterioration of the DRAM memory cell characteristic can be overcome. Further, since the space between the gate electrodes constituting the adjacent second transistors is filled with the insulating material layer, the contact plug can be easily and reliably formed on the source/drain region of the second transistor constituting DRAM according to the SAC technology.

In the method of producing a semiconductor device according to the first or second aspect of the present invention, the region of the semiconductor substrate in which region the first transistor is to be formed is exposed in a state where the source/drain regions constituting the second transistor are covered with the insulating material layer or the first insulating material layer, so that neither the region of the semiconductor substrate in which region the second transistor is to be formed is scraped off by etching, nor etching damage (formation of a so-called sub-oxide and penetration of carbon in the semiconductor substrate) takes place. Therefore, the deterioration of the characteristic of the second transistors can be prevented.

In the method of producing a semiconductor device according to the second aspect of the present invention, the step of forming the silicide layer in the source/drain regions constituting the first transistor is one step, and the step of forming the silicide layers on the top surfaces of the gate electrodes constituting the first and second transistors is another step. Therefore, the thickness of the silicide layer to be formed in the surface region of the source/drain regions and the thickness of the silicide layer to be formed on the top surface of the gate electrode can be differentiated from each other. Generally, the thickness of the silicide layer formed in the surface region of the source/drain regions is preferably smaller than the thickness of the silicide layer formed on the top surface of the gate electrode. In the method of producing a semiconductor device according to the second aspect of the present invention, therefore, higher design freedom can be attained with regard to the semiconductor device.

Another problem is that, after the formation of the silicide layer, aggregation takes place in a formed silicide layer during heat treatment of the silicide layer at a temperature of over 700° C. and causes the resistance of the silicide layer to increase. Further, when the dual gate technology is applied to transistors constituting the logic circuit, boron as a p-type impurity contained in the polysilicon layer constituting the gate electrode of the p-channel type MOSFET easily penetrates the semiconductor substrate through the gate insulating layer in the step of heat treatment with a furnace over 700° C. As a result, there is involved a problem that a threshold voltage $V_{th}$ of the p-channel type MOSFET varies or that the gate insulating layer is caused to deteriorate in characteristic. Further, an interdiffusion takes place between an n-type impurity contained in the polysilicon layer constituting the gate electrode of the n-channel type MOSFET and a p-type impurity contained in the polysilicon layer constituting the gate electrode of the p-channel type MOSFET. It is therefore undesirable to carry out the heat treatment with a furnace at a temperature of over 700° C. after the formation of the silicide layer and gate electrodes. In the method of producing a semiconductor device of the present invention, it is avoidable to carry out the heat treatment with a furnace at a temperature of over 700° C. after the formation of the silicide layer. Therefore, the present invention can overcome the above problems.

As a result, excellent consistency can be attained between the fast logic circuit production process including the salicide technology and the dual gate technology and the general DRAM production process. That is, a semiconductor device in which the logic circuit and DRAM are mounted together can be easily produced by adding an additive DRAM process to the standard logic circuit process. Further, DRAM memory cells can be provided as a library for IP which is expected to be circulated in the future. Further, since the region of a semiconductor substrate in which region the silicide layer is not to be formed can be easily obtained, so that a protective element for an input-output circuit having high electrostatic breakdown strength and a high-resistant element can be simultaneously formed.

What is claimed is:

1. A method of producing a semiconductor device comprising a plurality of first transistors formed in a first region of a semiconductor substrate and a plurality of second transistors formed in a second region of the semiconductor substrate, said method comprising the steps of:

(A) forming a gate insulating layer on the surface of the semiconductor substrate and then forming gate electrodes composed of a polysilicon for forming the first transistors and the second transistors, and then, forming source/drain regions constituting the second transistors in the semiconductor substrate, (B) filling a space between the gate electrodes constituting the adjacent second transistors with an insulating material layer, and exposing a region of the semiconductor substrate in which region source/drain regions constituting the first transistors are to be formed, the top surface of the gate electrodes constituting the first transistors and the top surface of the gate electrodes constituting of the second transistors, (C) forming source/drain regions in the region of the semiconductor substrate in which region the source/drain regions constituting the first transistors are to be formed, and (D) forming a silicide layer in the source/drain regions constituting the first transistors, on the top surface of the gate electrodes constituting the first transistors and on the top surface of the gate electrodes constituting the second transistors, to obtain the gate electrodes formed of the polysilicon and the silicide layer formed thereon;

wherein forming the insulating material layer in step (B) includes forming a first insulating material layer on the first transistor, forming a second insulating material layer on the first insulating material layer, forming a third insulating material layer on the second insulating material layer, selectively removing the third insulating material layer and the first insulating material layer from the first transistors to form a gate sidewall from the third insulating material layer and the first insulating material layer.

2. The method of producing a semiconductor device according to claim 1, in which a logic circuit is constituted of the first transistors and a dynamic random access memory is constituted of the second transistors.

3. The method producing a semiconductor device according to claim 1, in which, in the step (C), when the source/drain regions are formed in a region of the semiconductor substrate in which region the source/drain regions constituting the first transistors are to be formed, the same impurity as that introduced into said source/drain regions is introduced into the gate electrodes constituting the first transistors, and further in step (A) an impurity having the same conductivity type as that of an impurity introduced into the source/drain regions constituting the second transistors is introduced into the gate electrodes constituting the second transistors.

4. The method of producing a semiconductor device according to claim 1, in which the first insulating material layer is composed of silicon nitride and the second insulating material layer is composed of a silicon-containing material.

5. A method of producing a semiconductor device according to claim 1, further comprising removing the first insulating material layer on the top surface of the gate electrodes constituting the second transistors when removing the first insulating material layer on the first transistors.

6. A method of producing a semiconductor device according to claim 1 wherein the second insulating material layer is formed such that the space between the gate electrodes constituting the second transistors are filled with the second insulating material layer.

7. A method of producing a semiconductor device comprising a plurality of first transistors formed in a first region of a semiconductor substrate and a plurality of second transistors formed in a second region of the semiconductor substrate, said method comprising the steps of:

(A) forming a gate insulating layer on the surface of the semiconductor substrate and then forming gate electrodes composed of a polysilicon for forming the first transistors and the second transistors, and then, forming source/drain regions constituting the second transistors in the semiconductor substrate, (B) filling a space between the gate electrodes constituting the adjacent second transistors with an insulating material layer, and exposing a region of the semiconductor substrate in which region source/drain regions constituting the first transistors are to be formed, the top surface of the gate electrodes constituting the first transistors and the top surface of the gate electrodes constituting of the second transistors, (C) forming source/drain regions in the region of the semiconductor substrate in which region the source/drain regions constituting the first transistors are to be formed, and (D) forming a silicide layer in the source/drain regions constituting the first transistors, on the top surface of the gate electrodes constituting the first transistors and on the top surface of the gate electrodes constituting the second transistors, to obtain the gate electrodes formed of the polysilicon and the silicide layer formed thereon;

wherein the step (D) is further followed by the step (E) of consecutively forming an etching-stop layer and an insulating interlayer on the entire surface; forming an opening portion which penetrates through the insulating interlayer, the etching-stop layer and the insulating material layer and reaches at least one of the source/drain regions constituting the second transistors, and filling the opening portion with an electric conductive material to form a contact plug.

* * * * *